(12) United States Patent
Yamatani

(10) Patent No.: US 11,254,694 B2
(45) Date of Patent: Feb. 22, 2022

(54) POLYCYCLIC COMPOUND AND ORGANIC ELECTROLUMINESCENCE DEVICE INCLUDING THE SAME

(71) Applicant: SAMSUNG DISPLAY CO., LTD., Yongin-si (KR)

(72) Inventor: Akinori Yamatani, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 330 days.

(21) Appl. No.: 16/033,287

(22) Filed: Jul. 12, 2018

(65) Prior Publication Data

US 2019/0062354 A1 Feb. 28, 2019

(30) Foreign Application Priority Data

Aug. 29, 2017 (KR) .................. 10-2017-0109649

(51) Int. Cl.
*C07F 7/30* (2006.01)
*H01L 51/00* (2006.01)
*H01L 51/50* (2006.01)

(52) U.S. Cl.
CPC ............ *C07F 7/30* (2013.01); *H01L 51/0067* (2013.01); *H01L 51/0071* (2013.01);
(Continued)

(58) Field of Classification Search
CPC .... C07F 7/30; H01L 51/0067; H01L 51/0071; H01L 51/5012; H01L 51/5016;
(Continued)

(56) References Cited

U.S. PATENT DOCUMENTS

| 3,079,414 | A | 2/1963 | Tamborski et al. |
| 7,279,704 | B2 * | 10/2007 | Walters ................. C09K 11/06 257/40 |

(Continued)

FOREIGN PATENT DOCUMENTS

| JP | H08-302339 A | 11/1996 |
| JP | 3620186 B2 | 2/2005 |

(Continued)

OTHER PUBLICATIONS

Google Patents machine translation for KR 100679724 B1 (publication date Jan. 2007). (Year: 2007).*

(Continued)

*Primary Examiner* — Dawn L Garrett
(74) *Attorney, Agent, or Firm* — Lewis Roca Rothgerber Christie LLP

(57) ABSTRACT

A polycyclic compound and an organic electroluminescence device including the same, the polycyclic compound being represented by Formula 1:

[Formula 1]

$(R_1)_{n_1}$ ... $(R_2)_{n_2}$ with $X_1$, N, Ge, $Ar_1$, $Ar_2$

16 Claims, 2 Drawing Sheets

(52) U.S. Cl.
CPC ........ *H01L 51/508* (2013.01); *H01L 51/5012* (2013.01); *H01L 51/5016* (2013.01); *H01L 51/5064* (2013.01); *H01L 51/5088* (2013.01); *H01L 51/5092* (2013.01)

(58) Field of Classification Search
CPC ............... H01L 51/5064; H01L 51/508; H01L 51/5088; H01L 51/5092
See application file for complete search history.

(56) References Cited

U.S. PATENT DOCUMENTS

| 8,927,749 | B2 | | 1/2015 | Boudreault et al. | |
|---|---|---|---|---|---|
| 9,190,008 | B2 | | 11/2015 | Pyun et al. | |
| 2007/0116984 | A1 | * | 5/2007 | Park | H01L 51/0072 428/690 |
| 2014/0252318 | A1 | * | 9/2014 | Boudreault | H01L 51/0059 257/40 |
| 2016/0359125 | A1 | | 12/2016 | Li et al. | |
| 2017/0346017 | A1 | * | 11/2017 | Nakano | C09K 11/06 |

FOREIGN PATENT DOCUMENTS

| JP | 2014-182898 | A | * | 9/2014 |
|---|---|---|---|---|
| KR | 10-0679724 | B1 | | 1/2007 |
| KR | 20140103394 | A | * | 8/2014 |
| KR | 20140103842 | A | * | 8/2014 |
| KR | 10-2014-0105633 | A | | 9/2014 |
| WO | WO 2006041263 | | * | 4/2006 |
| WO | WO 2017/018326 | A1 | | 2/2017 |

OTHER PUBLICATIONS

Machine translation of JP 2014-182898 A (publication date: Sep. 2014); translation generated Dec. 2020. (Year: 2020).*
Chem. Sci., (2019), vol. 10, pp. 10687-10697. (Year: 2019).*
Zhang et al., Efficient blue organic light-emitting diodes employing thermally activated delayed fluorescence, Nature Photonics, 2014, 8, 326-332.
Numata et al., High efficiency pure blue thermally activated delayed fluorescence molecules having 10H-phenoxaborin and acridan units, Chem. Commun., 2015, 51, 9443-9446.
Zhang et al., Nearly 100% Internal Quantum Efficiency in Undoped Electroluminescent Devices Employing Pure Organic Emitters, Adv. Mater., 2015, 27, 2096-2100.
Komatsu et al., Light-blue thermally activated delayed fluorescent emitters realizing a high external quantum efficiency of 25% and unprecedented low drive voltages in OLEDs, J. Mater. Chem. C, 2016, 4, 2274-2278.

* cited by examiner

POLYCYCLIC COMPOUND AND ORGANIC ELECTROLUMINESCENCE DEVICE INCLUDING THE SAME

CROSS-REFERENCE TO RELATED APPLICATION

Korean Patent Application No. 10-2017-0109649, filed on Aug. 29, 2017, in the Korean Intellectual Property Office, and entitled: "Polycyclic Compound and Organic Electroluminescence Device Including the Same," is incorporated by reference herein in its entirety.

BACKGROUND

1. Field

Embodiments relate to a polycyclic compound and an organic electroluminescence device including the same.

2. Description of the Related Art

Development of an organic electroluminescence display as an image display is being actively conducted. An organic electroluminescence display is different from a liquid crystal display and is a self-luminescent display that accomplishes display by recombining holes and electrons injected from a first electrode and a second electrode in an emission layer and emitting light from a luminescent material which is an organic compound included in the emission layer.

An organic electroluminescence device may include, e.g., an organic device composed of a first electrode, a hole transport layer disposed on the first electrode, an emission layer disposed on the hole transport layer, an electron transport layer disposed on the emission layer, and a second electrode disposed on the electron transport layer. Holes are injected from the first electrode, and the injected holes move via the hole transport layer to be injected into the emission layer. Meanwhile, electrons are injected from the second electrode, and the injected electrons move via the electron transport layer to be injected into the emission layer. By recombining the holes and electrons injected into the emission layer, excitons are generated in the emission layer. The organic electroluminescence device emits light using light emitted during the transition of the excitons back to a ground state. In addition, the configuration of an organic electroluminescence device is not limited to those described above, and various modifications may be possible. For applying an organic electroluminescence device in a display, the decrease of a driving voltage and the increase of life of the organic electroluminescence device are required.

SUMMARY

Embodiments are directed to a polycyclic compound and an organic electroluminescence device including the same The embodiments may be realized by providing a polycyclic compound represented by the following Formula 1:

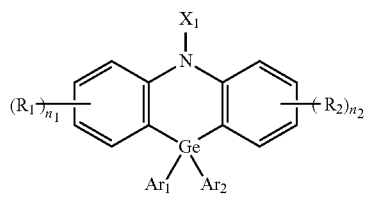

[Formula 1]

wherein, in Formula 1, $X_1$ is a substituted or unsubstituted aryl group having 6 to 30 ring carbon atoms or a substituted or unsubstituted heteroaryl group having 2 to 30 ring carbon atoms, $Ar_1$ and $Ar_2$ are each independently a substituted or unsubstituted aryl group having 6 to 30 ring carbon atoms or a substituted or unsubstituted heteroaryl group having 2 to 30 ring carbon atoms, $Ar_1$ and $Ar_2$ being separate or forming a ring by combining adjacent groups with each other, $R_1$ and $R_2$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ and $R_2$ being separate or forming a ring by combining adjacent groups with each other, $n_1$ and $n_2$ are each independently an integer of 0 to 4, and at least one of $Ar_1$, $Ar_2$, $R_1$, $R_2$ or $X_1$ is a group represented by one of the following Formulae 2-1 to 2-8:

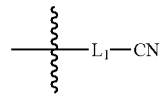

[Formula 2-1]

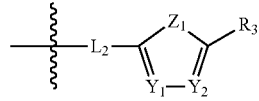

[Formula 2-2]

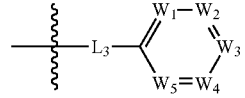

[Formula 2-3]

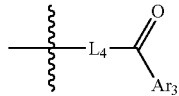

[Formula 2-4]

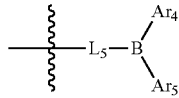

[Formula 2-5]

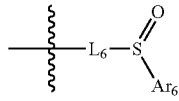

[Formula 2-6]

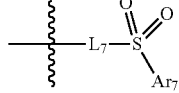

[Formula 2-7]

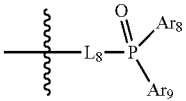

[Formula 2-8]

wherein, in Formulae 2-1 to 2-8, $Y_1$ and $Y_2$ are each independently N or $CR_4$, at least one of $Y_1$ or $Y_2$ being N, $Z_1$ is O, S, or $NAr_{10}$, $W_1$ to $W_5$ are each independently N or $CR_5$, at least one of $W_1$ to $W_5$ being N, $L_1$ to $L_8$ are each independently a direct linkage, a substituted or unsubstituted arylene group having 6 to 30 ring carbon atoms, or a substituted or unsubstituted heteroarylene group having 2 to 30 ring carbon atoms, $Ar_3$ to $Ar_{10}$ are each independently a substituted or unsubstituted oxy group, a substituted or unsubstituted thio group, a substituted or unsubstituted amino group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $Ar_3$ to $Ar_9$ being separate or forming a ring by combining adjacent groups with each other, and $R_3$ to $R_5$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_3$ and $R_4$ being separate or forming a ring by combining adjacent groups with each other The embodiments may be realized by providing an organic electroluminescence device including a first electrode; a hole transport region on the first electrode; an emission layer on the hole transport region; an electron transport region on the emission layer; and a second electrode on the electron transport region, wherein the emission layer includes a polycyclic compound represented by the following Formula 1:

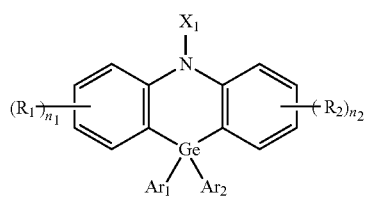

[Formula 1]

wherein, in Formula 1, $X_1$ is a substituted or unsubstituted aryl group having 6 to 30 ring carbon atoms or a substituted or unsubstituted heteroaryl group having 2 to 30 ring carbon atoms, $Ar_1$ and $Ar_2$ are each independently a substituted or unsubstituted aryl group having 6 to 30 ring carbon atoms or a substituted or unsubstituted heteroaryl group having 2 to 30 ring carbon atoms, $Ar_1$ and $Ar_2$ being separate or forming a ring by combining adjacent groups with each other, $R_1$ and $R_2$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ and $R_2$ being separate or forming a ring by combining adjacent groups with each other, $n_1$ and $n_2$ are each independently an integer of 0 to 4, and at least one of $Ar_1$, $Ar_2$, $R_1$, $R_2$ or $X_1$ is a group represented by one of the following Formulae 2-1 to 2-8:

[Formula 2-1]

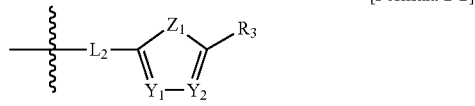

[Formula 2-2]

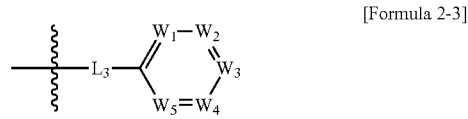

[Formula 2-3]

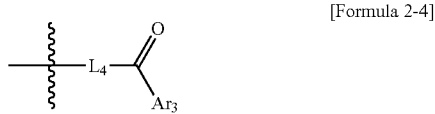

[Formula 2-4]

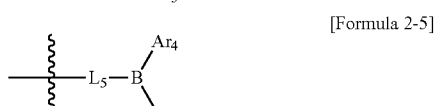

[Formula 2-5]

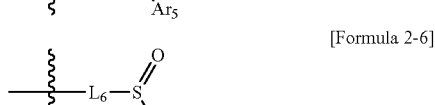

[Formula 2-6]

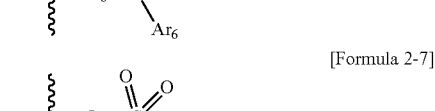

[Formula 2-7]

[Formula 2-8]

wherein, in Formulae 2-1 to 2-8, $Y_1$ and $Y_2$ are each independently N or $CR_4$, at least one of $Y_1$ or $Y_2$ being N, $Z_1$ is O, S, or $NAr_{10}$, $W_1$ to $W_5$ are each independently N or $CR_5$, at least one of $W_1$ to $W_5$ being N, $L_1$ to $L_8$ are each independently a direct linkage, a substituted or unsubstituted arylene group having 6 to 30 ring carbon atoms, or a substituted or unsubstituted heteroarylene group having 2 to 30 ring carbon atoms, $Ar_3$ to $Ar_{10}$ are each independently a substituted or unsubstituted oxy group, a substituted or unsubstituted thio group, a substituted or unsubstituted amino group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, Ar₃ to Ar₉ being separate or forming a ring by combining adjacent groups with each other, and R₃ to R₅ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, R₃ and R₄ being separate or forming a ring by combining adjacent groups with each other.

In an embodiment, the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof.

BRIEF DESCRIPTION OF THE DRAWINGS

Features will be apparent to those of ordinary skill in the art by describing in detail exemplary embodiments with reference to the attached drawings in which.

DETAILED DESCRIPTION

Figure 1:
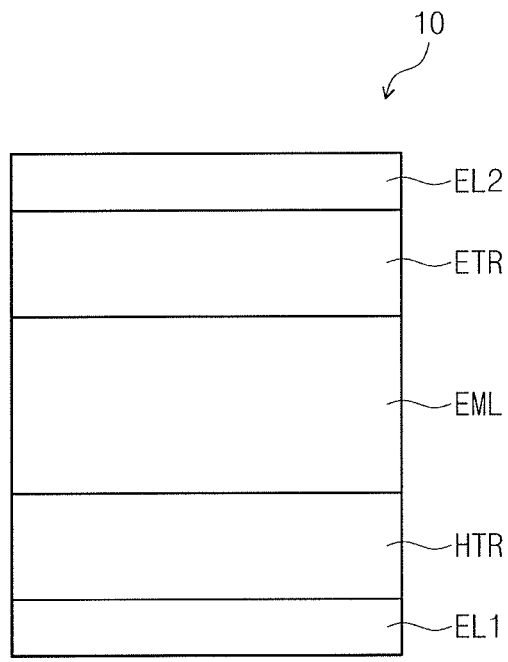
FIG. 1 illustrates a schematic cross-sectional view of an organic electroluminescence device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "including," "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. As used herein, the term "or" is not an exclusive term.

In the present disclosure, * or

means a part to be connected, e.g., a bonding location.

In the present disclosure, "substituted or unsubstituted" may mean unsubstituted or substituted with at least one substituent selected from deuterium, halogen, cyano, nitro, amino, silyl, oxy, thio, sulfinyl, sulfonyl, carbonyl, boron, arylamine, phosphine oxide, phosphine sulfide, alkyl, alkenyl, aryl and heterocyclic. In addition, each of the substituent illustrated above may be substituted or unsubstituted. For example, biphenyl may be interpreted as aryl, or phenyl substituted with phenyl.

In the present disclosure, the description of forming a ring by combining adjacent groups with each other may mean forming a substituted or unsubstituted hydrocarbon ring or a substituted or unsubstituted heterocycle by combining adjacent groups with each other. The hydrocarbon ring includes an aliphatic hydrocarbon ring and an aromatic hydrocarbon ring. The heterocycle includes an aliphatic heterocycle and an aromatic heterocycle. The hydrocarbon ring and heterocycle may be a monocycle or polycycle. In addition, the ring formed by combining adjacent groups with each other may be connected with another ring to form a spiro structure.

In the present disclosure, "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, a direct linkage may mean a single bond.

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 30, 1 to 20, 1 to 15, 1 to 10 or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2- dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl group means any functional group or substituent derived from an aromatic hydrocarbon ring. The aryl group may be monocyclic aryl or polycyclic aryl. The carbon number of the aryl group for forming a ring may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the present disclosure, the fluorenyl group may be substituted, and two substituents may be combined with each other to form a spiro structure. For example, the fluorenyl group may be a 9,9'-spirobifluorenyl group.

In the present disclosure, the heteroaryl group may be heteroaryl including at least one of O, N, P, S, Si, or Ge as a heteroatom. The heteroaryl group may be monocyclic heteroaryl or polycyclic heteroaryl. The carbon number of the heteroaryl group for forming a ring may be 2 to 30, or 2 to 20. Examples of the heteroaryl group may include thiophenyl, furanyl, pyrrolyl, imidazolyl, thiazolyl, oxazolyl, oxadiazolyl, triazolyl, pyridyl, bipyridyl, pyrimidyl, triazinyl, triazolyl, acridyl, pyridazinyl, pyrazinyl, quinolinyl, quinazolinyl, quinoxalinyl, phenoxazyl, phthalazinyl, pyrido pyrimidyl, pyrido pyrazinyl, pyrazino pyrazinyl, isoquinolinyl, indolyl, carbazolyl, N-arylcarbazolyl, N-heteroaryl carbazolyl, N-alkyl carbazolyl, benzoxazolyl, benzoimidazolyl, benzothiazolyl, benzocarbazolyl, benzothiophenyl, dibenzothiophenyl, thienothiophenyl, benzofuranyl, phenanthrolinyl, thiazolyl, isoxazolyl, oxadiazolyl, thiadiazolyl, benzothiazolyl, phenothiazinyl, dibenzosilolyl, dibenzofuranyl, etc., without limitation.

In the present disclosure, the explanation on the aryl group may be applied to the arylene group, except that the arylene group is divalent. The explanation on the heteroaryl group may be applied to the heteroarylene group, except that the heteroarylene group is divalent.

In the present disclosure, the silyl group includes alkyl silyl and aryl silyl. Examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc., without limitation.

In the present disclosure, the carbon number of the amino group is not specifically limited, but may be 1 to 30. The amino group may include alkyl amino and aryl amino. Examples of the amino group may include methylamino, dimethylamino, phenylamino, diphenylamino, naphthylamino, 9-methyl-anthracenylamino, triphenylamino, etc., without limitation.

In the present disclosure, the carbon number of the carbonyl group is not specifically limited, but may be 1 to 40, 1 to 30, or 1 to 20. For example, the carbonyl group may include the following groups, without limitation:

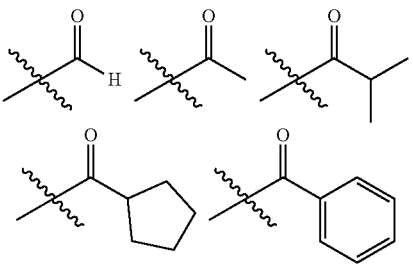

In the present disclosure, the carbon numbers of the sulfinyl and sulfonyl groups are not specifically limited, but may be 1 to 30. The sulfinyl group may include alkyl sulfinyl and aryl sulfinyl. The sulfonyl group may include alkyl sulfonyl and aryl sulfonyl.

In the present disclosure, the thio group may include alkyl thio and aryl thio.

In the present disclosure, the oxy group may include alkoxy and aryl oxy. The alkoxy group may have a linear, branched or cyclic form. The carbon number of the alkoxy group is not specifically limited, but may be 1 to 20, or 1 to 10. Examples of the alkoxy group may include methoxy, ethoxy, n-propoxy, isopropoxy, butoxy, pentyloxy, hexyloxy, octyloxy, nonyloxy, decyloxy, benzyloxy, etc., without limitation.

In the present disclosure, the boron group includes alkyl boron and aryl boron. Examples of the boron group may include trimethyl boron, triethyl boron, t-butyl dimethyl boron, triphenyl boron, diphenyl boron, phenyl boron, etc., without limitation.

In the present disclosure, the alkenyl group may be linear or branched. The carbon number is not specifically limited, and may be 2 to 30, 2 to 20, or 2 to 10. Examples of the alkenyl group may include vinyl, 1-butenyl, 1-pentenyl, 1,3-butadienyl aryl, styrenyl, styrylvinyl, etc., without limitation.

In the present disclosure, the carbon number of the amine group is not specifically limited, and may be 1 to 30. The amine group may include alkyl amine and aryl amine. Examples of the amine group may include methylamine, dimethylamine, phenylamine, diphenylamine, naphthylamine, 9-methyl-anthracenylamine, triphenylamine, etc., without limitation.

In the present disclosure, examples of the alky group in alkylthio, alkylsulfoxy, alkylaryl, alkylamino, alkylboron, alkylsilyl and alkylamine are the same as those of the above-described alkyl group.

In the present disclosure, examples of the aryl group in aryloxy, arylthio, arylsulfoxy, arylamino, arylboron, arylsilyl and arylamine are the same as those of the above-described aryl group.

Hereinafter, the polycyclic compound according to an embodiment will be explained.

The polycyclic compound according to an embodiment may be represented by the following Formula 1.

[Formula 1]

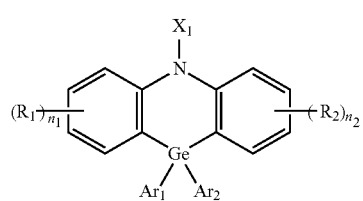

In Formula 1, $X_1$ may be or may include, e.g., a substituted or unsubstituted aryl group having 6 to 30 ring carbon atoms, or a substituted or unsubstituted heteroaryl group having 2 to 30 ring carbon atoms. $X_1$ may be or may include, e.g., a substituted or unsubstituted phenyl group, a substituted or unsubstituted pyrimidyl group, or a substituted or unsubstituted triazinyl group.

$Ar_1$ and $Ar_2$ may each independently be or include, e.g., a substituted or unsubstituted aryl group having 6 to 30 ring carbon atoms, or a substituted or unsubstituted heteroaryl group having 2 to 30 ring carbon atoms. $Ar_1$ and $Ar_2$ may each independently be or include, e.g., a substituted or unsubstituted phenyl group, or a substituted or unsubstituted pyrimidyl group. In an implementation, $Ar_1$ and $Ar_2$ may each independently form a ring by combining with adjacent groups. In an implementation, $Ar_1$ and $Ar_2$ may form a ring by combining with each other.

$R_1$ and $R_2$ may each independently be or include, e.g., a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_1$ and $R_2$ may each independently form a ring by combining adjacent groups with each other. In an implementation, $R_1$ and $R_2$ may each independently be or include, e.g., a hydrogen atom, a substituted or unsubstituted oxy group, a substituted or unsubstituted amino group, a substituted or unsubstituted methyl group, or a substituted or unsubstituted phenyl group.

$n_1$ and $n_2$ may each independently be, e.g., an integer of 0 to 4. A case where $n_1$ is 0 may mean that the polycyclic compound represented by Formula 1 is not substituted with $R_1$, and would be the same as a case where $n_1$ is 1 and $R_1$ is hydrogen, etc. In case $n_1$ is an integer of 2 or more, a plurality of $R_1$ may be the same or different from each other. A case where $n_2$ is 0 may mean that the polycyclic compound represented by Formula 1 is not substituted with $R_2$. In case $n_2$ is an integer of 2 or more, a plurality of $R_2$ may be the same or different from each other.

In Formula 1, at least one of $Ar_1$, $Ar_2$, $R_1$, $R_2$ or $X_1$ may be, e.g., an electron acceptor, or a substituent which is substituted with an electron acceptor. In an implementation, at least one of $Ar_1$, $Ar_2$, $R_1$, $R_2$ or $X_1$ may be, e.g., a group represented by any one of the following Formulae 2-1 to 2-8.

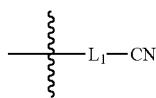

[Formula 2-1]

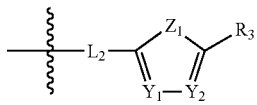

[Formula 2-2]

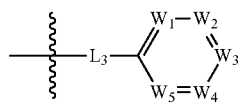

[Formula 2-3]

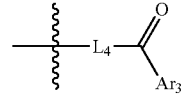

[Formula 2-4]

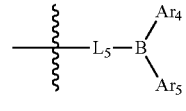

[Formula 2-5]

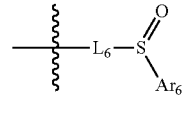

[Formula 2-6]

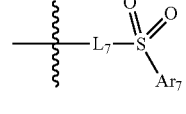

[Formula 2-7]

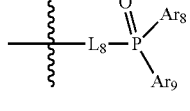

[Formula 2-8]

In Formulae 2-1 to 2-8, $Y_1$ and $Y_2$ may be each independently N or $CR_4$, and at least one of $Y_1$ or $Y_2$ may be N. $Z_1$ may be O, S or $NAr_{10}$. In case both $Y_1$ and $Y_2$ are N, and $Z_1$ is O, the substituent represented by Formula 2-2 may be an oxadiazole derivative. In case both $Y_1$ and $Y_2$ are N, and $Z_1$ is S, the substituent represented by Formula 2-2 may be a thiadiazole derivative. In case both $Y_1$ and $Y_2$ are N, and $Z_1$ is $NAr_{10}$, the substituent represented by Formula 2-2 may be a triazole derivative. In case any one of $Y_1$ or $Y_2$ is $CR_4$, and $Z_1$ is O, the substituent represented by Formula 2-2 may be an oxazole derivative. In case any one of $Y_1$ or $Y_2$ is $CR_4$, and $Z_1$ is S, the substituent represented by Formula 2-2 may be a thiazole derivative. In case any one of $Y_1$ or $Y_2$ is $CR_4$, and $Z_1$ is $NAr_{10}$, the substituent represented by Formula 2-2 may be an imidazole derivative.

$W_1$ to $W_5$ may be each independently N or $CR_5$. At least one of $W_1$ to $W_5$ are N. For example, one of $W_1$ to $W_5$ may be N, and in this case, the substituent represented by Formula 2-3 may be a substituted or unsubstituted pyridyl group. Alternatively, two of $W_1$ to $W_5$ may be N, and in this case, the substituent represented by Formula 2-3 may be a substituted or unsubstituted diazinyl group. The diazinyl group may be pyridazinyl, pyrimidyl, or pyrazinyl. Three of $W_1$ to $W_5$ may be N, and in this case, the substituent represented by Formula 2-3 may be a substituted or unsubstituted triazinyl group. The substituent represented by Formula 2-3 may be a substituted or unsubstituted 1,3,5-triazinyl group.

$L_1$ to $L_8$ may each independently be or include, e.g., a direct linkage, a substituted or unsubstituted arylene group having 6 to 30 ring carbon atoms, or a substituted or unsubstituted heteroarylene group having 2 to 30 ring carbon atoms. $L_1$ to $L_8$ may each independently be or include, e.g., a direct linkage, or a substituted or unsubstituted phenylene group.

$Ar_3$ to $Ar_{10}$ may each independently be or include, e.g., a substituted or unsubstituted oxy group, a substituted or unsubstituted thio group, a substituted or unsubstituted amino group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $Ar_3$ to $Ar_{10}$ may be each independently a substituted or unsubstituted phenylene group. In an implementation, $Ar_3$ to $Ar_9$ may each independently form a ring by combining adjacent groups with each other $R_3$ to $R_5$ may each independently be or include, e.g., a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_3$ to $R_5$ may each independently be or include, e.g., a hydrogen atom, a substituted or unsubstituted oxy group, a substituted or unsubstituted amino group, a substituted or unsubstituted methyl group, or a substituted or unsubstituted phenyl group. In an implementation, $R_3$ and $R_4$ may each independently form a ring by combining adjacent groups with each other.

In an implementation, the substituent represented by Formula 2-2 may be a group represented by any one of the following Formulae 2-2-1 to 2-2-6.

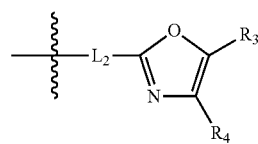
[Formula 2-2-1]

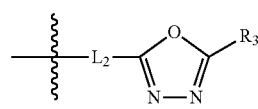
[Formula 2-2-2]

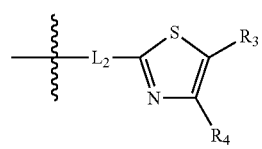
[Formula 2-2-3]

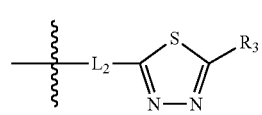
[Formula 2-2-4]

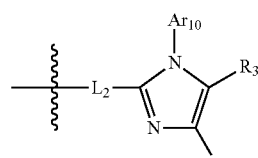
[Formula 2-2-5]

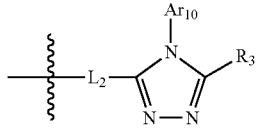
[Formula 2-2-6]

In Formulae 2-2-1 to 2-2-6, $L_2$, $R_3$, $R_4$ and $Ar_{10}$ are the same as defined above.

In an implementation, the substituent represented by Formula 2-3 may be a group represented by any one of the following Formulae 2-3-1 to 2-3-3.

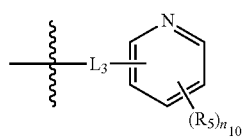
[Formula 2-3-1]

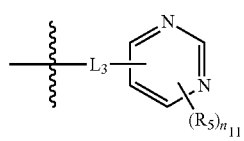
[Formula 2-3-2]

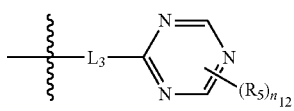
[Formula 2-3-3]

In Formulae 2-3-1 to 2-3-3, $L_3$ and $R_5$ are the same as defined above.

$n_{10}$ may be an integer of 0 to 4, $n_{11}$ may be an integer of 0 to 3, and $n_{12}$ may be an integer of 0 to 2. A case where $n_{10}$ is 0 may mean that the substituent represented by Formula 2-3 is not substituted with $R_5$. In case $n_{10}$ is an integer of 2 or more, a plurality of $R_5$ may be the same or different from each other. A case where $n_{11}$ is 0 may mean that the substituent represented by Formula 2-3 is not substituted with $R_5$. In case $n_{11}$ is an integer of 2 or more, a plurality of $R_5$ may be the same or different from each other. A case where $n_{12}$ is 0 may mean that the substituent represented by Formula 2-3 is not substituted with $R_5$. In case $n_{12}$ is an integer of 2 or more, a plurality of $R_5$ may be the same or different from each other.

In an implementation, the polycyclic compound represented by Formula 1 may be represented by the following Formula 3:

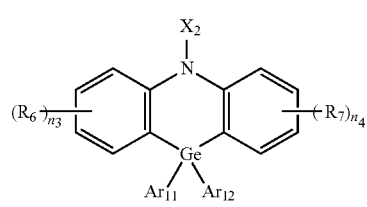
[Formula 3]

In Formula 3, $X_2$ may be, e.g., an electron acceptor, or a substituent which is substituted with an electron acceptor. $X_2$ may be, e.g., a group represented by any one of Formulae 2-1 to 2-8.

$Ar_{11}$ and $Ar_{12}$ may each independently be or include, e.g., a substituted or unsubstituted aryl group having 6 to 30 ring carbon atoms, or a substituted or unsubstituted heteroaryl group having 2 to 30 ring carbon atoms. In an implementation, $Ar_{11}$ and $Ar_{12}$ may each independently be or include, e.g., a substituted or unsubstituted phenyl group, or a substituted or unsubstituted pyrimidyl group. In an implementation, $Ar_{11}$ and $Ar_{12}$ may each independently form a ring by combining with adjacent groups. In an implementation, $Ar_{11}$ and $Ar_{12}$ may each independently form a ring by combining with each other.

$R_6$ and $R_7$ may each independently be or include, e.g., a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_{11}$ and $R_{12}$ may each independently form a ring by combining adjacent groups with each other. In an implementation, $R_{11}$ and $R_{12}$ may each independently be or include, e.g., a hydrogen atom, a substituted or unsubstituted oxy group, a substituted or unsubstituted amino group, a substituted or unsubstituted methyl group, or a substituted or unsubstituted phenyl group.

$n_3$ and $n_4$ may be each independently an integer of 0 to 4. A case where $n_3$ is 0 may mean that the substituent represented by Formula 3 is not substituted with $R_6$. In case $n_3$ is an integer of 2 or more, a plurality of $R_6$ may be the same or different from each other. A case where $n_4$ is 0 may mean that the substituent represented by Formula 3 is not substituted with $R_7$. In case $n_4$ is an integer of 2 or more, a plurality of $R_7$ may be the same or different from each other.

In an implementation, the polycyclic compound represented by Formula 3 may be represented by the following Formula 4.

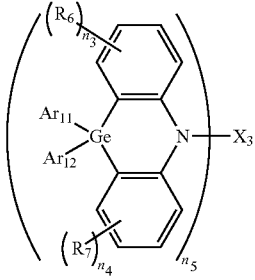

[Formula 4]

In Formula 4, $Ar_{11}$, $Ar_{12}$, $R_6$, $R_7$, $n_3$ and $n_4$ are the same as defined above.

In Formula 4, $n_5$ may be an integer of 1 to 4. For example, when $n_5$ is 2, 3, or 4, Formula 4 falls within the scope of Formula 1 by defining $X_1$ as a substituted aryl group having 6 to 30 ring carbon atoms or a substituted heteroaryl group having 2 to 30 ring carbon atoms, in which the substituent(s) of the substituted aryl group having 6 to 30 ring carbon atoms or substituted heteroaryl group having 2 to 30 ring carbon atoms has the polycyclic structure (azagermine moiety) bracketed by $n_5$ in Formula 4.

When $n_5$ is 1, the polycyclic compound represented by Formula 4 may have one azagermine group which is an electron donor. When $n_5$ is an integer of 2 to 4, the polycyclic compound represented by Formula 4 may include a plurality of azagermine group which is an electron donor in the compound.

When $n_5$ is 1, $X_3$ may be or may include, e.g., a cyano group, a substituted or unsubstituted carbonyl group, a substituted or unsubstituted boron group, a substituted or unsubstituted sulfinyl group, a substituted or unsubstituted sulfonyl group, a substituted or unsubstituted phosphine oxide group, or a phenyl group substituted with a substituent represented by the following Formula 5-1 or 5-2.

When $n_5$ is an integer of 2 to 4, $X_3$ may be or may include, e.g., a cyano group, a substituted or unsubstituted carbonyl group, a substituted or unsubstituted boron group, a substituted or unsubstituted sulfinyl group, a substituted or unsubstituted sulfonyl group, a substituted or unsubstituted phosphine oxide group, or a phenylene group substituted with a substituent represented by the following Formula 5-1 or 5-2.

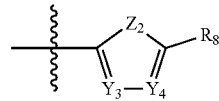

[Formula 5-1]

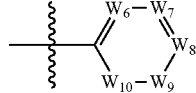

[Formula 5-2]

In Formula 5-1, $Y_3$ and $Y_4$ may be each independently N or $CR_9$, and at least one of $Y_3$ or $Y_4$ are N. $Z_2$ may be O, S or $NAr_{13}$. When both of $Y_3$ and $Y_4$ are N, and $Z_2$ is O, the substituent represented by Formula 5-1 may be an oxadiazole derivative. When both of $Y_3$ and $Y_4$ are N, and $Z_2$ is S, the substituent represented by Formula 5-1 may be a thiadiazole derivative. When both of $Y_3$ and $Y_4$ are N, and $Z_2$ is $NAr_{13}$, the substituent represented by Formula 5-1 may be a triazole derivative. When any one of $Y_3$ or $Y_4$ is $CR_5$, and $Z_2$ is O, the substituent represented by Formula 5-1 may be an oxazole derivative. When any one of $Y_3$ or $Y_4$ is $CR_5$, and $Z_2$ is S, the substituent represented by Formula 5-1 may be a thiazole derivative. When any one of $Y_3$ or $Y_4$ is $CR_5$, and $Z_2$ is $NAr_{13}$, the substituent represented by Formula 5-1 may be an imidazole derivative. The substituent represented by Formula 5-1 may be an azole derivative.

In Formula 5-2, $W_6$ to $W_{10}$ may be each independently N or $CR_{10}$, and at least one of $W_6$ to $W_{10}$ are N. For example, one of $W_6$ to $W_{10}$ may be N, and in this case, the substituent represented by Formula 5-2 may be a substituted or unsubstituted pyridyl group. In an implementation, two of $W_6$ to $W_{10}$ may be N, and in this case, the substituent represented by Formula 5-2 may be a substituted or unsubstituted diazinyl group. The diazinyl group may be a pyridazinyl, pyrimidyl, or pyrazinyl group. Furthermore, three of $W_6$ to $W_{10}$ may be N, and in this case, the substituent represented by Formula 5-2 may be a substituted or unsubstituted triazinyl group. The substituent represented by Formula 5-2 may be a substituted or unsubstituted 1,3,5-triazinyl group.

In an implementation, the polycyclic compound represented by Formula 3 may be represented by the following Formula 6.

[Formula 6]

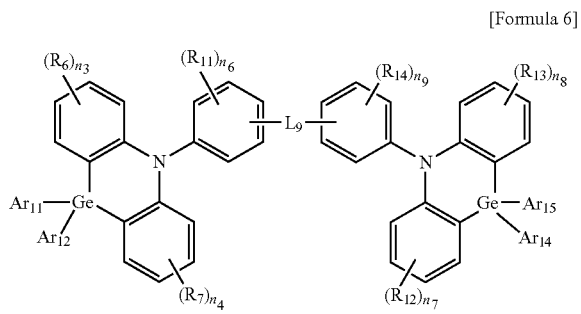

In Formula 6, $Ar_{11}$, $Ar_{12}$, $R_6$, $R_7$, $n_3$ and $n_4$ are the same as defined above.

In Formula 6, $L_9$ may be, e.g., a linker including an electron acceptor. In an implementation, $L_9$ may be or may include, e.g., a substituted or unsubstituted divalent carbonyl group, a substituted or unsubstituted divalent boron group, a substituted or unsubstituted divalent sulfinyl group, a substituted or unsubstituted divalent sulfonyl group, a substituted or unsubstituted divalent phosphine oxide group, a substituted or unsubstituted pyridylene group, a substituted or unsubstituted divalent diazinyl group, or a substituted or unsubstituted divalent triazinyl group. In an implementation, $L_9$ may be a group represented by the following Formula 7-1 or 7-2:

[Formula 7-1]

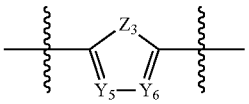

[Formula 7-2]

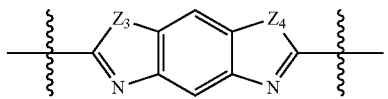

In Formula 7-1, $Y_5$ and $Y_6$ may be each independently N or $CR_{15}$, and at least one of $Y_5$ or $Y_6$ are N. $Z_3$ may be O, S or $NAr_{16}$. When both of $Y_5$ and $Y_6$ are N, and $Z_3$ is O, the substituent represented by Formula 7-1 may be an oxadiazole derivative. When both of $Y_5$ and $Y_6$ are N, and $Z_3$ is S, the substituent represented by Formula 7-1 may be a thiadiazole derivative. When both of $Y_5$ and $Y_6$ are N, and $Z_3$ is $NAr_{16}$, the substituent represented by Formula 7-1 may be a triazole derivative. When any one of $Y_5$ or $Y_6$ is $CR_{15}$, and $Z_3$ is O, the substituent represented by Formula 7-1 may be an oxazole derivative. When any one of $Y_5$ or $Y_6$ is $CR_{15}$, and $Z_3$ is S, the substituent represented by Formula 7-1 may be a thiazole derivative. When any one of $Y_5$ or $Y_6$ is $CR_{15}$, and $Z_3$ is $NAr_{16}$, the substituent represented by Formula 7-1 may be an imidazole derivative.

In Formula 7-2, $Z_4$ may be O, S, or $NAr_{16}$.

$Ar_{14}$ to $Ar_{16}$ may each independently be or include, e.g., a substituted or unsubstituted aryl group having 6 to 30 ring carbon atoms, or a substituted or unsubstituted heteroaryl group having 2 to 30 ring carbon atoms. In an implementation, $Ar_{14}$ to $Ar_{16}$ may each independently be or include, e.g., a substituted or unsubstituted phenyl group. In an implementation, $Ar_{14}$ to $Ar_{16}$ may each independently form a ring by combining with adjacent groups. In an implementation, $Ar_{14}$ to $Ar_{16}$ may each independently form a ring by combining with each other.

$R_{11}$ to $R_{14}$ may each independently be or include, e.g., a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_{11}$ to $R_{14}$ may each independently be or include, e.g., a hydrogen atom, a substituted or unsubstituted oxy group, a substituted or unsubstituted amino group, a substituted or unsubstituted methyl group, or a substituted or unsubstituted phenyl group. In an implementation, $R_{11}$ to $R_{14}$ may each independently form a ring by combining adjacent groups with each other.

In an implementation, the polycyclic compound represented by Formula 1 may be, e.g., a compound of the following Compound Group 1.

[Compound Group 1]

1

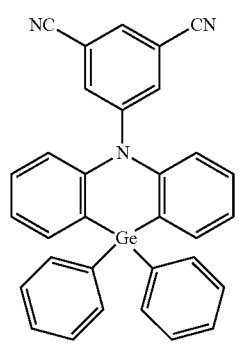

2

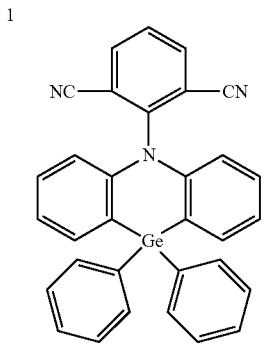

-continued
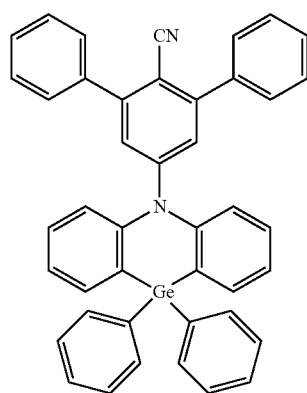
3
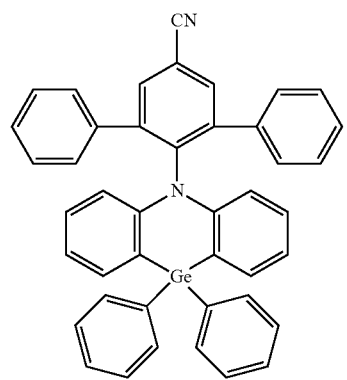
4
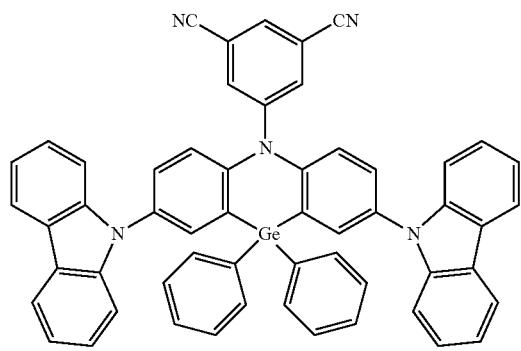
5
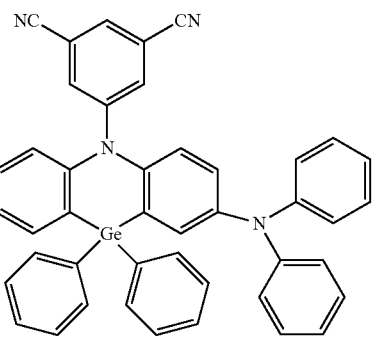
6
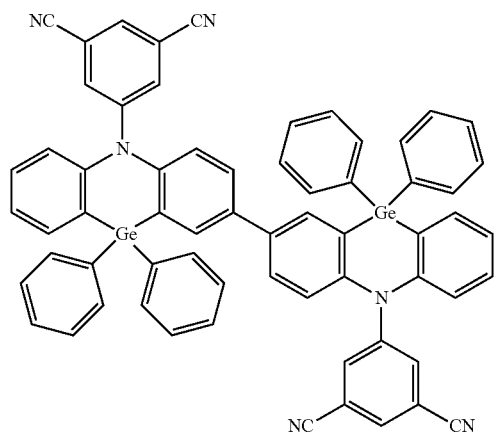
7
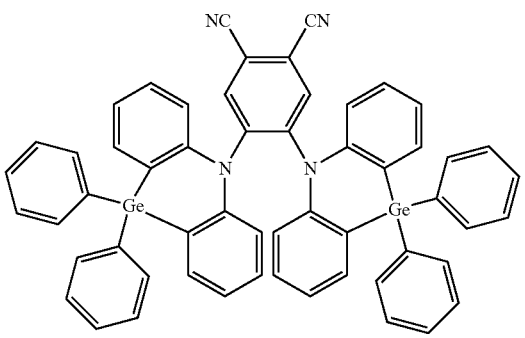
8
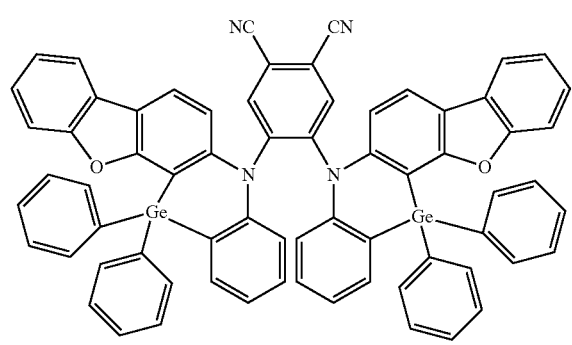
9
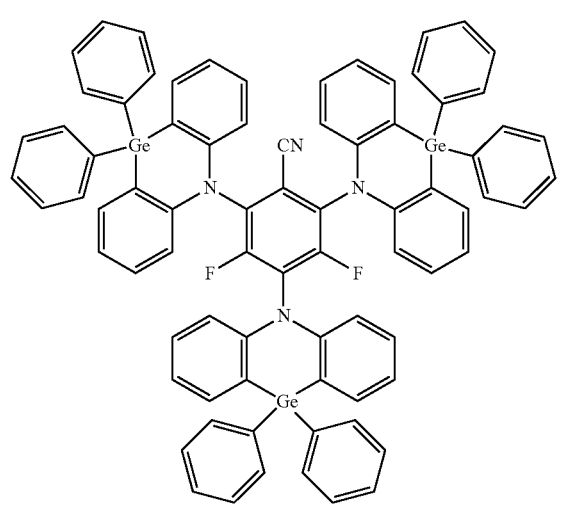
10

-continued
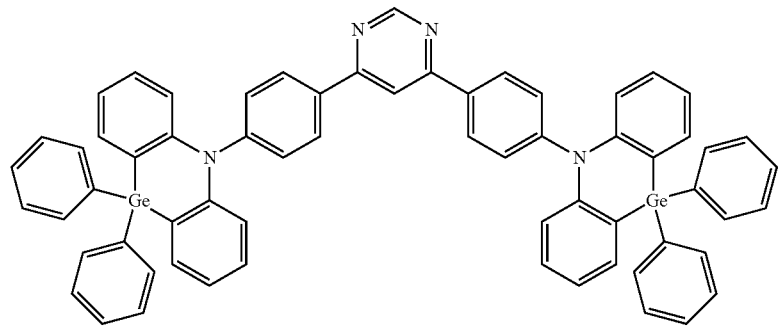
11
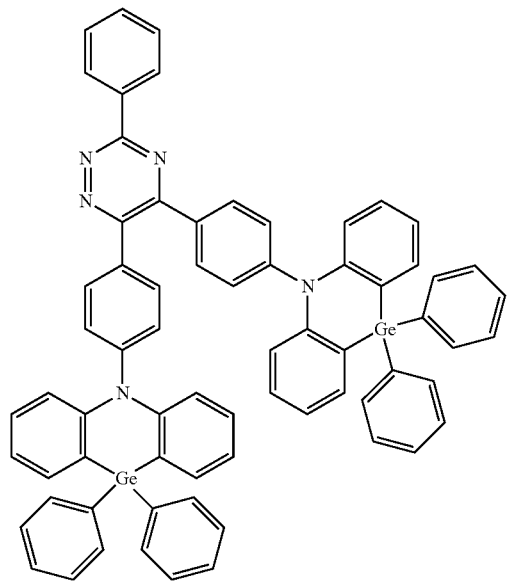
12
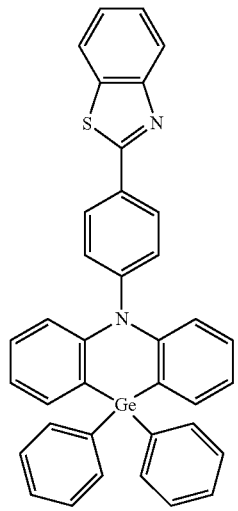
13
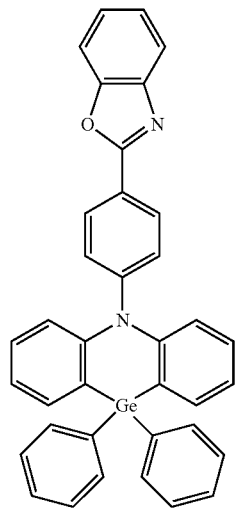
14
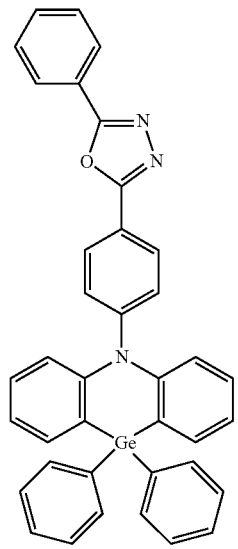
15

16
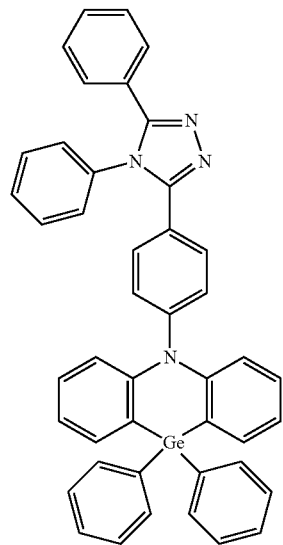
17
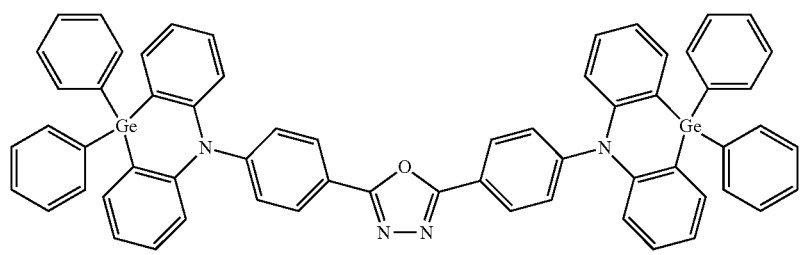
18
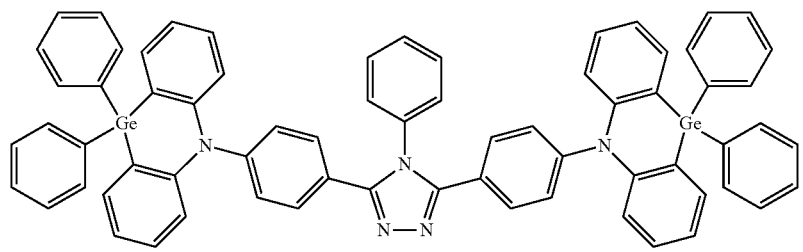
19
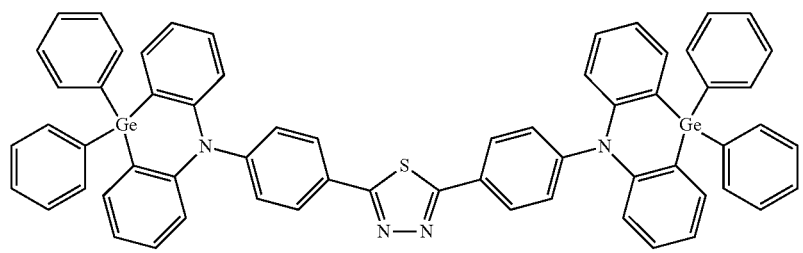
20
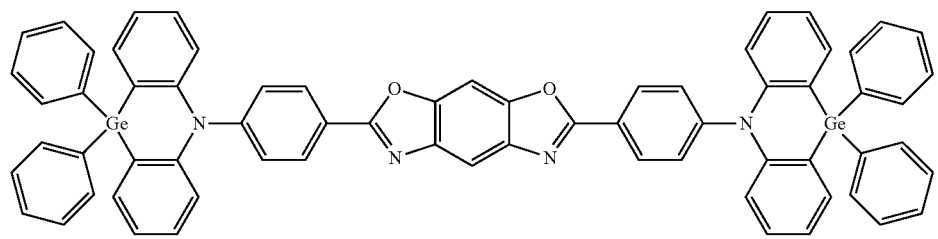

21
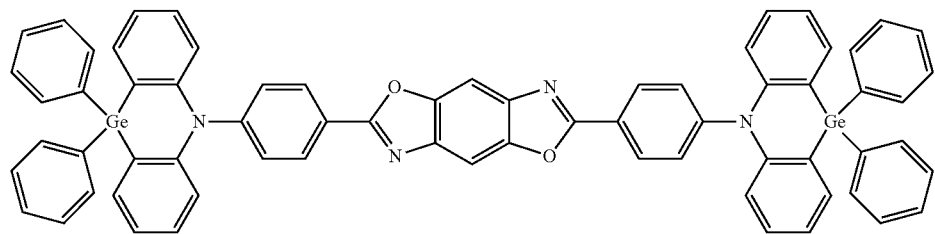
22
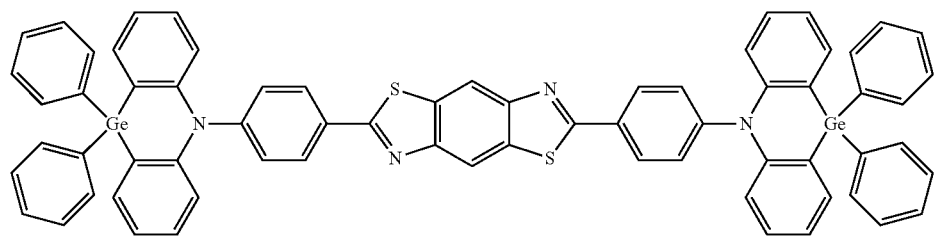
23 24
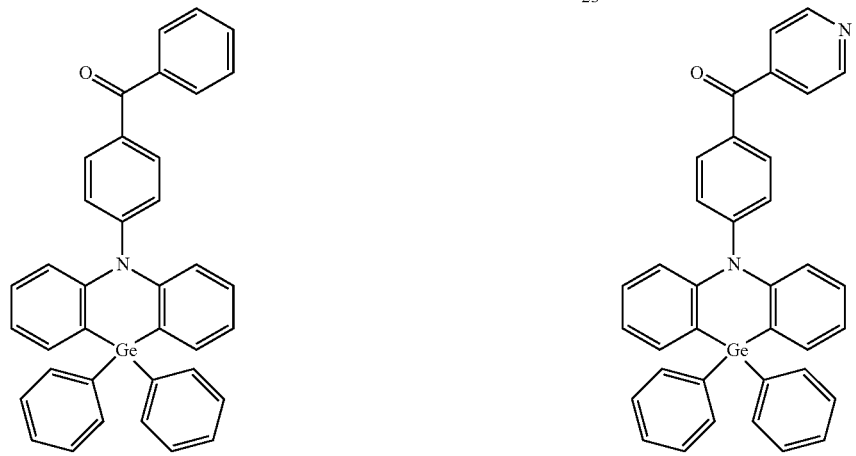
25 26
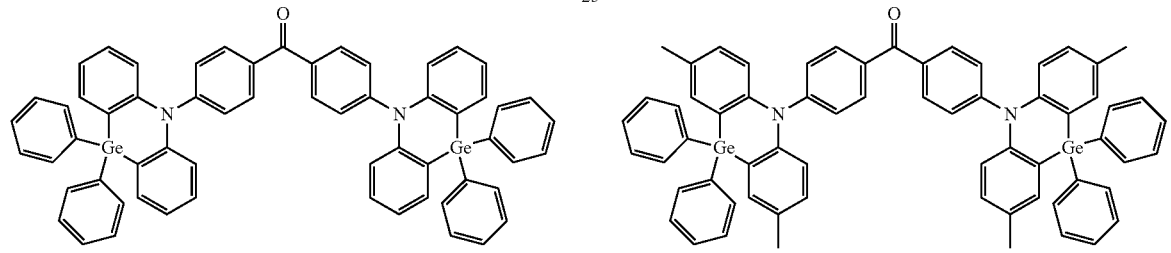
27 28
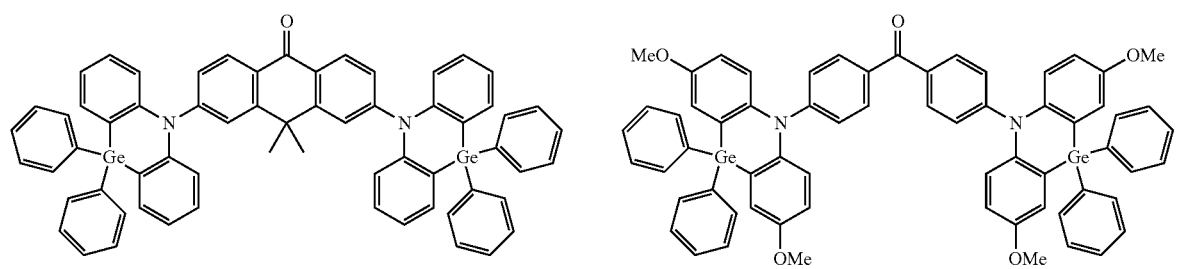

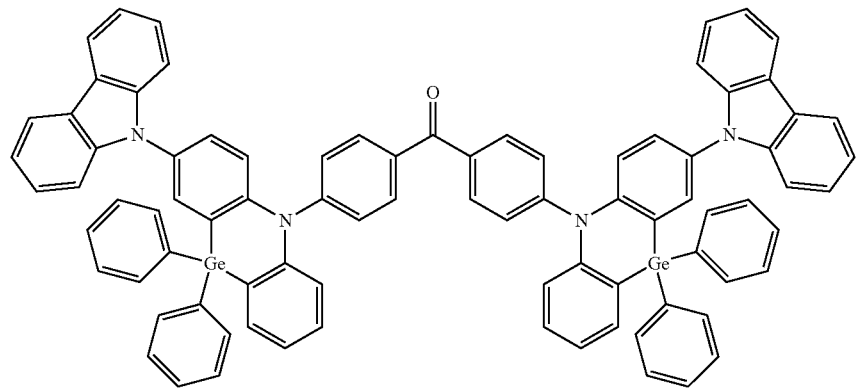
29
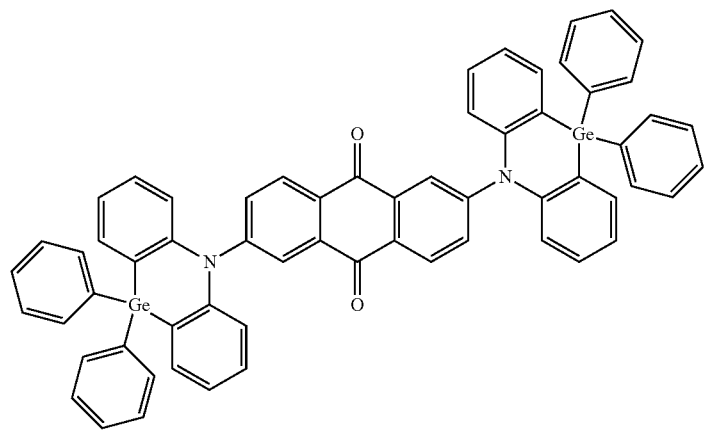
30
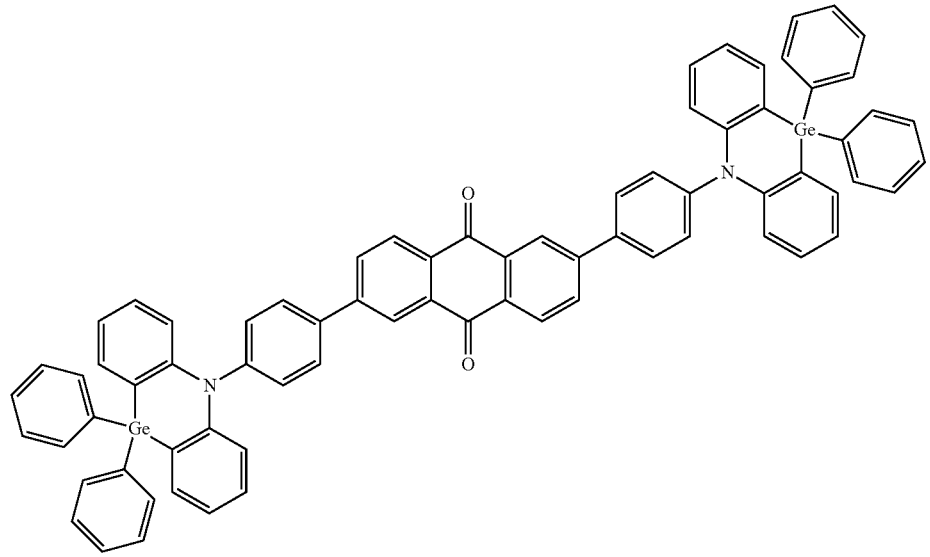
31

-continued
32
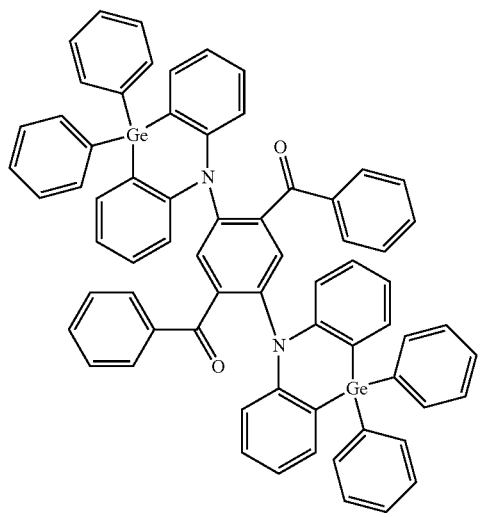
33
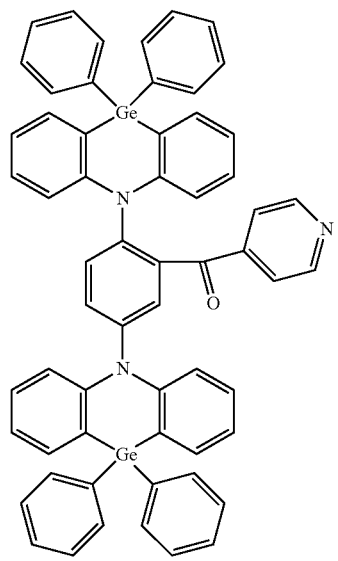
34
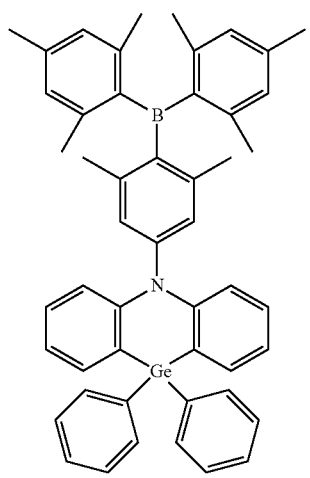
35
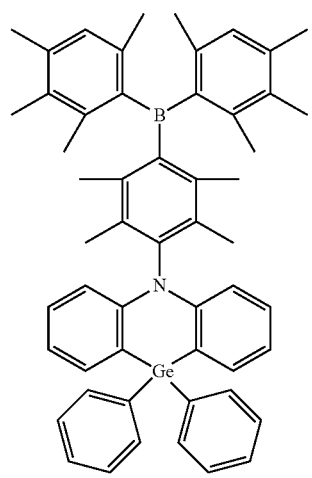
36
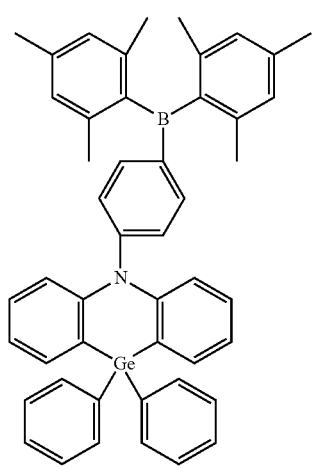
37
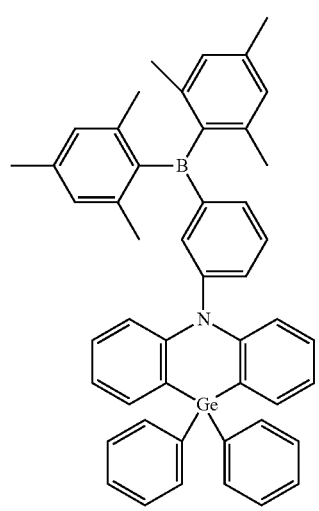

-continued
38
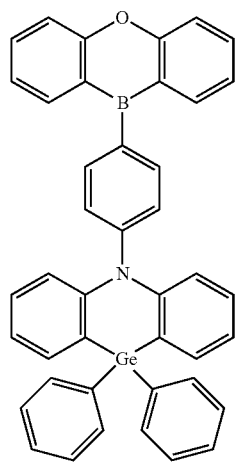
39
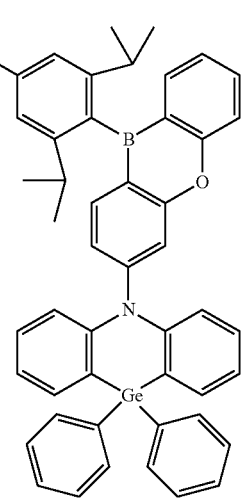
40
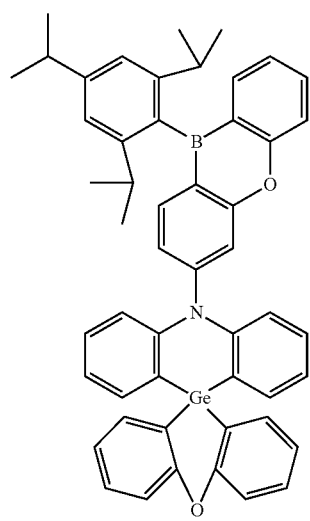
41
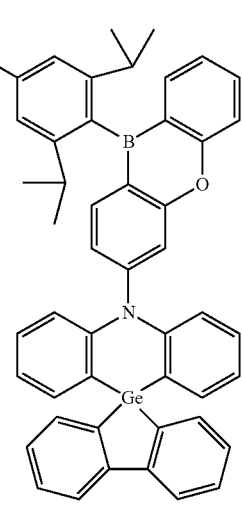
42
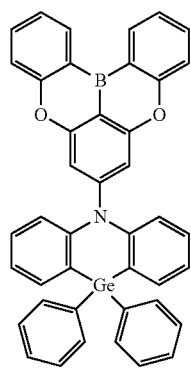
43
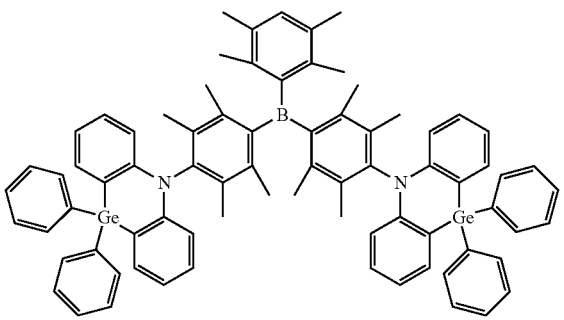

-continued
44
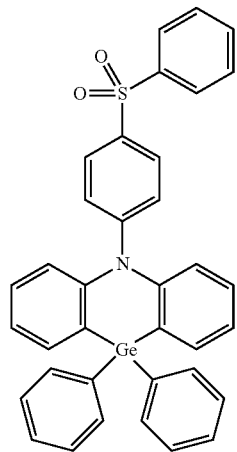
45
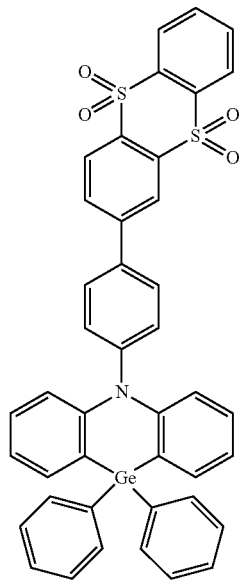
46
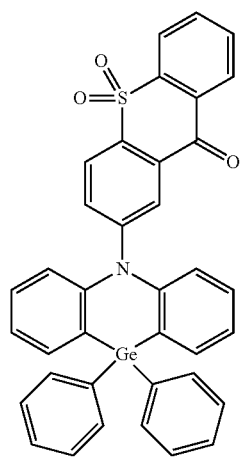
47
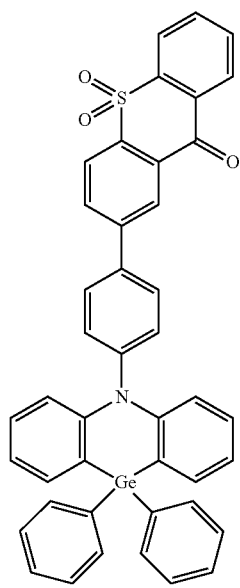
48
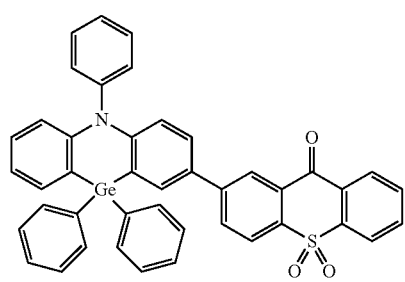
49
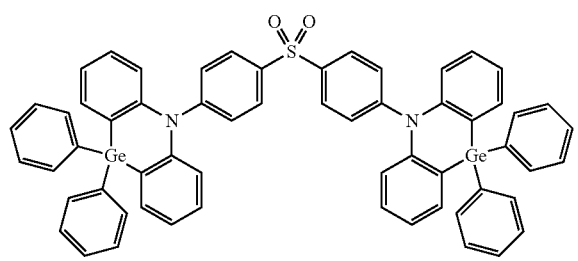

-continued
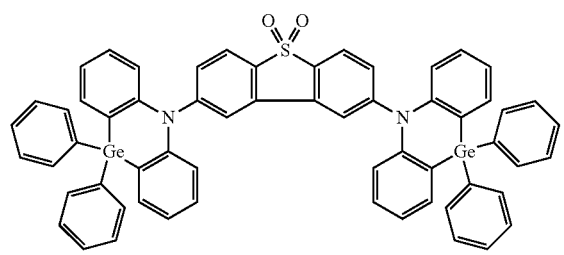
50
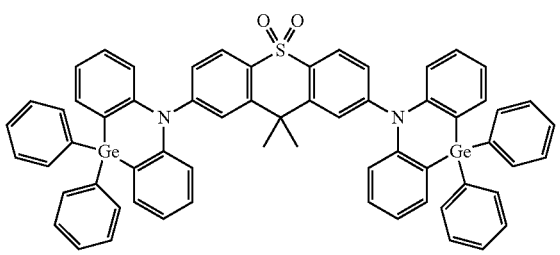
51
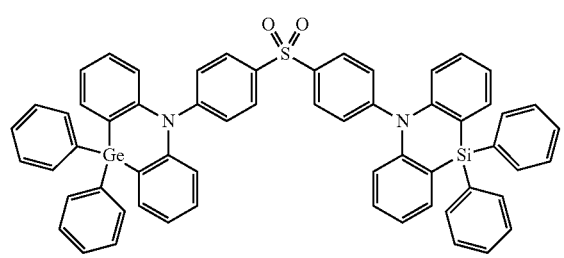
52
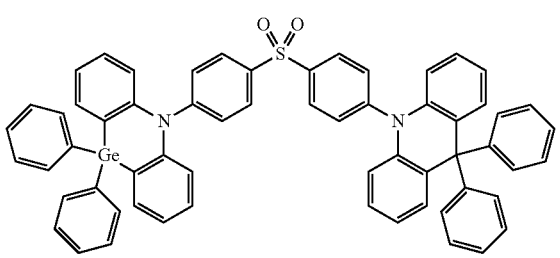
53
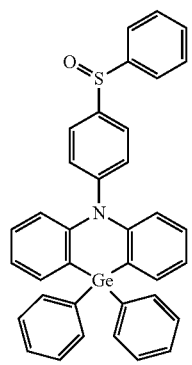
54
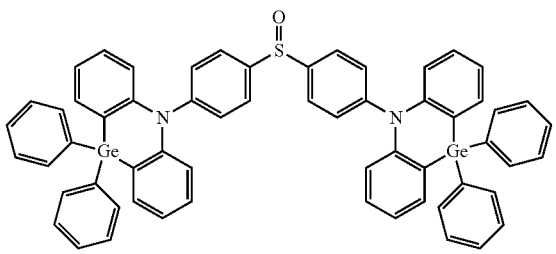
55
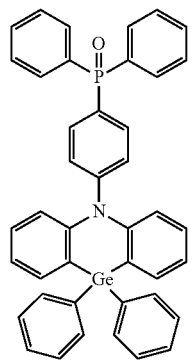
56
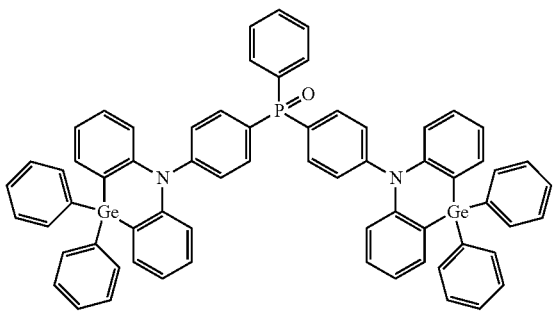
57

In an implementation, the polycyclic compound represented by Formula 1 may be, e.g., a compound of the following Compound Group 2.
[Compound Group 2]
58
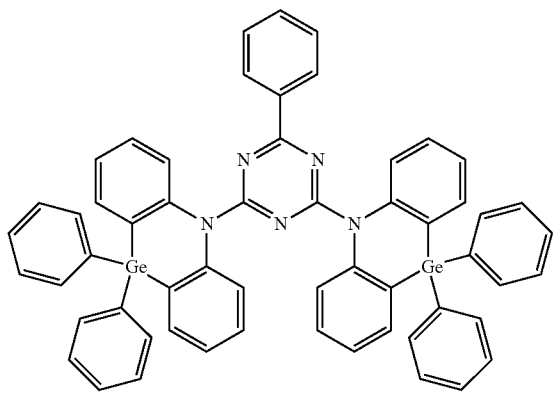
59
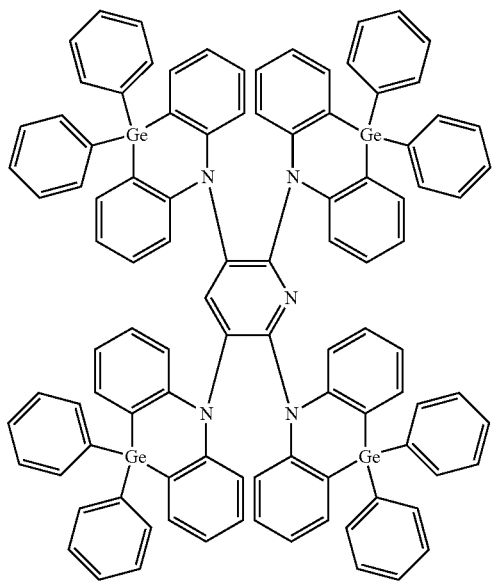
60
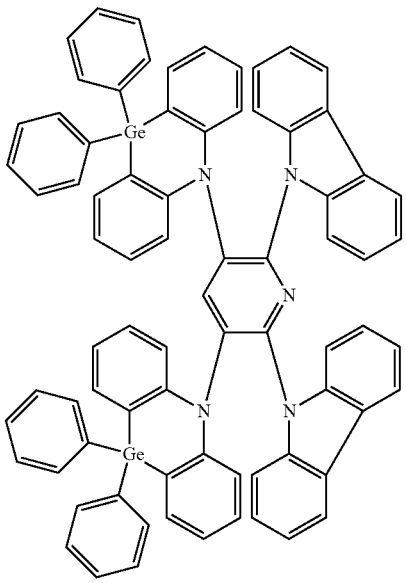
61
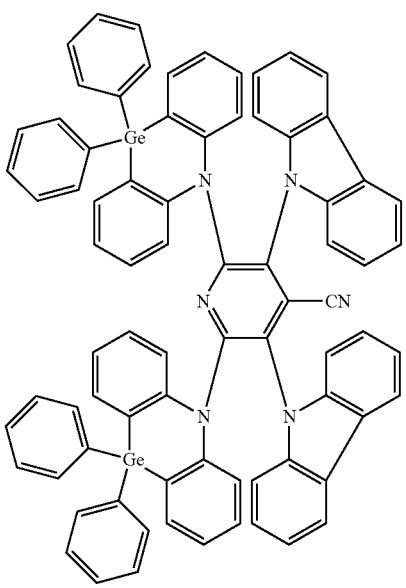
In an implementation, the polycyclic compound represented by Formula 1 may be, e.g., a compound of the following Compound Group 3.

[Compound Group 3]

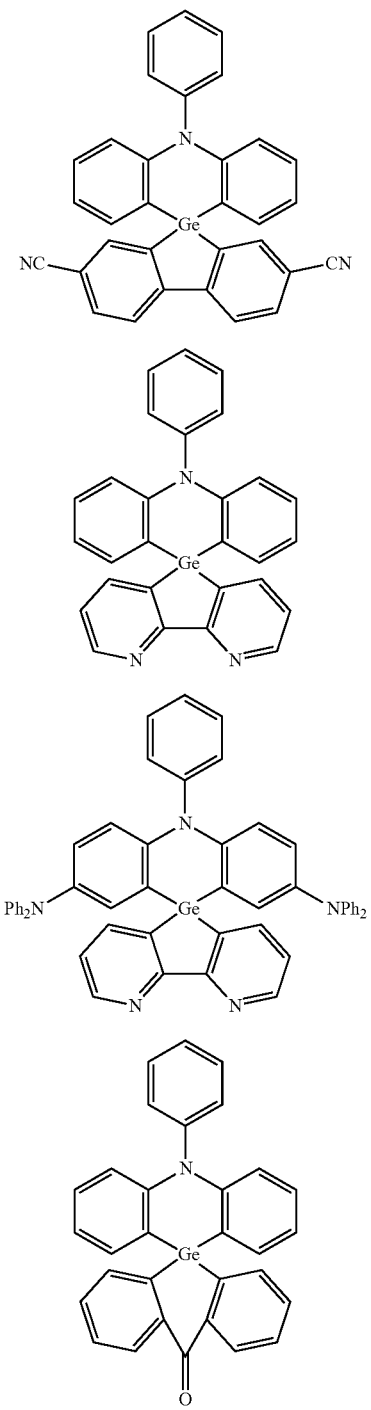

The polycyclic compound according to an embodiment may include an azagermine group having a heavy atom Ge as an electron donor, and may include, e.g., a cyano group, a carbonyl group, a boron group, a sulfinyl group, a sulfonyl group, a phosphine oxide group, a pyridyl group, a diazinyl group, a triazinyl group, or an azole group, etc. as an electron acceptor.

The polycyclic compound represented by Formula 1 may attain high emission efficiency and a long device life when used as a material for an organic electroluminescence device. The polycyclic compound represented by Formula 1 may include an azagermine group having a heavy atom Ge as an electron donor. The polycyclic compound represented by Formula 1 may have increased spin orbit coupling due to the heavy atom included in the electron donor, which may help promote a singlet-triplet intersystem crossing. Accordingly, the polycyclic compound according to an embodiment may be used as a dopant material in an emission layer of an organic electroluminescence device to emit thermally activated delayed fluorescent (TADF) efficiently without loss of a triplet exciton energy.

Hereinafter, an organic electroluminescence device according to an embodiment will be explained. The explanation will be mainly given with features different from the polycyclic compound according to an embodiment, and unexplained parts will follow the above-description on the polycyclic compound according to an embodiment.

An organic electroluminescence device according to an embodiment may include the above-described polycyclic compound.

Figure 2:
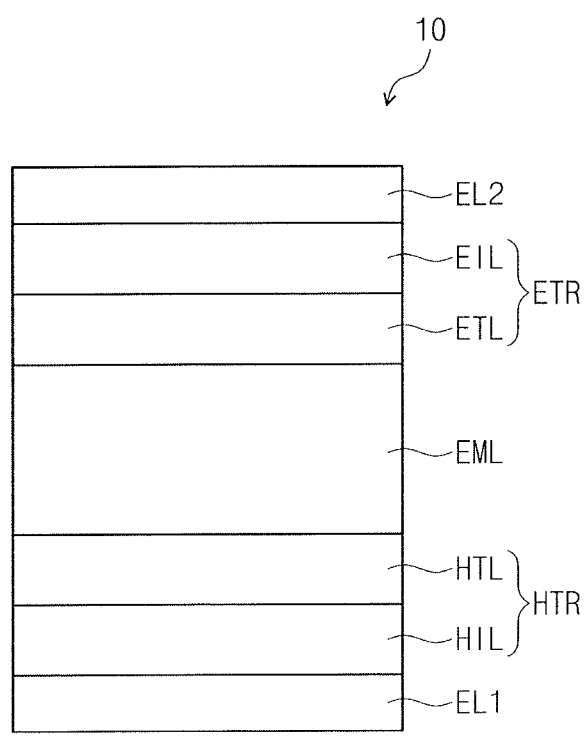
FIG. 2 illustrates a schematic cross-sectional view of an organic electroluminescence device according to an embodiment.
Figure 3:
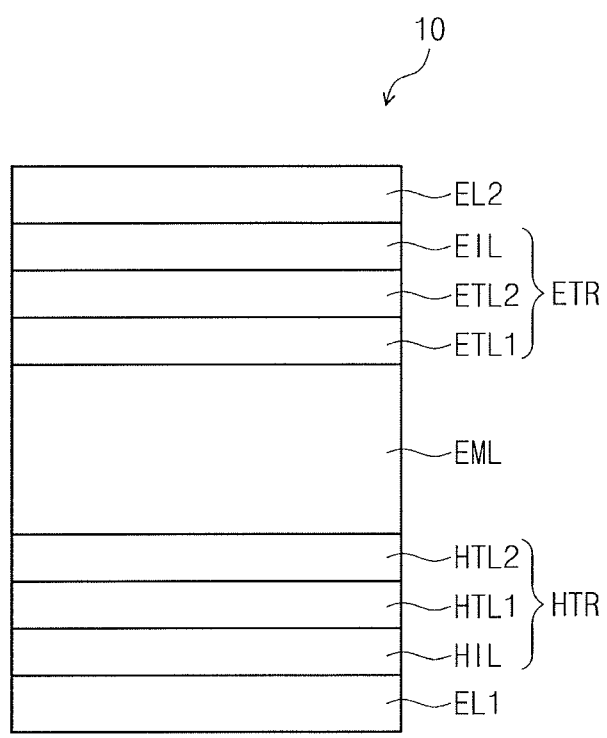
FIG. 3 illustrates a schematic cross-sectional view of an organic electroluminescence device according to an embodiment.

FIG. 1 illustrates a schematic cross-sectional view of an organic electroluminescence device according to an embodiment. FIG. 2 illustrates a schematic cross-sectional view of an organic electroluminescence device according to an embodiment. FIG. 3 illustrates a schematic cross-sectional view of an organic electroluminescence device according to an embodiment.

Referring to FIGS. 1 to 3, an organic electroluminescence device 10 according to an embodiment may include a first electrode EL1, a hole transport region HTR, an emission layer EML, an electron transport region ETR, and a second electrode EL2.

The first electrode EL1 has conductivity. The first electrode EL1 may be a pixel electrode or an anode. The first electrode EL1 may be a transmissive electrode, a transflective electrode, or a reflective electrode. In case the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). In case the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In an implementation, the first electrode EL1 may have a structure including a plurality of layers including a reflective layer or transflective layer formed using the above materials, and a transparent conductive layer formed using ITO, IZO, ZnO, or ITZO.

The hole transport region HTR is disposed on the first electrode EL1. The hole transport region HTR may include at least one of a hole injection layer HIL, a hole transport layer HTL, a hole buffer layer, or an electron blocking layer.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material, as shown in FIG. 2. In an implementation, the hole transport region HTR may have a single layer structure formed using a plurality of different materials, or a laminated structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, laminated in order from the first electrode EL1.

As shown in FIG. 3, the hole transport region HTR may have a plurality of hole transport layers. The hole transport region HTR may include a first hole transport layer HTL1 and a second hole transport layer HTL2 disposed on the first hole transport layer HTL1. Among the plurality of hole transport layers, the second hole transport layer HTL2 may be a hole transport layer adjacent to the emission layer EML.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthyl)-N,N'-diphenyl-(1,1'-biphenyl)-4,4'-diamine (NPD), triphenylamine-containing polyether ketone (TPAPEK), 4-isopropyl-4'-methyldiphenyliodonium tetrakis(pentafluorophenyl)borate, 1,4,5,8,9,11-hexaazatriphenylenehexacarbonitrile (HAT-CN), etc.

The hole transport layer HTL may also include, for example, carbazole derivatives such as N-phenyl carbazole, polyvinyl carbazole and 1,3-bis(N-carbazolyl)benzene (mCP), fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphthyl)-N,N'-diphenyl-(1,1'-biphenyl)-4,4'-diamine (NPD), 4,4'-cyclohexylidene bis[N,N-bis(4-methylphenyl) benzenamine] (TAPC), 4,4'-bis[N,N'-(3-tolyl)amino]-3,3'-dimethylbiphenyl (HMTPD), etc.

The thickness of the hole transport region HTR may be from about 150 Å to about 12,000 Å, for example, from about 150 Å to about 1,500 Å. In case the hole transport region HTR includes both of the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 50 Å to about 1,000 Å. In case the thicknesses of the hole transport region HTR, the hole injection layer HIL and the hole transport layer HTL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide and molybdenum oxide, without limitation.

As described above, the hole transport region HTR may further include at least one of a hole buffer layer or an electron blocking layer in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR into the hole transport region HTR.

The emission layer EML is disposed on the hole transport region HTR. The emission layer EML may be disposed on the hole transport layer HTL, and contact with the hole transport layer HTL. The thickness of the emission layer EML may be, for example, from about 100 Å to about 600 Å. The emission layer EML may have a single layer formed using a single material, a single layer formed using a plurality of different materials, or a multilayer structure having a plurality of layers formed using a plurality of different materials.

Hereinafter, a case where the polycyclic compound according to an embodiment is included in the emission layer EML, will be explained. In an implementation, the polycyclic compound according to an embodiment may be included in at least one organic layer provided between the first electrode EL1 and the second electrode EL2.

The emission layer EML may include the polycyclic compound according to an embodiment. For example, the organic electroluminescence device according to an embodiment may include the polycyclic compound represented by the following Formula 1 in the emission layer EML.

[Formula 1]

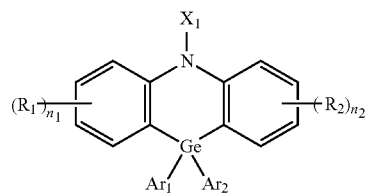

In Formula 1, particular explanation on $X_1$, $Ar_1$, $Ar_2$, $R_1$, $R_2$, $n_1$ and $n_2$ is the same as described above, and will be omitted.

Particular explanation on the polycyclic compound represented by the following Formula 1 may refer to the above description and will be omitted.

The emission layer EML may emit, e.g., one of red light, green light, blue light, white light, yellow light, or cyan light. The emission layer EML may include, e.g., a fluorescent material or a phosphorescent material. In an implementation, the polycyclic compound according to an embodiment may be a material for thermally activated delayed fluorescence. In an implementation, the polycyclic compound according to an embodiment may be a thermally activated delayed fluorescence material emitting blue light. In an implementation, the polycyclic compound according to an embodiment may have an energy difference ($\Delta E_{ST}$) between a lowest singlet energy level ($S_1$) and a lowest triplet energy level ($T_1$) of about 0.2 eV or less.

In an implementation, the emission layer EML may include a host and a dopant.

In an implementation, the host material of the emission layer EML may be selected from anthracene derivatives, fluoranthene derivatives, pyrene derivatives, arylacetylene derivatives, fluorene derivatives, perylene derivatives, chrysene derivatives, phenanthrene derivatives, or the like, e.g., from pyrene derivatives, perylene derivatives, chrysene derivatives, phenanthrene derivatives, or anthracene derivatives. For example, as the host material of the emission layer EML, anthracene derivatives represented by the following Formula 8 may be used.

[Formula 8]

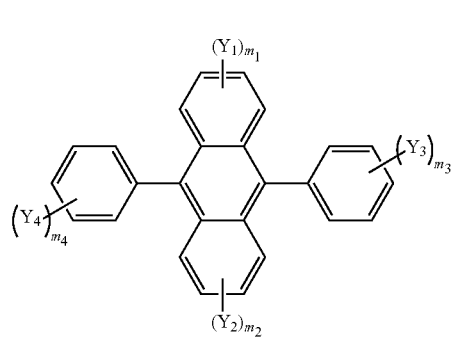

In Formula 8, $Y_1$ to $Y_4$ may each independently be or include, e.g., a hydrogen atom, a deuterium atom, a halogen atom, a substituted or unsubstituted silyl group, a substituted or unsubstituted alkyl group having 1 to 15 carbon atoms, a substituted or unsubstituted aryl group having 6 to 30 ring carbon atoms, or a substituted or unsubstituted heteroaryl group having 2 to 30 ring carbon atoms, $m_1$ and $m_2$ are each independently an integer of 0 to 4, and $m_3$ and $m_4$ are each independently an integer of 0 to 5. In Formula 8, $Y_3$ and $Y_4$ may be separate or may be each independently combined with an adjacent group to form a ring.

In an implementation, the compound represented by Formula 8 may include the compounds represented by the following structures.

a-1
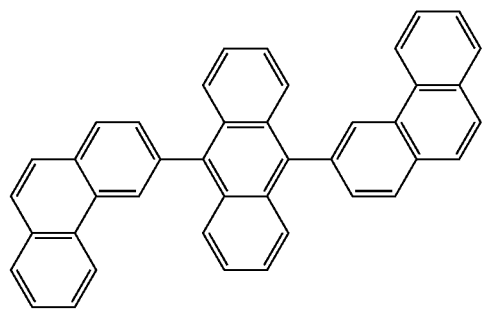

a-2
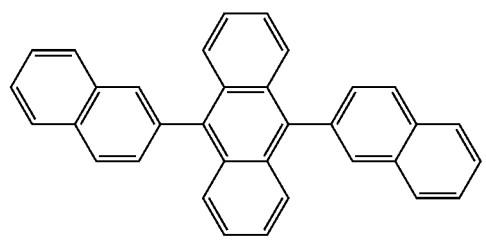

a-3
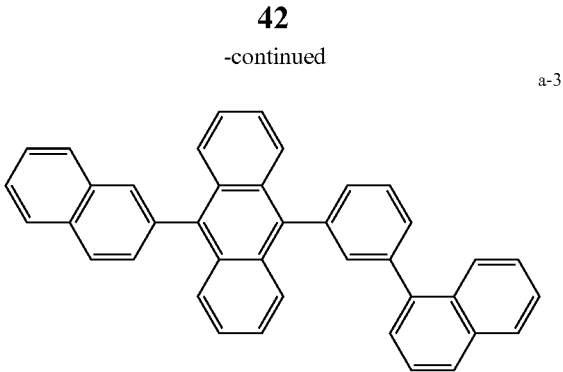

a-4
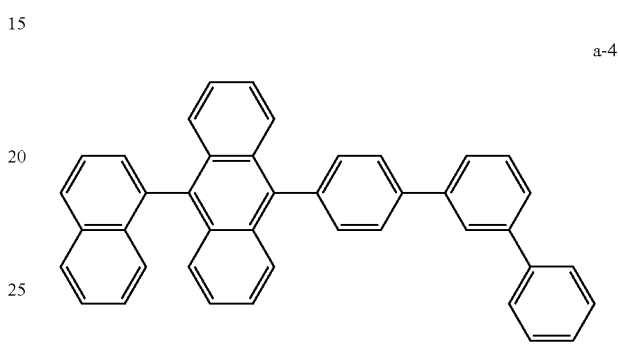

a-5
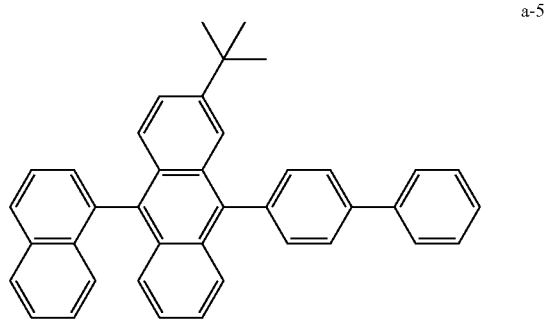

a-6
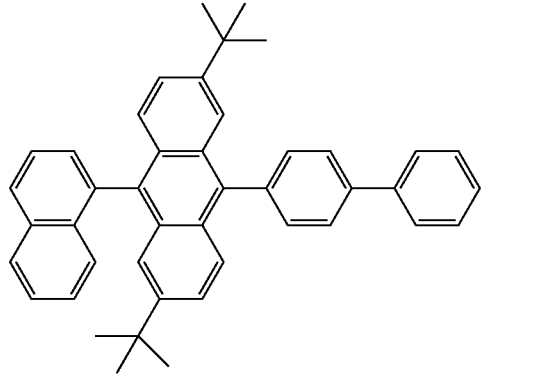

a-7
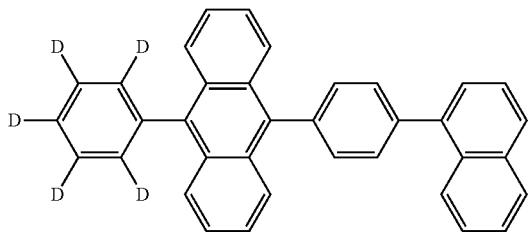

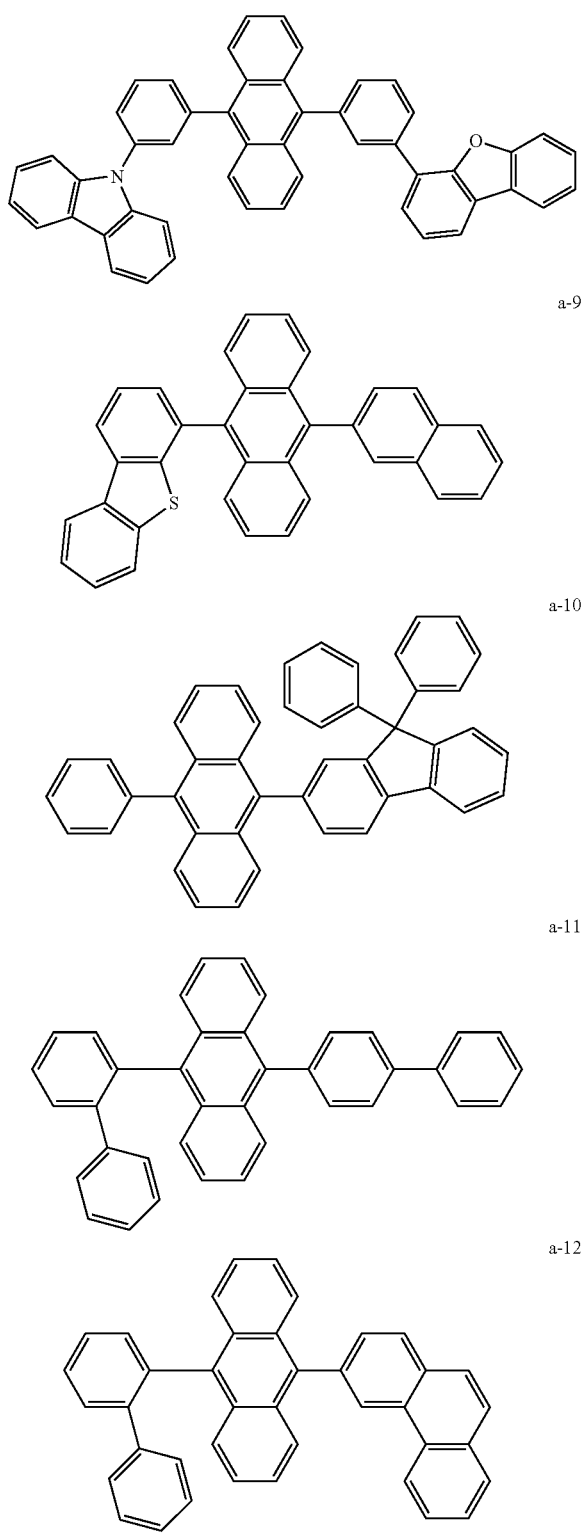

phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), etc.

The polycyclic compound represented by Formula 1 may be included as a dopant material. In an implementation, the polycyclic compound represented by Formula 1 may be a dopant material for thermally activated delayed fluorescence.

In the organic electroluminescence device according to an embodiment, the dopant may further include a suitable material in addition to the polycyclic compound represented by Formula 1. The additional dopant may include, e.g., styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-tert-butylperylene (TBP)), pyrene and the derivatives thereof (for example, 1,1-dipyrene, 1,4-dipyrenylbenzene, 1,4-bis(N,N-diphenylamino)pyrene), etc. The dopant may be 10-phenyl-10H,10'H-spiro[acridine-9,9'-anthracen]-10'-one (ACRSA).

When the emission layer EML emits red light, the emission layer EML may further include, e.g., tris(dibenzoylmethanato)phenanthroline europium (PBD:Eu(DBM)$_3$(Phen)), or a fluorescent material including perylene. In case the emission layer EML emits red light, the dopant included in the emission layer EML may be selected from a metal complex or an organometallic complex such as bis(1-phenylisoquinoline)acetylacetonate iridium (PIQIr(acac)), bis(1-phenylquinoline)acetylacetonate iridium (PQIr(acac), tris(1-phenylquinoline)iridium (PQIr), and octaethylporphyrin platinum (PtOEP), rubrene and the derivatives thereof, and 4-dicyanomethylene-2-(p-dimethylaminostyryl)-6-methyl-4H-pyran (DCM) and the derivatives thereof.

When the emission layer EML emits green light, the emission layer EML may further include a fluorescent material including, e.g., tris(8-hydroxyquinolino)aluminum (Alq3). When the emission layer EML emits green light, the dopant included in the emission layer EML may be selected from a metal complex or organometallic complex such as fac-tris(2-phenylpyridine)iridium (Ir(ppy)$_3$), and coumarin and the derivatives thereof.

When the emission layer EML emits blue light, the emission layer EML may further include a fluorescent material including any one of, e.g., spiro-DPVBi, spiro-6P, distyryl-benzene (DSB), distyryl-arylene (DSA), a polyfluorene (PFO)-based polymer, and a poly(p-phenylene vinylene) (PPV)-based polymer. When the emission layer EML emits blue light, the dopant included in the emission layer EML may be selected from a metal complex or an organometallic complexes such as (4,6-F$_2$ppy)$_2$Irpic, perylene and the derivatives thereof.

The electron transport region ETR is provided on the emission layer EML. The electron transport region ETR may include at least one of a hole blocking layer, an electron transport layer ETL or an electron injection layer EIL, without limitation.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or The host may be a suitable material and may include, e.g., tris(8-hydroxyquinolino)aluminum (Alq3), 4,4'-bis(N-carbazolyl)-1,1'-biphenyl (CBP), poly(N-vinylcarbazole) (PVK), 9,10-di(naphthalen-2-yl)anthracene (ADN), 4,4',4''-tris(carbazol-9-yl)-triphenylamine (TCTA), 1,3,5-tris(N- an electron transport layer ETL, or a single layer structure formed using an electron injection material and an electron transport material, as shown in FIG. 2. In an implementation, the electron transport region ETR may have a single layer structure having a plurality of different materials, or a laminated structure of electron transport layer ETL/electron injection layer EIL, or hole blocking layer/electron transport layer ETL/electron injection layer EIL, laminated in order from the emission layer EML.

As shown in FIG. 3, the electron transport region ETR may have a plurality of electron transport layers. The electron transport region ETR may include a first electron transport layer ETL1 and a second electron transport layer ETL2 disposed on the first electron transport layer ETL1. Among the plurality of electron transport layers, the first electron transport layer ETL1 may be an electron transport layer adjacent to the emission layer EML.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include, e.g., tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), berylliumbis(benzoquinolin-10-olate) (Bebq$_2$), 9,10-di(naphthalen-2-yl)anthracene (ADN), bis[2-(diphenylphosphino)phenyl]ether oxide (DPEPO) and a mixture thereof, without limitation. The thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

When the electron transport region ETR includes the electron injection layer EIL, it may include, e.g., a metal such as Al, Ag, Li, Mg and Ca, or a mixture thereof. In an implementation, the electron injection layer EIL may use LiF, lithium quinolate (LIQ), Li$_2$O, BaO, NaCl, CsF, a metal in lanthanides such as Yb, or a metal halide such as RbCl and RbI. In an implementation, the electron injection layer EIL also may be formed using a mixture material of an electron transport material and an insulating organo metal salt. The organo metal salt may be a material having an energy band gap of about 4 eV or more. In an implementation, the organo metal salt may include, for example, a metal acetate, a metal benzoate, a metal acetoacetate, a metal acetylacetonate, or a metal stearate. The thickness of the electron injection layer EIL may be from about 10 Å to about 100 Å. In case the thickness of the electron injection layer EIL satisfies the above described range, satisfactory electron injection properties may be obtained without inducing the substantial increase of a driving voltage.

The electron transport region ETR may include a hole blocking layer, as described above. In an implementation, the hole blocking layer may include, e.g., at least one of 2,9-dimethyl-4,7-diphenyl-1,10-phenanthroline (BCP), or 4,7-diphenyl-1,10-phenanthroline (Bphen).

The second electrode EL2 is disposed on the electron transport region ETR. The second electrode EL2 may be a common electrode or a cathode. The second electrode EL2 may be a transmissive electrode, a transflective electrode or a reflective electrode. In case the second electrode EL2 is the transmissive electrode, the second electrode EL2 may be formed using transparent metal oxides, e.g., ITO, IZO, ZnO, ITZO, etc.

In case the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed using the above-described materials and a transparent conductive layer formed using ITO, IZO, ZnO, ITZO, etc.

In an implementation, the second electrode EL2 may be connected with an auxiliary electrode. In case the second electrode EL2 is connected with the auxiliary electrode, the resistance of the second electrode EL2 may decrease.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

In case the organic electroluminescence device 10 is a top emission type, the first electrode EL1 may be a reflective electrode, and the second electrode EL2 may be a transmissive electrode or a transflective electrode. In case the organic electroluminescence device 10 is a bottom emission type, the first electrode EL1 may be a transmissive electrode or a transflective electrode, and the second electrode EL2 may be a reflective electrode.

The organic electroluminescence device according to an embodiment includes the polycyclic compound represented by Formula 1, thereby securing high emission efficiency and a long device life. The polycyclic compound according to an embodiment may be used as a dopant material in emission layer to attain high emission efficiency of an organic electroluminescence device. In an implementation, the polycyclic compound represented by Formula 1 includes an azagermine group having a heavy atom Ge as an electron donor, and has increased spin orbit coupling due to the heavy atom included in the electron donor, which may promote a singlet-triplet intersystem crossing. Accordingly, the organic electroluminescence device including the polycyclic compound according to an embodiment as a dopant material may emit thermally activated delayed fluorescent (TADF) efficiently without loss of a triplet exciton energy.

In an implementation, the polycyclic compounds according to an embodiment may be synthesized, e.g., as follows.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Examples

1. Synthesis of Compound 11
(Synthesis of Compound A)

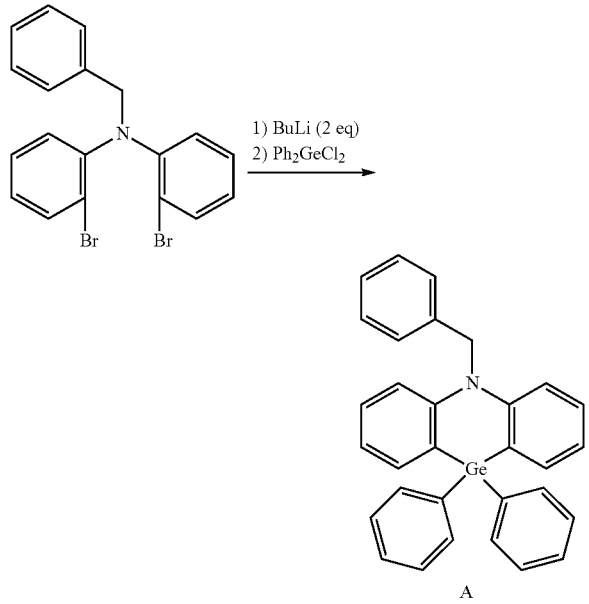

Under an argon (Ar) atmosphere, benzylbis(2-bromophenyl)amine (12.5 g, 30.0 mmol) was added to dehydrated THF (300 mL) in a 1,000 mL three neck flask, and the mixture was stirred at −78° C. 1.6 M n-BuLi in hexane (37.5 mL, 60.0 mmol) was added thereto dropwise and the resultant was stirred for about 2 hours. After diphenyldichlorogermane (6.3 mL, 30.0 mmol) in dehydrated THF (30 mL) was added thereto dropwise, the resultant was stirred at −78° C. for about 2 hours, and then at ambient temperature for about 3 hours. After the completion of reaction, the mixture was washed with water. An organic layer thus obtained was concentrated to obtain a viscous material. The crude product thus obtained was purified by silica gel column chromatography to obtain 9.00 g (yield 62%) of Compound A as a white solid. The molecular weight of Compound A measured by FAB-MS was 485.

(Synthesis of Compound B)

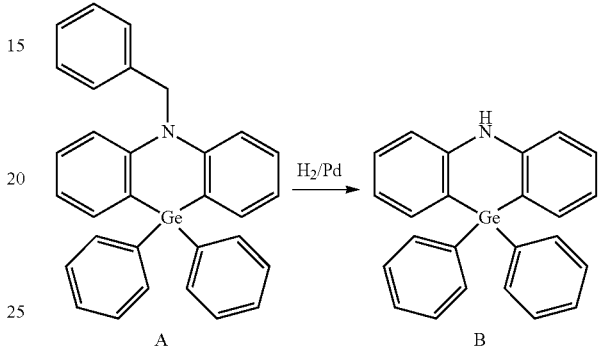

Under an argon (Ar) atmosphere, Pd black (2.97 g, 18.6 mmol) and Compound A (9.00 g, 18.6 mmol) were added to dehydrated dichloromethane (350 mL) in a 1,000 mL three neck flask, and the mixture was stirred at ambient temperature for about 12 hours under a hydrogen ($H_2$) atmosphere. After the resultant was washed with water, an organic layer thus obtained was concentrated and the crude product was purified by silica gel column chromatography to obtain 3.37 g (yield 46%) of Compound B as a white solid. The molecular weight of Compound B measured by FAB-MS was 395.

(Synthesis of Compound 11)

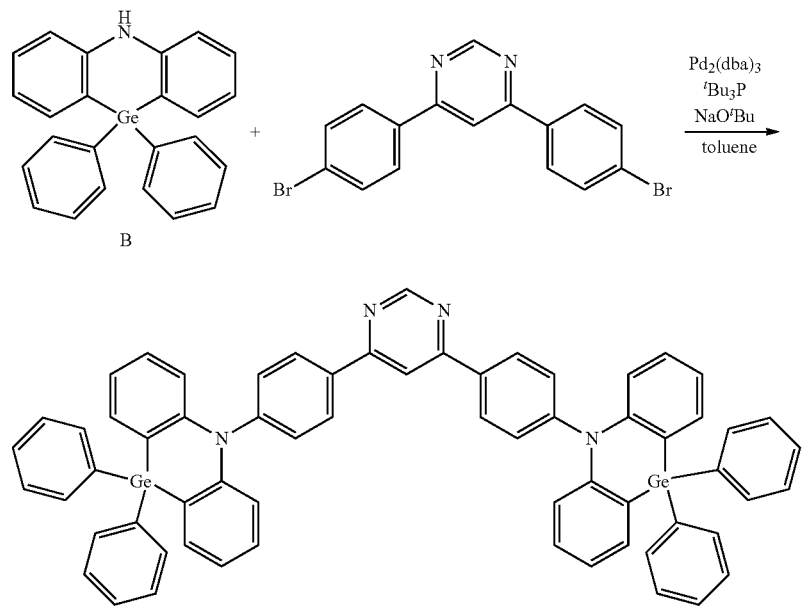

Under an argon (Ar) atmosphere, Compound B (3.16 g, 8.0 mmol), 4,6-bis(4-bromophenyl)pyrimidine (1.56 g, 4.0 mmol), Pd$_2$(dba)$_3$ (0.183 g, 0.20 mmol), ($^t$Bu)$_3$P (0.162 g, 0.80 mmol) and sodium tert-butoxide (0.769 g, 8.0 mmol) were added to toluene (16 mL) in a 100 mL three neck flask, and the mixture was stirred at 80° C. for about 12 hours. After cooling in the air, water was added thereto, an organic layer was separated and taken, and solvent was evaporated under reduced pressure. The crude product thus obtained was purified by silica gel column chromatography to obtain 2.35 g (yield 58%) of Compound 11 as a white solid. The molecular weight of Compound 11 measured by FAB-MS was 1,018. The chemical shift values of the compound measured by $^1$H-NMR were [9.26 (1H), 7.74-7.67 (5H), 7.38-7.28 (32H), 7.18 (4H), 7.01 (4H)]. From the results, the white solid compound was identified as Compound 11.

2. Synthesis of Compound 25

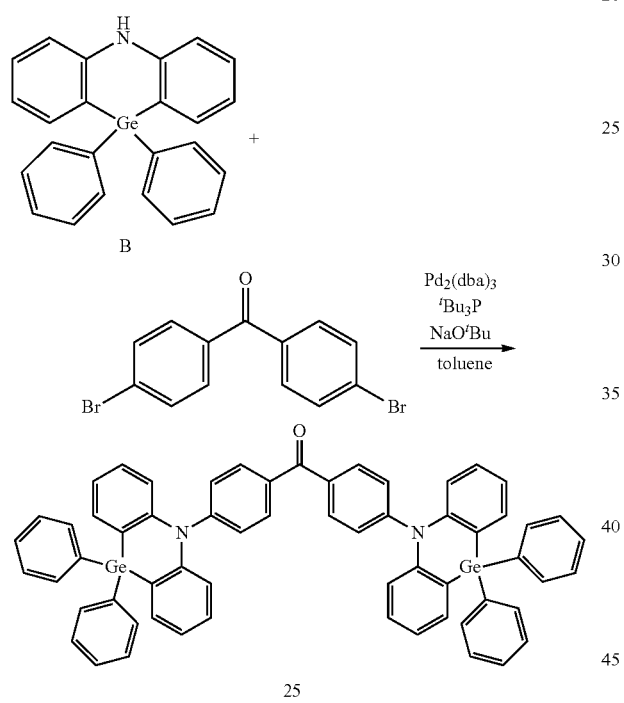

25

Compound B was obtained by conducting the same synthetic method of Compound B in the synthesis of Compound 11. Under an argon (Ar) atmosphere, Compound B (3.16 g, 8.0 mmol), 4,4'-dibromobenzophenone (1.36 g, 4.0 mmol), Pd$_2$(dba)$_3$ (0.183 g, 0.20 mmol), ($^t$Bu)$_3$P (0.162 g, 0.80 mmol) and sodium tert-butoxide (0.769 g, 8.0 mmol) were added to toluene (16 mL) in a 100 mL three neck flask, and the mixture was stirred at 80° C. for about 12 hours. After cooling in the air, water was added thereto, an organic layer was separated and taken, and solvent was evaporated under reduced pressure. The crude product thus obtained was purified by silica gel column chromatography to obtain 2.01 g (yield 52%) of Compound 25 as a white solid. The molecular weight of Compound 25 measured by FAB-MS was 968. The chemical shift values of the compound measured by $^1$H-NMR were [7.71 (4H), 7.37-7.27 (32H), 7.18 (4H), 7.01 (4H)]. From the results, the white solid compound was identified as Compound 25.

3. Synthesis of Compound 39

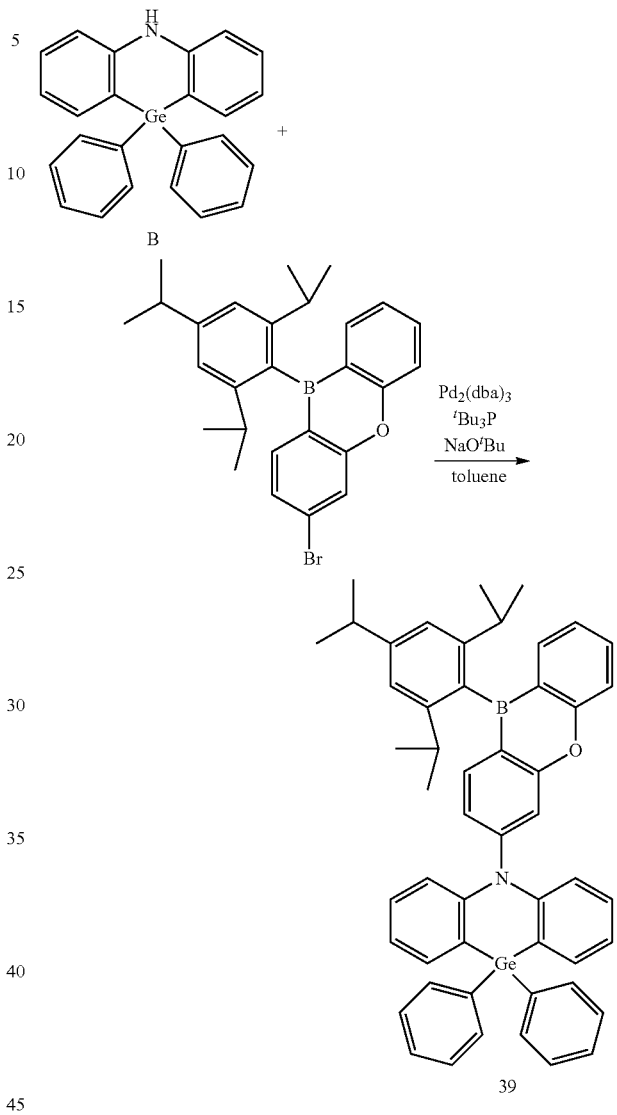

Compound B was obtained by conducting the same synthetic method of Compound B in the synthesis of Compound 11. Under an argon (Ar) atmosphere, Compound B (3.16 g, 8.0 mmol), 3-bromo-10-[2,4,6-tris(1-methylethyl)phenyl]-10H-phenoxaborin (3.69 g, 8.0 mmol), Pd$_2$(dba)$_3$ (0.183 g, 0.20 mmol), ($^t$Bu)$_3$P (0.162 g, 0.80 mmol) and sodium tert-butoxide (0.769 g, 8.0 mmol) were added to toluene (16 mL) in a 100 mL three neck flask, and the mixture was stirred at 80° C. for about 12 hours. After cooling in the air, water was added thereto, an organic layer was separated and taken, and solvent was evaporated under reduced pressure. The crude product thus obtained was purified by silica gel column chromatography to obtain 5.15 g (yield 83%) of Compound 39 as a white solid. The molecular weight of Compound 39 measured by FAB-MS was 775. The chemical shift values of the compound measured by $^1$H-NMR were [7.72-7.66 (2H), 7.37-7.28 (17H), 7.18 (2H), 7.08-6.99 (4H), 6.91-6.85 (2H), 2.89-2.86 (3H), 1.21-1.17 (18H)]. From the results, the white solid compound was identified as Compound 39.

4. Synthesis of Compound 49

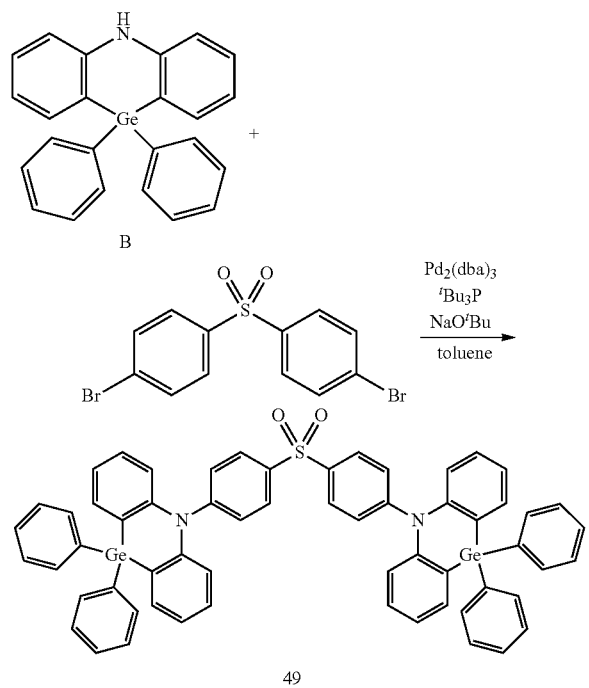

Compound B was obtained by conducting the same synthetic method of Compound B in the synthesis of Compound 11. Under an argon (Ar) atmosphere, Compound B (3.16 g, 8.0 mmol), 1,1'-sulfonylbis[4-bromobenzene] (1.50 g, 4.0 mmol), Pd$_2$(dba)$_3$ (0.183 g, 0.20 mmol), ($^t$Bu)$_3$P (0.162 g, 0.80 mmol) and sodium tert-butoxide (0.769 g, 8.0 mmol) were added to toluene (16 mL) in a 100 mL three neck flask, and the mixture was stirred at 80° C. for about 12 hours. After cooling in the air, water was added thereto, an organic layer was separated and taken, and solvent was evaporated under reduced pressure. The crude product thus obtained was purified by silica gel column chromatography to obtain 1.81 g (yield 45%) of Compound 49 as a white solid. The molecular weight of Compound 49 measured by FAB-MS was 1,004. The chemical shift values of the compound measured by $^1$H-NMR were [7.62 (4H), 7.37-7.28 (32H), 7.18 (4H), 7.01 (4H)]. From the results, the white solid compound was identified as Compound 49.

Experimental Example

Device Manufacturing Example

Organic electroluminescence devices of Examples 1 to 4 were manufactured by using the above Compounds 11, 25, 39 and 49 as a dopant material in an emission layer.

[Example Compounds]

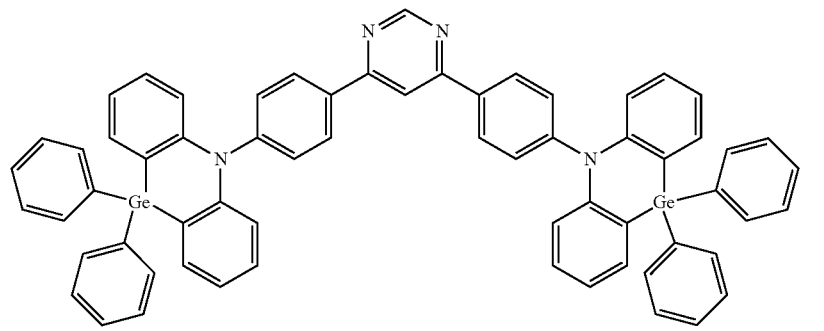

11

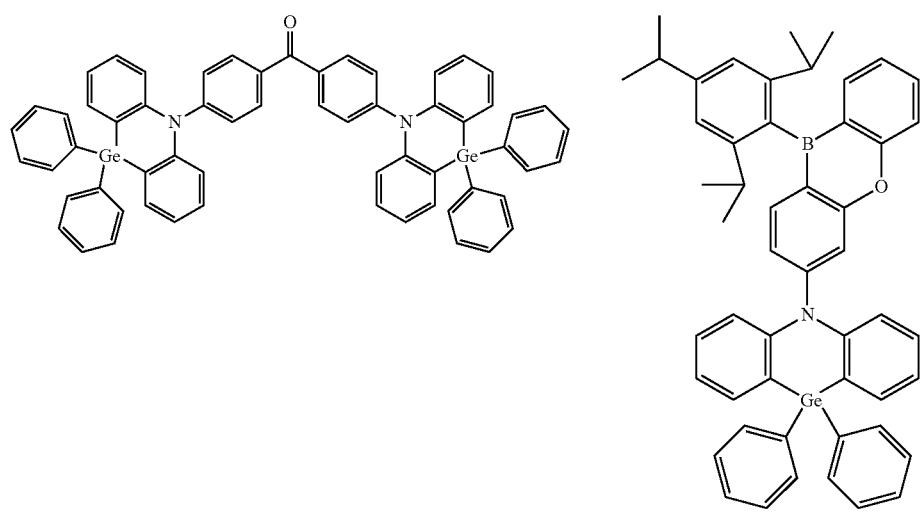

25

39

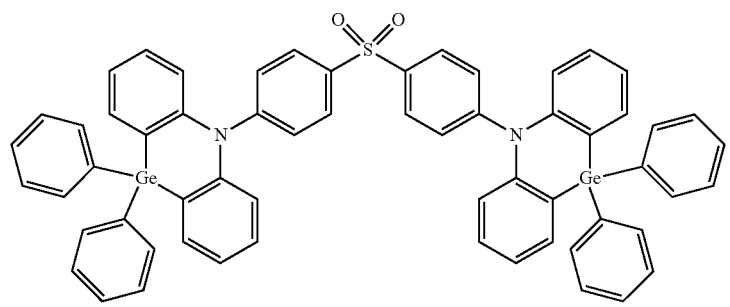
Organic electroluminescent devices of Comparative Examples 1 to 9 were manufactured by using the following Comparative Compounds c1 to c9.
[Comparative Compounds]
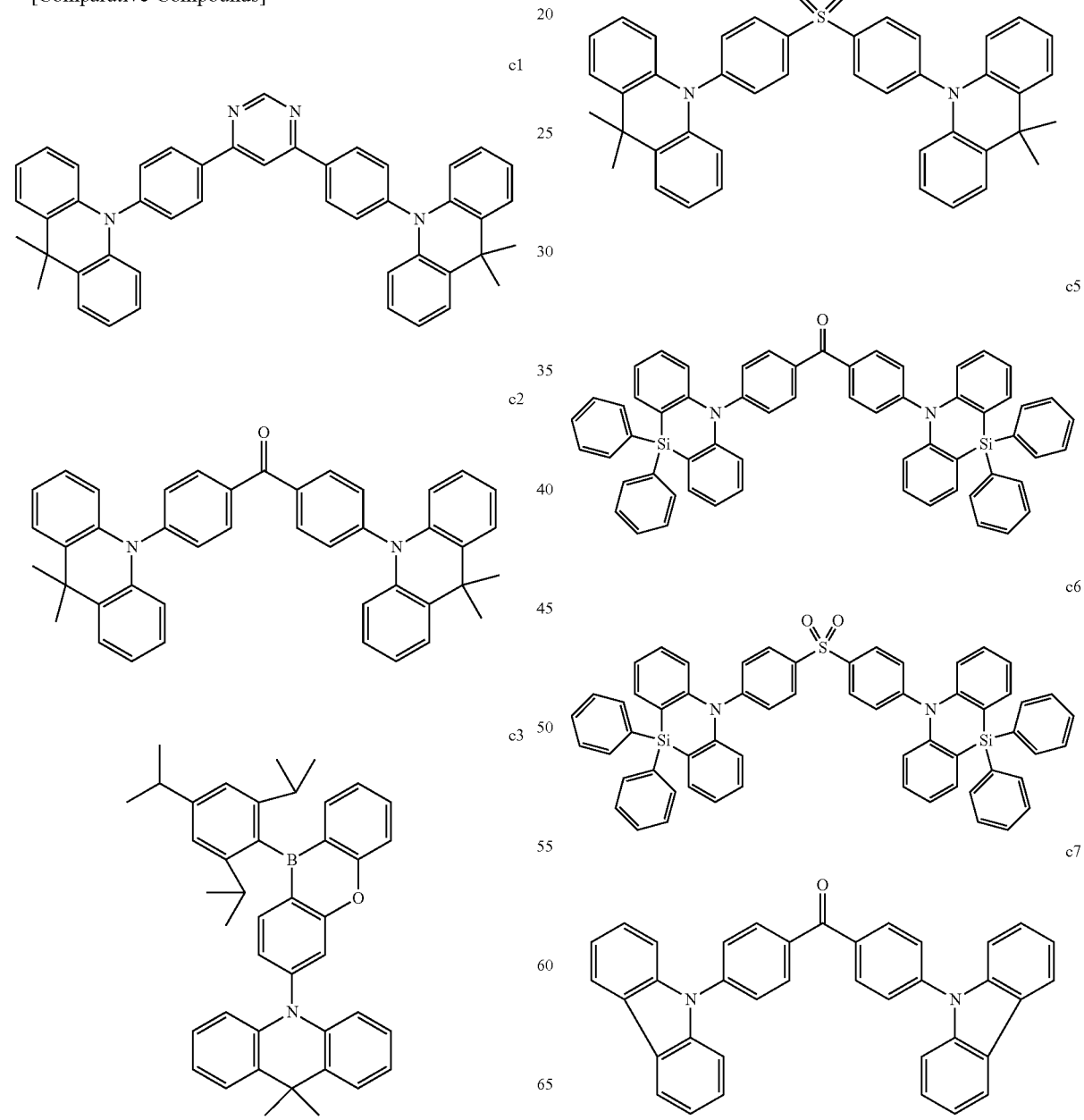

-continued

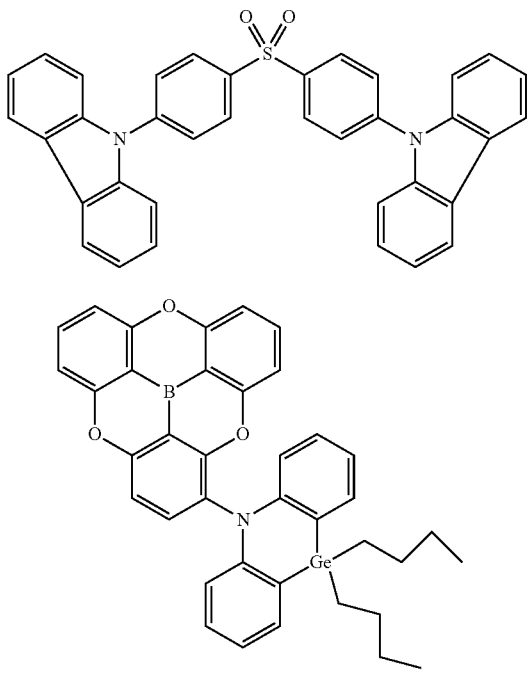

c8 c9

The organic electroluminescence devices according to Examples 1 to 4 and Comparative Examples 1 to 9 were manufactured by forming a first electrode using ITO to a thickness of about 120 nm, a hole injection layer using 1,4,5,8,9,11-hexaazatriphenylenehexacarbonitrile (HAT-CN) to a thickness of about 10 nm, a first hole transport layer using N,N'-di(1-naphthyl)-N,N'-diphenyl-(1,1'-biphenyl)-4,4'-diamine (NPD) to a thickness of about 80 nm, a second hole transport layer using 1,3-bis(N-carbazolyl)benzene (mCP) to a thickness of about 5 nm, an emission layer using bis[2-(diphenylphosphino)phenyl]ether oxide (DPEPO) doped with the example compounds or the comparative compounds in an amount of 20% to a thickness of about 20 nm, a first electron transport layer using bis[2-(diphenylphosphino)phenyl]ether oxide (DPEPO) to a thickness of about 10 nm, a second electron transport layer using 1,3,5-tris(N-phenylbenzimidazole-2-yl)benzene (TPBi) to a thickness of about 30 nm, an electron injection layer using LiF to a thickness of about 0.5 nm, and a second electrode using Al to a thickness of about 100 nm. Each layer was formed by a vacuum deposition method.

Experimental Examples

The emission wavelength, external quantum efficiency (EQE) and half-life of the organic electroluminescence devices manufactured by using Example Compounds 11, 25, 39 and 49 and Comparative Compounds c1 to c9 were evaluated. Evaluation results are shown in Table 1 below. The external quantum efficiency of the organic electroluminescence device manufactured in each Example and Comparative Example was a measured value at a current density of about 10 mA/cm$^2$, and half-life was obtained by measuring time required for a luminance half-time from an initial luminance of 1,000 cd/m$^2$.

TABLE 1

| Examples | Dopant | Emission wavelength (nm) | External quantum efficiency (%) | Life LT$_{50}$ (h) |
| --- | --- | --- | --- | --- |
| Example 1 | Example Compound 11 | 460 | 10.8 | 29.2 |
| Example 2 | Example Compound 25 | 466 | 14.0 | 33.4 |
| Example 3 | Example Compound 39 | 447 | 12.0 | 8.7 |
| Example 4 | Example Compound 49 | 433 | 10.1 | 12.1 |
| Comparative Example 1 | Comparative Compound c1 | 500 | 8.0 | 16.0 |
| Comparative Example 2 | Comparative Compound c2 | 506 | 10.8 | 19.9 |
| Comparative Example 3 | Comparative Compound c3 | 488 | 8.8 | 4.7 |
| Comparative Example 4 | Comparative Compound c4 | 477 | 9.2 | 10.0 |
| Comparative Example 5 | Comparative Compound c5 | 476 | 9.4 | 23.4 |
| Comparative Example 6 | Comparative Compound c6 | 426 | 0.9 | 9.8 |
| Comparative Example 7 | Comparative Compound c7 | 448 | 5.7 | 1.9 |
| Comparative Example 8 | Comparative Compound c8 | 424 | 0.2 | 0.2 |
| Comparative Example 9 | Comparative Compound c9 | 459 | 10.8 | 2.4 |

Referring to the results in Table 1, it may be seen that the organic electroluminescence devices of Examples 1 to 4 had enhanced emission efficiency and device life, when compared with those of Comparative Examples 1 to 9. Specifically, the organic electroluminescence devices of Examples 1 to 4 had enhanced emission efficiency and device life while emitting light of wavelength similar to those of Comparative Examples 1 to 4 including dopant materials of similar structure. Furthermore, the organic electroluminescence devices of Examples 1 to 4 had enhanced emission efficiency and device life when compared with those of Comparative Examples 5 to 8 including dopant materials with an azasiline group, a carbazole group, etc., and also had enhanced emission efficiency and device life when compared with that of Comparative Example 9 including a dopant material with a germine group substituted with alkyl group.

Example compounds included in the organic electroluminescence devices of Examples 1 to 4 include an azagermine group having a heavy atom Ge as an electron donor, and have increased spin orbit coupling due to the heavy atom included in the electron donor, which may help promote a singlet-triplet intersystem crossing. Accordingly, the organic electroluminescence device including the compound as a dopant material may emit thermally activated delayed fluorescent (TADF) efficiently without loss of a triplet exciton energy, thereby attaining high efficiency and a long device life.

Comparative Compound c1 included in the organic electroluminescence device of Comparative Example 1 has a structure similar to Example Compound 11, but included an acridine group instead of an azagermine group as an electron donor. Accordingly, the organic electroluminescence device of Comparative Example 1 may not attain a heavy atom effect due to Ge, and had decreased emission efficiency and device life when compared with that of Example 1.

Comparative Compounds c2, c5, and c7 included in the organic electroluminescence devices of Comparative Examples 2, 5, and 7, respectively, had structures similar to Example Compound 25, but included an acridine, azasiline, and carbazole group, respectively, instead of an azagermine group as an electron donor. Accordingly, the organic electroluminescence devices of Comparative Examples 2, 5, and 7 may not attain a heavy atom effect due to Ge, and had decreased emission efficiency and device life when compared with that of Example 2.

Comparative Compound c3 included in the organic electroluminescence device of Comparative Example 3 had a structure similar to Example Compound 39, but included an acridine group instead of an azagermine group as an electron donor. Accordingly, the organic electroluminescence device of Comparative Example 3 may not attain a heavy atom effect due to Ge, and had decreased emission efficiency and device life when compared with that of Example 3.

Comparative Compounds c4, c6, and c8 included in the organic electroluminescence devices of Comparative Examples 4, 6, and 8, respectively, had structures similar to Example Compound 49, but included an acridine, azasiline, and carbazole group, respectively, instead of an azagermine group as an electron donor. Accordingly, the organic electroluminescence devices of Comparative Examples 4, 6, and 8 may not attain a heavy atom effect due to Ge, and had decreased emission efficiency and device life when compared with that of Example 4.

Comparative Compound c9 included in the organic electroluminescence device of Comparative Example 9 included an azagermine group as an electron donor, in which Ge has an alkyl substituent instead of an aryl substituent, however. Accordingly, the organic electroluminescence device of Comparative Example 9 had decreased emission efficiency and device life due to reduced stability of azagermine group, when compared with those of the Examples.

The polycyclic compound according to an embodiment may be used as a material for an organic electroluminescence device.

The organic electroluminescence device including the polycyclic compound according to an embodiment may attain high emission efficiency and a long device life.

The embodiments may provide a polycyclic compound used in an organic electroluminescence device with high emission efficiency.

The embodiments may provide an organic electroluminescence device with high emission efficiency and a long device life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polycyclic compound represented by Formula 1:

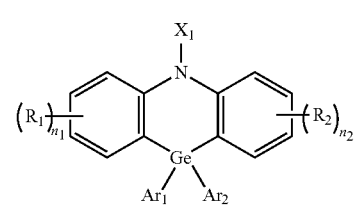

[Formula 1]

wherein, in Formula 1, $X_1$ is a group represented by one of Formulae 2-1, 2-2, or 2-4 to 2-8, $Ar_1$ and $Ar_2$ are each independently a substituted or unsubstituted aryl group having 6 to 30 ring carbon atoms or represented by one of Formulae 2-1 to 2-8, $Ar_1$ and $Ar_2$ being separate or forming a ring by combining adjacent groups with each other, $R_1$ and $R_2$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, or represented by one of Formulae 2-1 to 2-8, $R_1$ and $R_2$ being separate or forming a ring by combining adjacent groups with each other, and $n_1$ and $n_2$ are each independently an integer of 0 to 4:

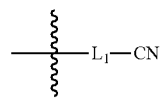

[Formula 2-1]

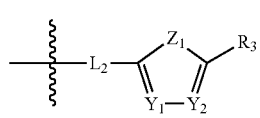

[Formula 2-2]

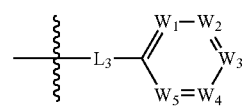

[Formula 2-3]

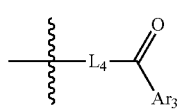

[Formula 2-4]

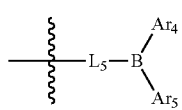

[Formula 2-5]

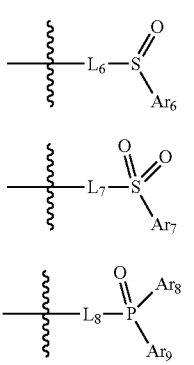

[Formula 2-6]

[Formula 2-7]

[Formula 2-8]

wherein, in Formulae 2-1 to 2-8,
$Y_1$ and $Y_2$ are each independently N or $CR_4$, at least one of $Y_1$ or $Y_2$ being N,
$Z_1$ is O, S, or $NAr_{10}$,
$W_1$ to $W_5$ are each independently N or $CR_5$, at least one of $W_1$ to $W_5$ being N,
$L_1$ to $L_8$ are each independently a direct linkage, a substituted or unsubstituted arylene group having 6 to 30 ring carbon atoms, or a substituted or unsubstituted heteroarylene group having 2 to 30 ring carbon atoms,
$Ar_3$ to $Ar_{10}$ are each independently a substituted or unsubstituted oxy group, a substituted or unsubstituted thio group, a substituted or unsubstituted amino group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $Ar_3$ to $Ar_9$ being separate or forming a ring by combining adjacent groups with each other,
$R_3$ is a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, or a substituted or unsubstituted aryl group having 6 to 30 ring carbon atoms, and
$R_4$ to $R_5$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_3$ and $R_4$ being separate or forming a ring by combining adjacent groups with each other.

2. The polycyclic compound as claimed in claim 1, wherein the polycyclic compound represented by Formula 1 is represented by the following Formula 3:

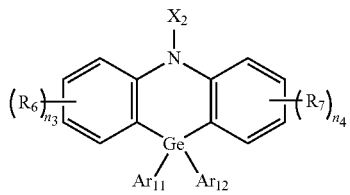

[Formula 3]

wherein, in Formula 3,
$X_2$ is a group represented by any one of Formulae 2-1, 2-2, or 2-4 to 2-8,
$Ar_{11}$ and $Ar_{12}$ are each independently a substituted or unsubstituted aryl group having 6 to 30 ring carbon atoms, $Ar_{11}$ and $Ar_{12}$ being separate or forming a ring by combining adjacent groups with each other,
$R_6$ and $R_7$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_6$ and $R_7$ being separate or forming a ring by combining adjacent groups with each other, and
$n_3$ and $n_4$ are each independently an integer of 0 to 4.

3. The polycyclic compound as claimed in claim 2, wherein $L_1$ to $L_8$ are each independently a substituted or unsubstituted phenylene group.

4. The polycyclic compound as claimed in claim 2, wherein the polycyclic compound represented by Formula 3 is represented by the following Formula 4:

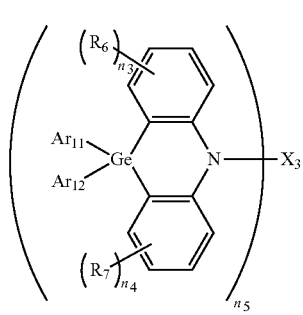

[Formula 4]

wherein, in Formula 4,
$n_5$ is an integer of 1 to 4,
when $n_5$ is 1, $X_3$ is the same as $X_2$, where $L_1$, $L_2$, and $L_4$ to $L_8$ are each a phenylene group,
when $n_5$ is an integer of 2 to 4, $X_3$ is a phenylene group substituted with one selected from a cyano group, a substituted or unsubstituted carbonyl group, a substituted or unsubstituted boron group, a substituted or unsubstituted sulfinyl group, a substituted or unsubstituted sulfonyl group, a substituted or unsubstituted phosphine oxide group, and Formula 5-1, and $Ar_{11}, Ar_{12}, R_6, R_7, n_3$ and $n_4$ are defined the same as those of Formula 3,

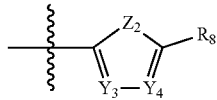

[Formula 5-1]

wherein, in Formula 5-1, $Y_3$ and $Y_4$ are each independently N or $CR_9$, at least one of $Y_3$ or $Y_4$ being N, $Z_2$ is O, S, or $NAr_{13}$, $Ar_{13}$ is a substituted or unsubstituted aryl group having 6 to 30 ring carbon atoms or a substituted or unsubstituted heteroaryl group having 2 to 30 ring carbon atoms, and $R_8$ to $R_9$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_8$ and $R_9$ being separate or forming a ring by combining adjacent groups with each other.

5. The polycyclic compound as claimed in claim 2, wherein the polycyclic compound represented by Formula 3 is represented by the following Formula 6:

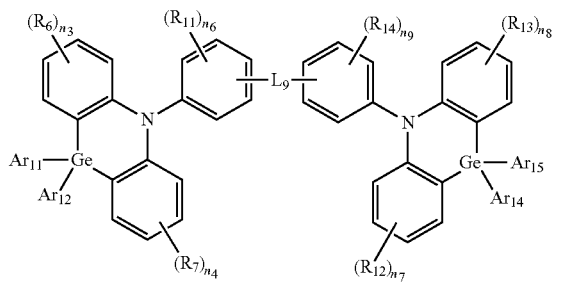

[Formula 6]

wherein, in Formula 6, $L_9$ is a substituted or unsubstituted divalent carbonyl group, a substituted or unsubstituted divalent boron group, a substituted or unsubstituted divalent sulfinyl group, a substituted or unsubstituted divalent sulfonyl group, a substituted or unsubstituted divalent phosphine oxide group, or a group represented by the following Formula 7-1 or 7-2, $Ar_{14}$ and $Ar_{15}$ are each independently a substituted or unsubstituted aryl group having 6 to 30 ring carbon atoms, $Ar_{14}$ and $Ar_{15}$ being separate or forming a ring by combining adjacent groups with each other, $R_{11}$ to $R_{14}$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_{11}$ to $R_{14}$ being separate or forming a ring by combining adjacent groups with each other, $n_6$ to $n_9$ are each independently an integer of 0 to 4, and $Ar_{11}, Ar_{12}, R_6, R_7, n_3$ and $n_4$ are defined the same as those of Formula 3,

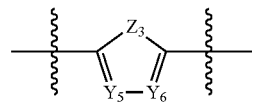

[Formula 7-1]

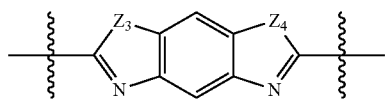

[Formula 7-2]

wherein, in Formulae 7-1 and 7-2, $Y_5$ and $Y_6$ are each independently N or $CR_{15}$, at least one of $Y_5$ or $Y_6$ being N, $Z_3$ and $Z_4$ are each independently O, S, or $NAr_{16}$, $R_{15}$ is a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_{15}$ being separated or forming a ring by combining adjacent groups with each other, and $Ar_{16}$ is a substituted or unsubstituted aryl group having 6 to 30 ring carbon atoms or a substituted or unsubstituted heteroaryl group having 2 to 30 ring carbon atoms.

6. The polycyclic compound as claimed in claim 1, wherein $X_1$ is a group represented by one of the following Formulae 2-2-1 to 2-2-6:

[Formula 2-2-1]

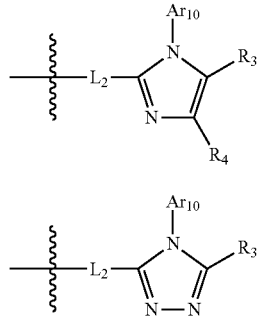

[Formula 2-2-5]

[Formula 2-2-2]

[Formula 2-2-6]

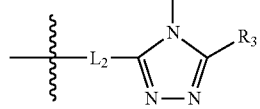

[Formula 2-2-3]

[Formula 2-2-4]

wherein, in Formulae 2-2-1 to 2-2-6, $L_2$, $R_3$, $R_4$ and $Ar_{10}$ are defined the same as those of Formula 1.

7. The polycyclic compound as claimed in claim 1, wherein $R_1$ and $R_2$ are each independently a hydrogen atom, a substituted or unsubstituted oxy group, a substituted or unsubstituted amino group, a substituted or unsubstituted methyl group, or a substituted or unsubstituted phenyl group.

8. A polycyclic compound of Compound Group 1 or Compound Group 3:

[Compound Group 1]

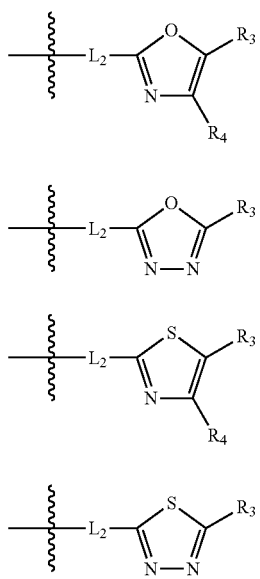

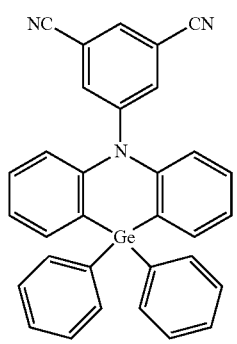

1

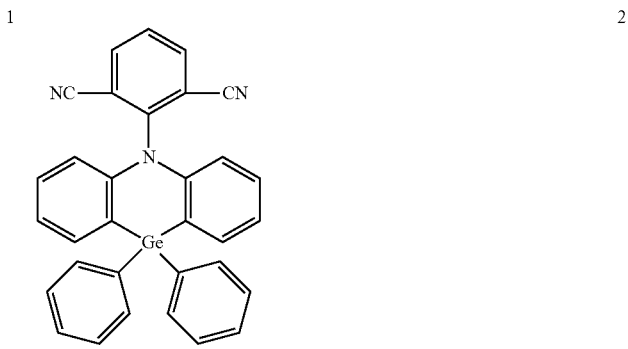

2

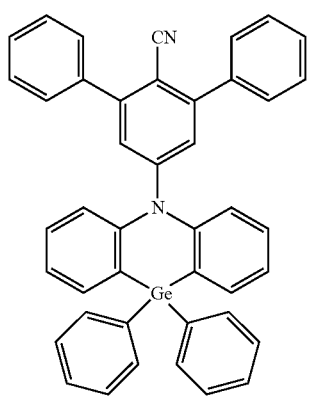

3

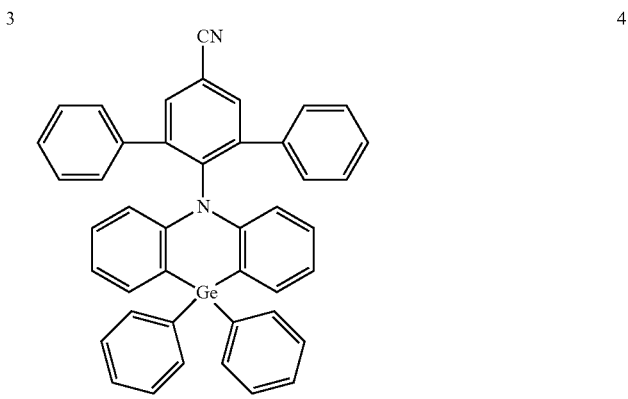

4

-continued
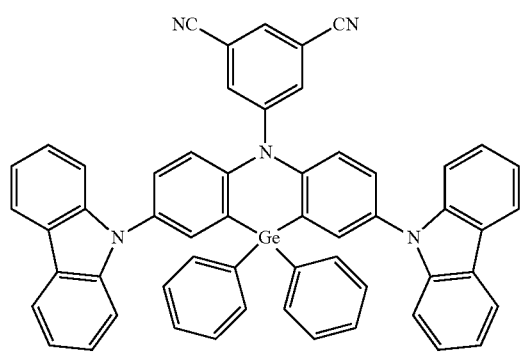
5
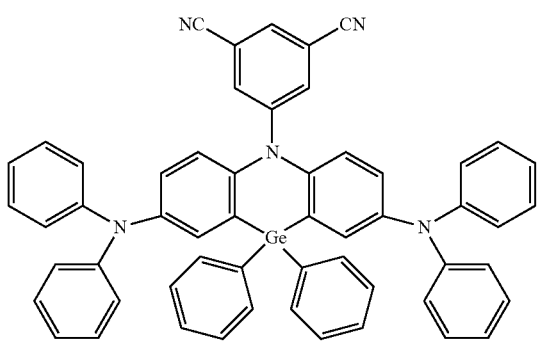
6
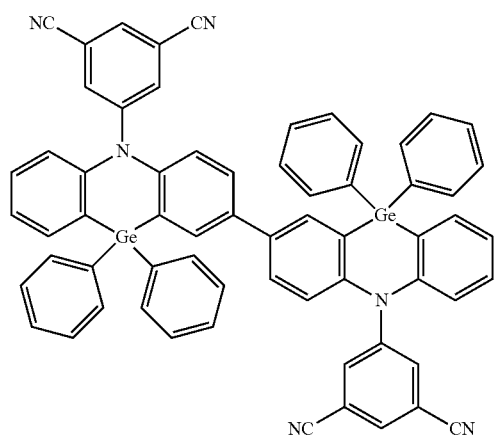
7
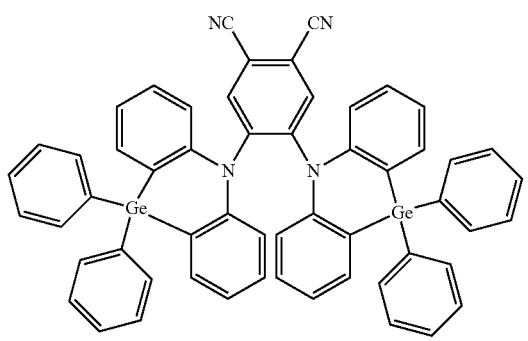
8
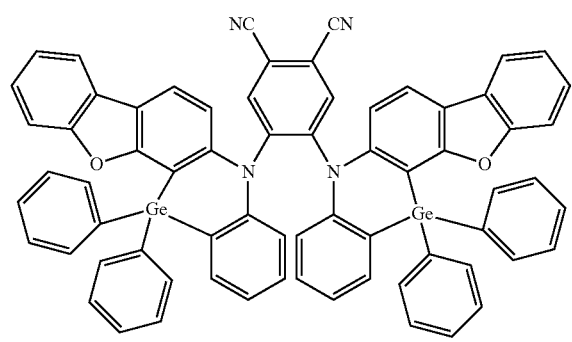
9
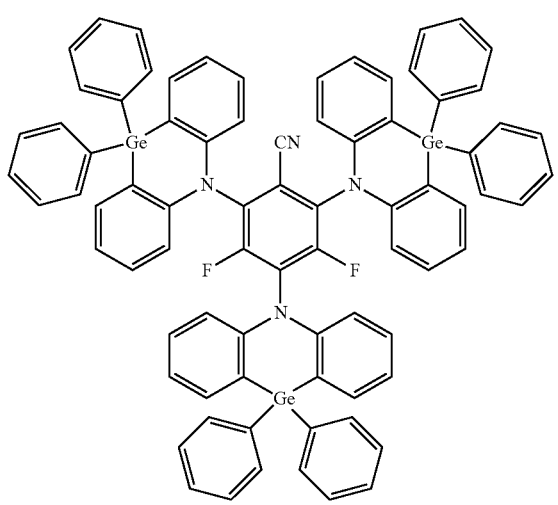
10

13
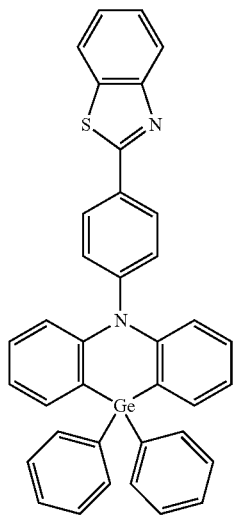
14
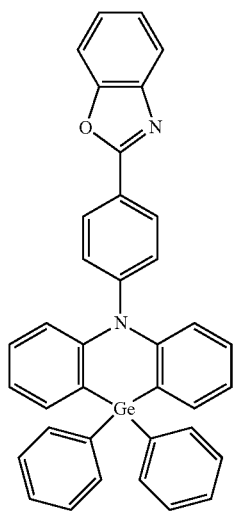
15
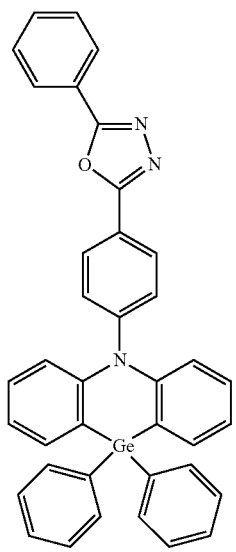
16
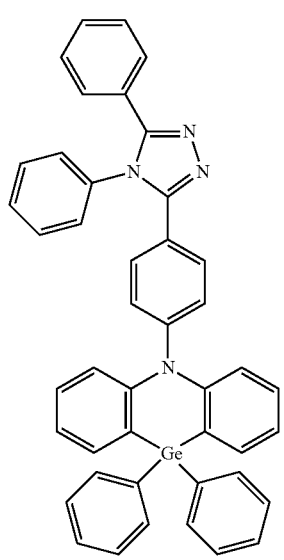

-continued
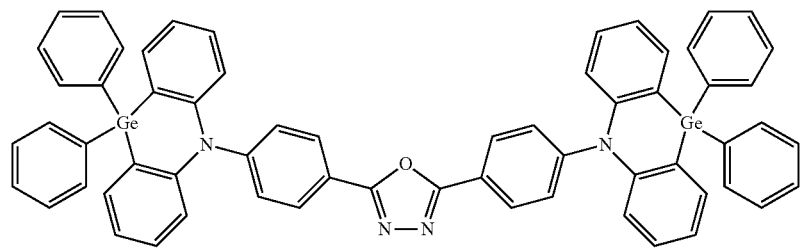
17
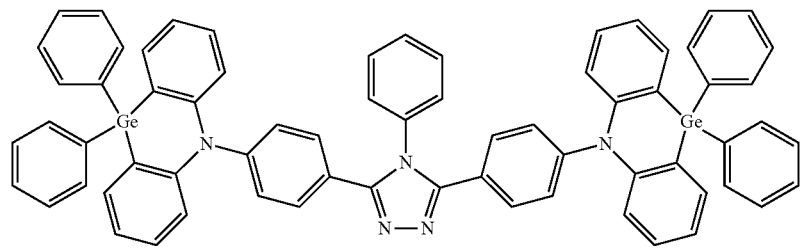
18
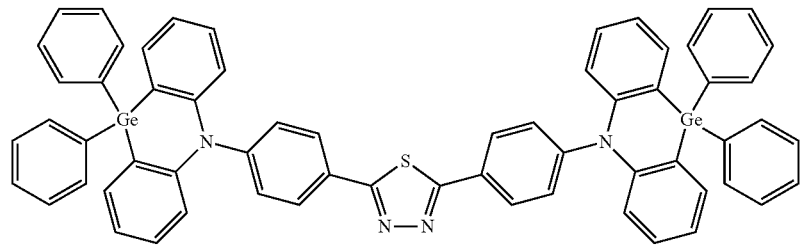
19
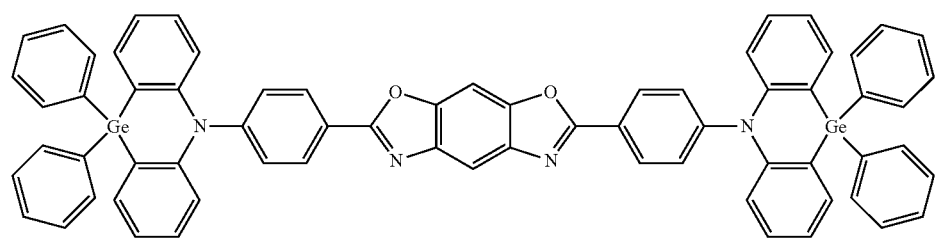
20
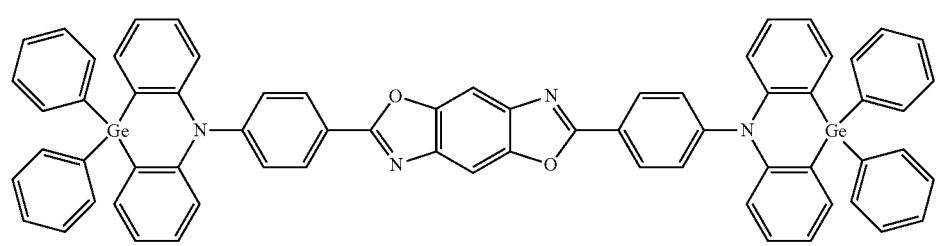
21
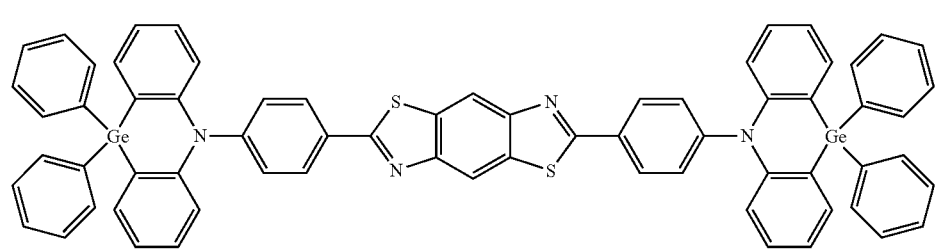
22

-continued
23
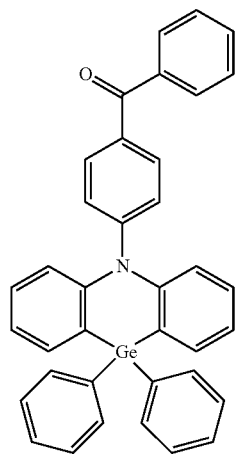
24
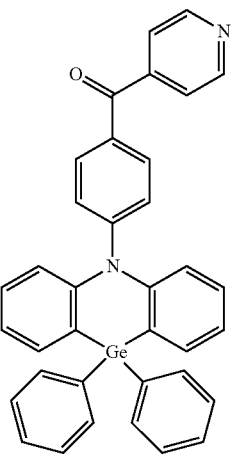
25
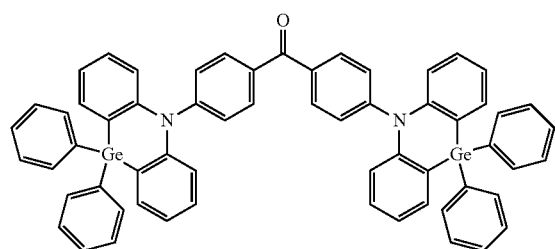
26
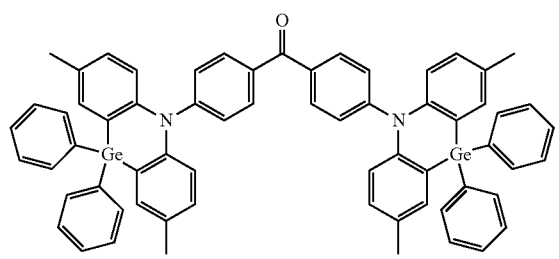
27
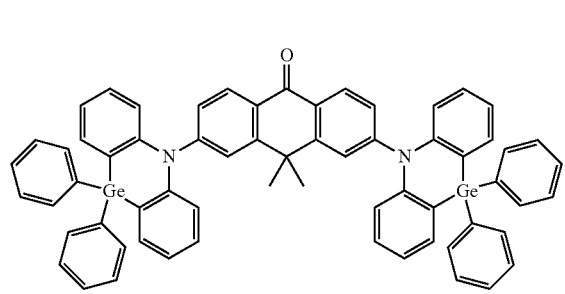
28
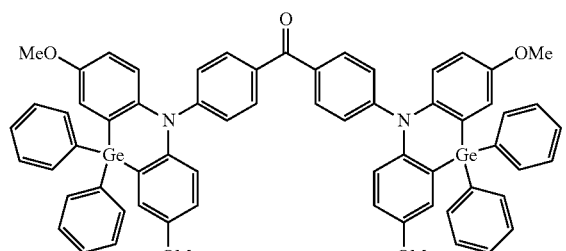
29
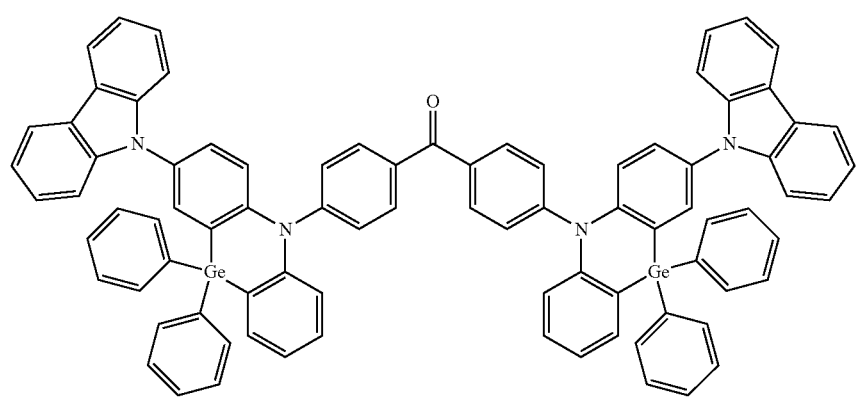

-continued
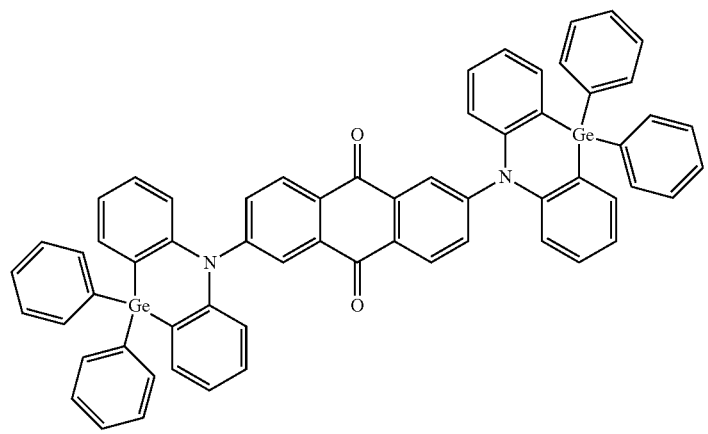
30
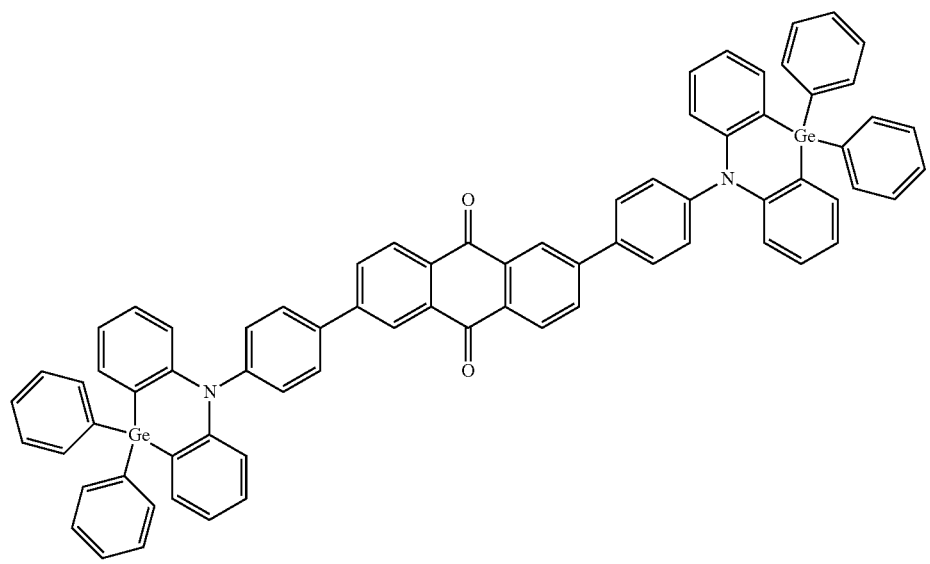
31
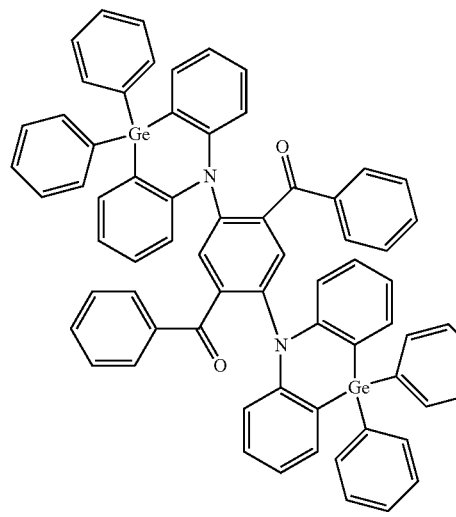
32
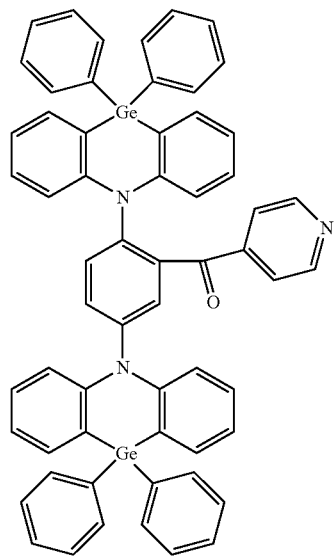
33

34
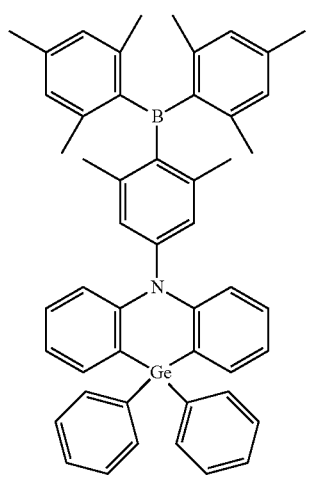
35
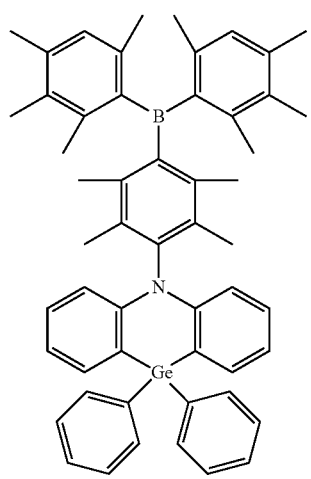
36
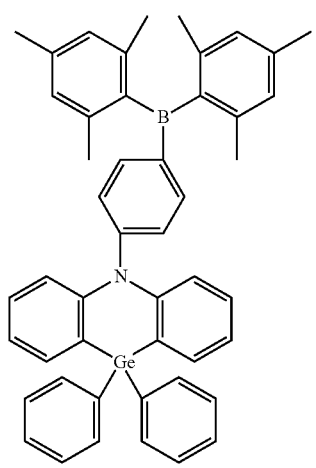
37
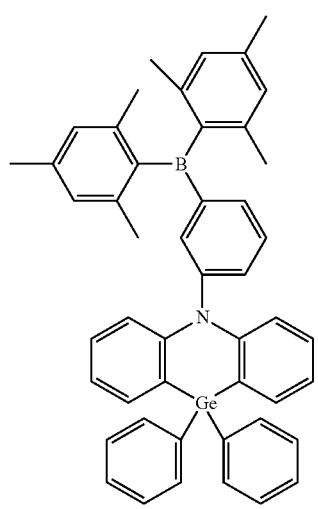
38
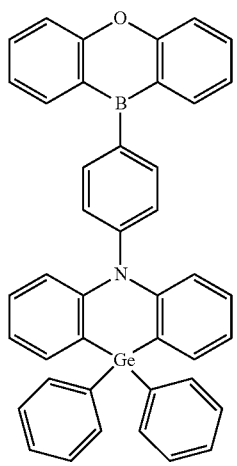
39
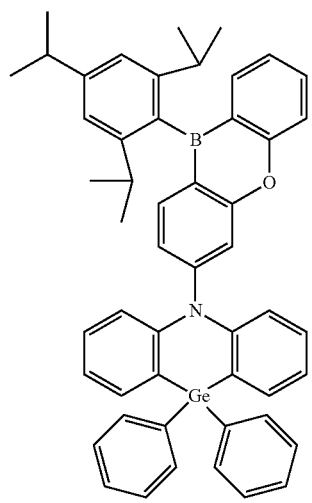

-continued
40
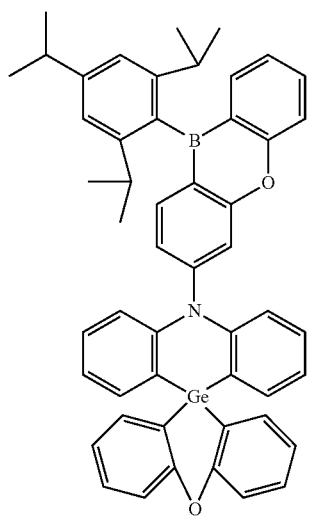
41
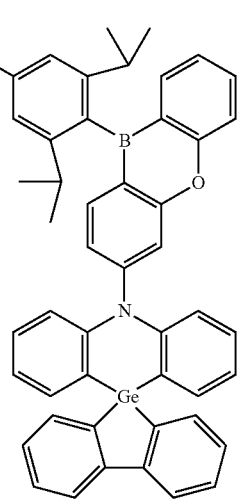
42
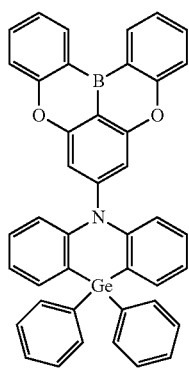
43
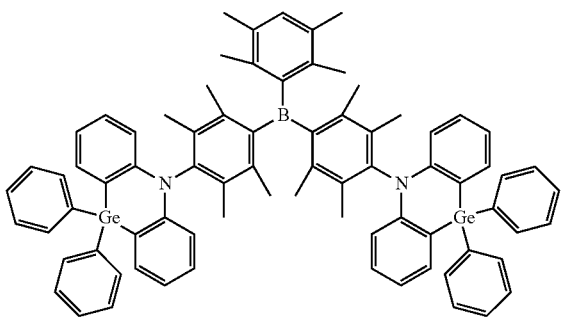
44
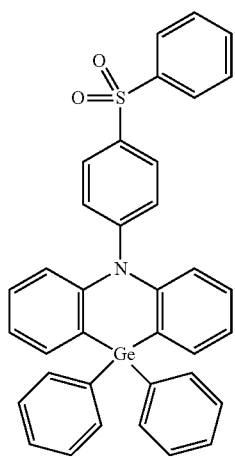
45
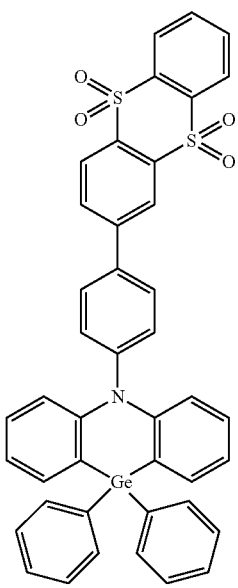

-continued
46
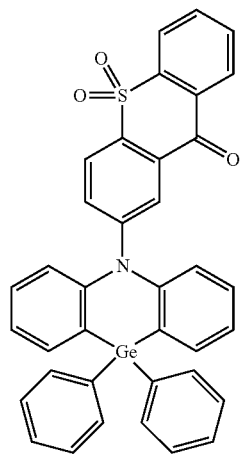
47
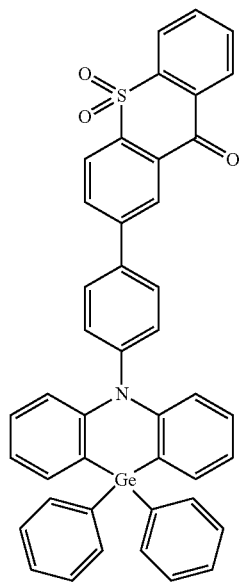
48
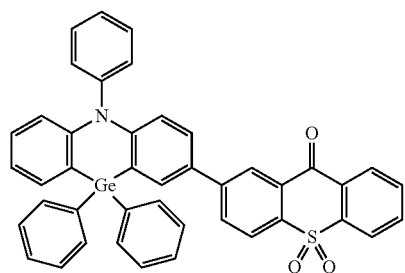
49
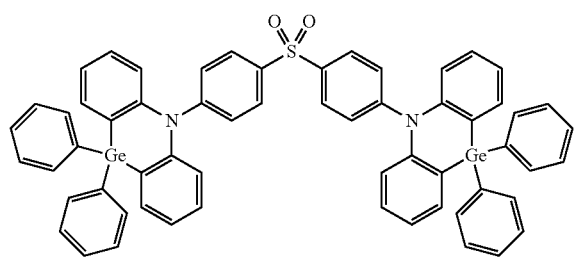
50
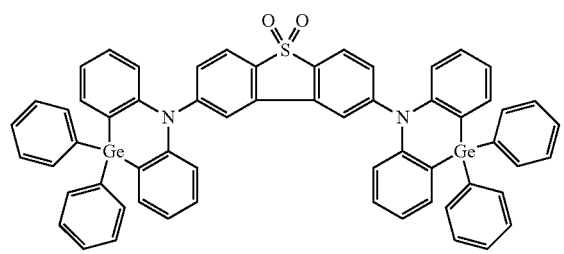
51
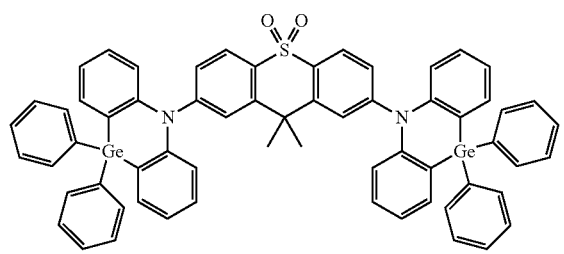
52
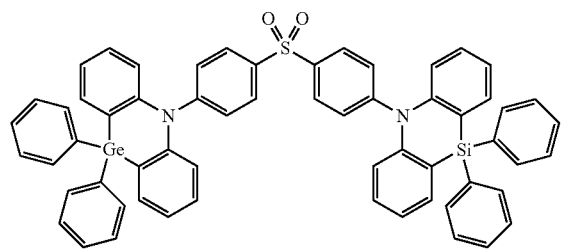
53
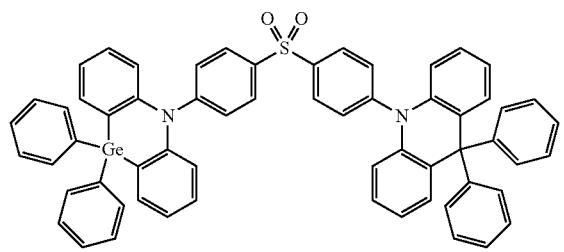

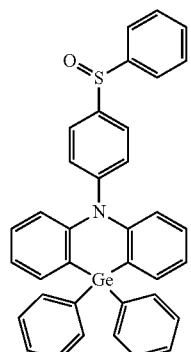
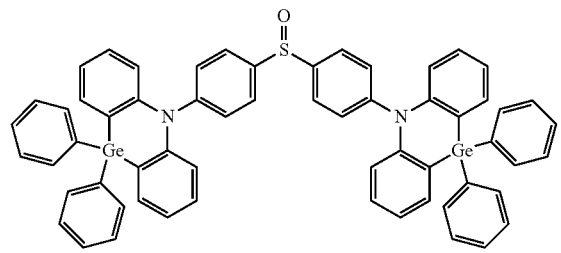
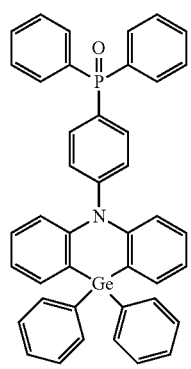
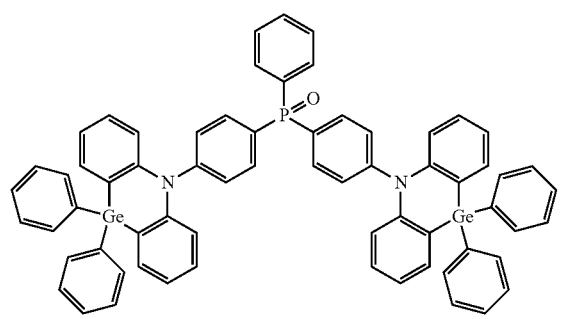
[Compound Group 3]
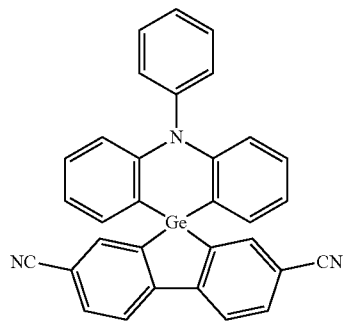
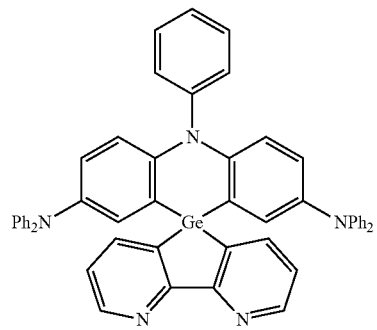
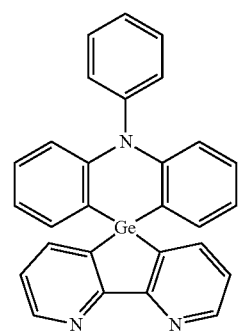
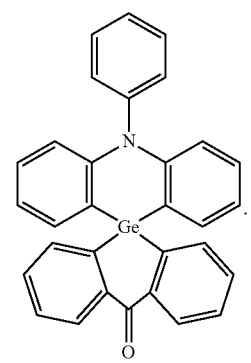
9. The polycyclic compound as claimed in claim 8, wherein the polycyclic compound represented by Formula 1 is a compound of Compound Group 3.

10. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof,
wherein the emission layer comprises a host and a dopant, and the dopant comprises a polycyclic compound represented by Formula 1:

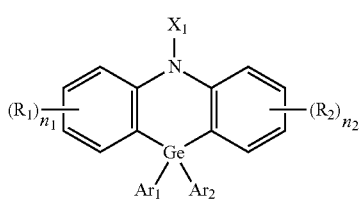

[Formula 1]

wherein, in Formula 1,
$X_1$ is a substituted or unsubstituted aryl group having 6 to 30 ring carbon atoms,
$Ar_1$ and $Ar_2$ are each independently a substituted or unsubstituted aryl group having 6 to 30 ring carbon atoms, $Ar_1$ and $Ar_2$ being separate or forming a ring by combining adjacent groups with each other,
$R_1$ and $R_2$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ and $R_2$ being separate or forming a ring by combining adjacent groups with each other,
$n_1$ and $n_2$ are each independently an integer of 0 to 4, and
at least one of $Ar_1$, $Ar_2$, $R_1$, $R_2$ or $X_1$ is a group represented by one of the following Formulae 2-1 to 2-8, provided that $X_1$ is not represented by Formula 2-3:

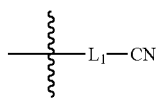

[Formula 2-1]

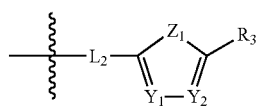

[Formula 2-2]

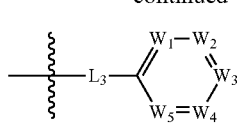

[Formula 2-3]

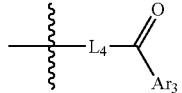

[Formula 2-4]

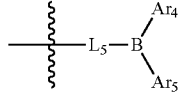

[Formula 2-5]

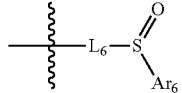

[Formula 2-6]

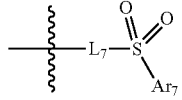

[Formula 2-7]

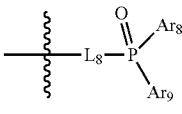

[Formula 2-8]

wherein, in Formulae 2-1 to 2-8,
$Y_1$ and $Y_2$ are each independently N or $CR_4$, at least one of $Y_1$ or $Y_2$ being N,
$Z_1$ is O, S, or $NAr_{10}$,
$W_1$ to $W_5$ are each independently N or $CR_5$, at least one of $W_1$ to $W_5$ being N,
$L_1$ to $L_8$ are each independently a direct linkage, a substituted or unsubstituted arylene group having 6 to 30 ring carbon atoms, or a substituted or unsubstituted heteroarylene group having 2 to 30 ring carbon atoms,
$Ar_3$ to $Ar_{10}$ are each independently a substituted or unsubstituted oxy group, a substituted or unsubstituted thio group, a substituted or unsubstituted amino group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $Ar_3$ to $Ar_9$ being separate or forming a ring by combining adjacent groups with each other, and
$R_3$ is a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, or a substituted or unsubstituted aryl group having 6 to 30 ring carbon atoms,
$R_4$ to $R_5$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_3$ and $R_4$ being separate or forming a ring by combining adjacent groups with each other.

11. The organic electroluminescence device as claimed in claim 10, wherein the polycyclic compound represented by Formula 1 has an energy difference ($\Delta E_{ST}$) between a lowest singlet energy level ($S_1$) and a lowest triplet energy level ($T_1$) of about 0.2 eV or less.

12. The organic electroluminescence device as claimed in claim 10, wherein the polycyclic compound represented by Formula 1 is represented by the following Formula 3:

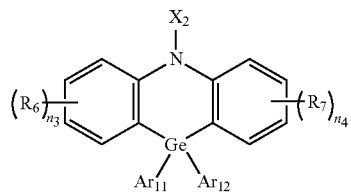

[Formula 3]

wherein, in Formula 3, $X_2$ is a group represented by any one of Formulae 2-1, 2-2, or 2-4 to 2-8, $Ar_{11}$ and $Ar_{12}$ are each independently a substituted or unsubstituted aryl group having 6 to 30 ring carbon atoms, $Ar_{11}$ and $Ar_{12}$ being separate or forming a ring by combining adjacent groups with each other, $R_6$ and $R_7$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_6$ and $R_7$ being separate or forming a ring by combining adjacent groups with each other, and $n_3$ and $n_4$ are each independently an integer of 0 to 4.

13. The organic electroluminescence device as claimed in claim 12, wherein $L_1$ to $L_8$ are each independently a substituted or unsubstituted phenylene group.

14. The organic electroluminescence device as claimed in claim 12, wherein the polycyclic compound represented by Formula 3 is represented by the following Formula 4:

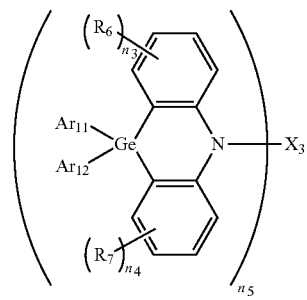

[Formula 4]

wherein, in Formula 4, $n_5$ is an integer of 1 to 4, when $n_5$ is 1, $X_3$ is the same as $X_2$, where $L_1$, $L_2$, and $L_4$ to $L_8$ are each a phenylene group, when $n_5$ is an integer of 2 to 4, $X_3$ is a phenylene group substituted with one selected from a cyano group, a substituted or unsubstituted carbonyl group, a substituted or unsubstituted boron group, a substituted or unsubstituted sulfinyl group, a substituted or unsubstituted sulfonyl group, a substituted or unsubstituted phosphine oxide group, and Formula 5-1, and $Ar_{11}$, $Ar_{12}$, $R_6$, $R_7$, $n_3$ and $n_4$ are defined the same as those of Formula 3,

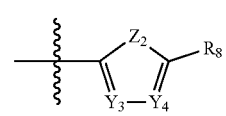

[Formula 5-1]

wherein, in Formula 5-1, $Y_3$ and $Y_4$ are each independently N or $CR_9$, at least one of $Y_3$ or $Y_4$ being N, $Z_2$ is O, S, or $NAr_{13}$, $Ar_{13}$ is a substituted or unsubstituted aryl group having 6 to 30 ring carbon atoms or a substituted or unsubstituted heteroaryl group having 2 to 30 ring carbon atoms, and $R_8$ to $R_9$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_8$ and $R_9$ being separate or forming a ring by combining adjacent groups with each other.

15. The organic electroluminescence device as claimed in claim 12, wherein the polycyclic compound represented by Formula 3 is represented by the following Formula 6:

[Formula 6]

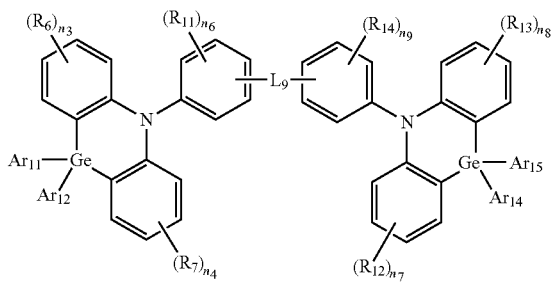

wherein, in Formula 6,

L$_9$ is a substituted or unsubstituted divalent carbonyl group, a substituted or unsubstituted divalent boron group, a substituted or unsubstituted divalent sulfinyl group, a substituted or unsubstituted divalent sulfonyl group, a substituted or unsubstituted divalent phosphine oxide group, or a group represented by the following Formula 7-1 or 7-2, Ar$_{14}$ and Ar$_{15}$ are each independently a substituted or unsubstituted aryl group having 6 to 30 ring carbon atoms, Ar$_{14}$ and Ar$_{15}$ being separate or forming a ring by combining adjacent groups with each other, R$_{11}$ to R$_{14}$ are each independently a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, R$_{11}$ to R$_{14}$ being separate or forming a ring by combining adjacent groups with each other, n$_6$ to n$_9$ are each independently an integer of 0 to 4, and Ar$_{11}$, Ar$_{12}$, R$_6$, R$_7$, n$_3$ and n$_4$ are defined the same as those of Formula 3,

[Formula 7-1]

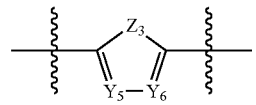

[Formula 7-2]

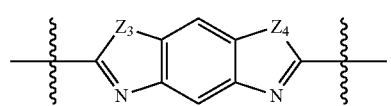

wherein, in Formulae 7-1 and 7-2,

Y$_5$ and Y$_6$ are each independently N or CR$_{15}$, at least one of Y$_5$ or Y$_6$ being N, Z$_3$ and Z$_4$ are each independently O, S, or NAr$_{16}$, R$_{15}$ is a hydrogen atom, a deuterium atom, a halogen atom, a substituted or unsubstituted boron group, a substituted or unsubstituted amino group, a substituted or unsubstituted cyano group, a substituted or unsubstituted carbonyl group, a substituted or unsubstituted nitro group, a substituted or unsubstituted oxy group, a substituted or unsubstituted silyl group, a substituted or unsubstituted phosphine oxide group, a substituted or unsubstituted phosphine sulfide group, a substituted or unsubstituted sulfinyl group, a substituted or unsubstituted sulfonyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, R$_{15}$ being separated or forming a ring by combining adjacent groups with each other, and Ar$_{16}$ is a substituted or unsubstituted aryl group having 6 to 30 ring carbon atoms or a substituted or unsubstituted heteroaryl group having 2 to 30 ring carbon atoms.

16. The organic electroluminescence device as claimed in claim 10, wherein the polycyclic compound represented by Formula 1 is a compound of Compound Group 1 or Compound Group 3:

[Compound Group 1]

1

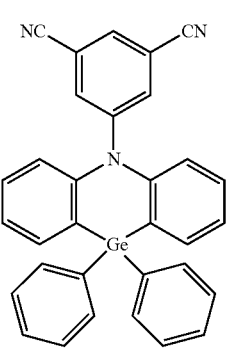

2

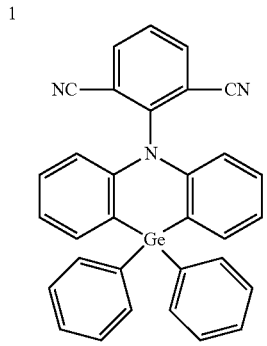

-continued
3
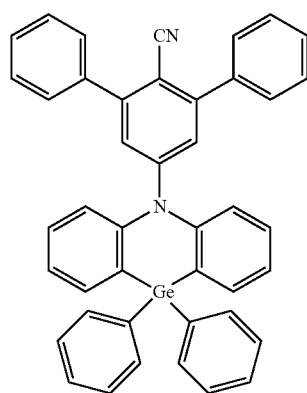
4
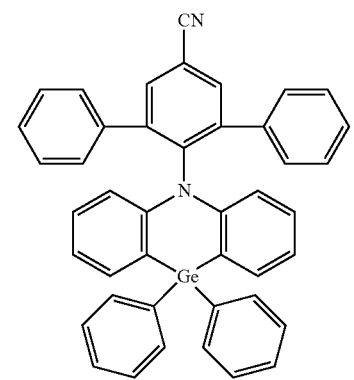
5
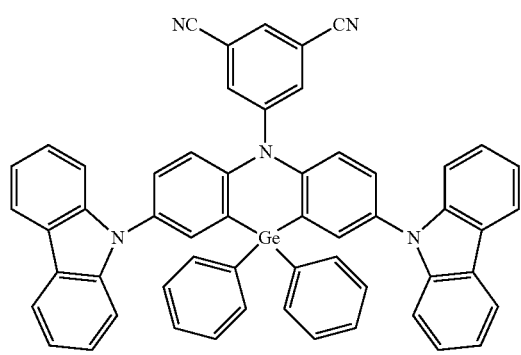
6
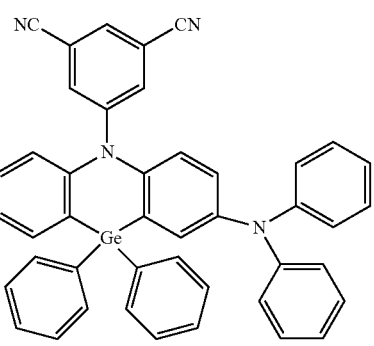
7
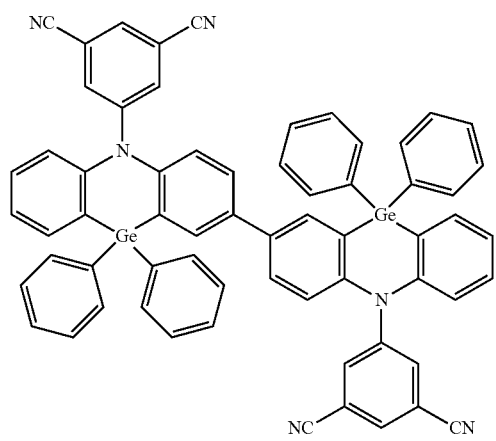
8
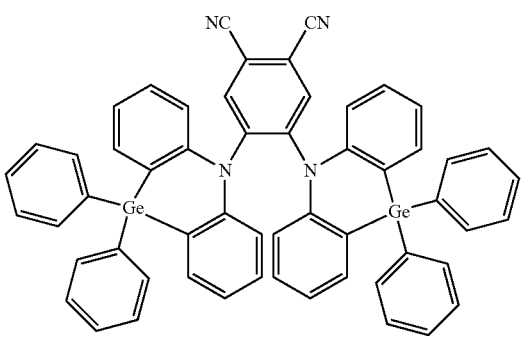
9
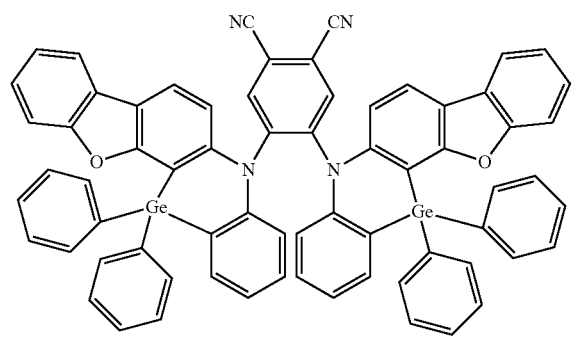
10
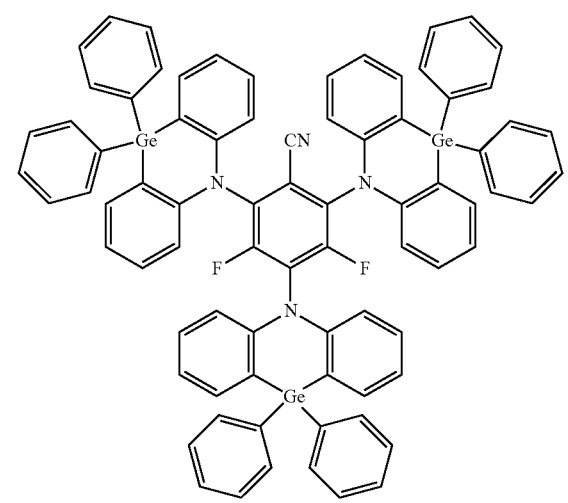

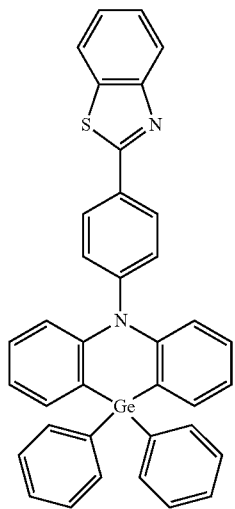
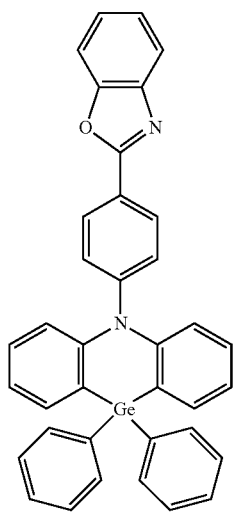
13
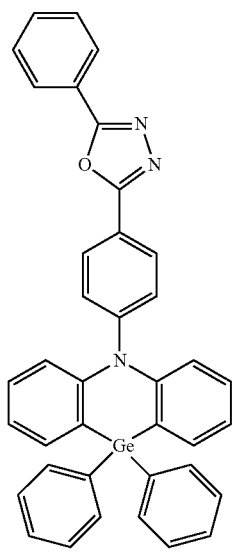
14
15
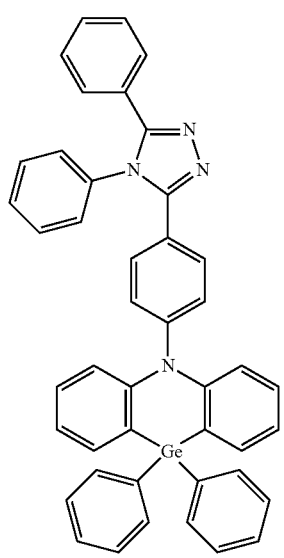
16

17
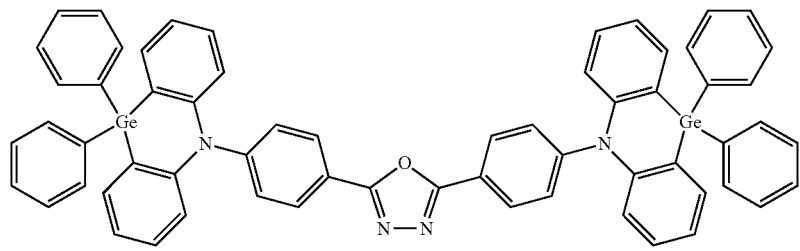
18
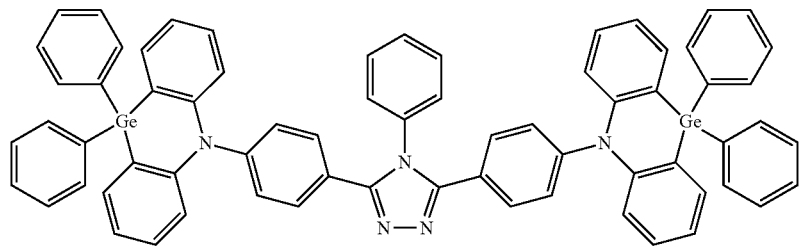
19
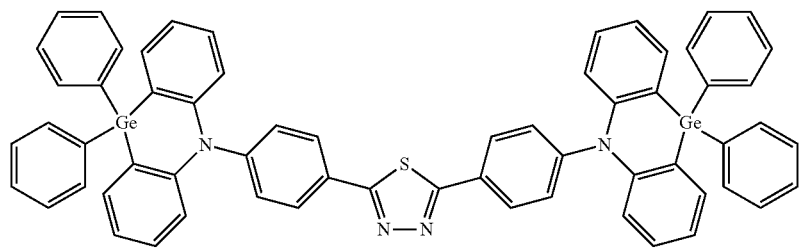
20
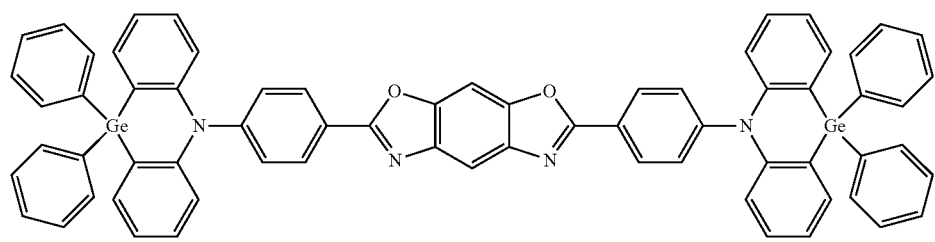
21
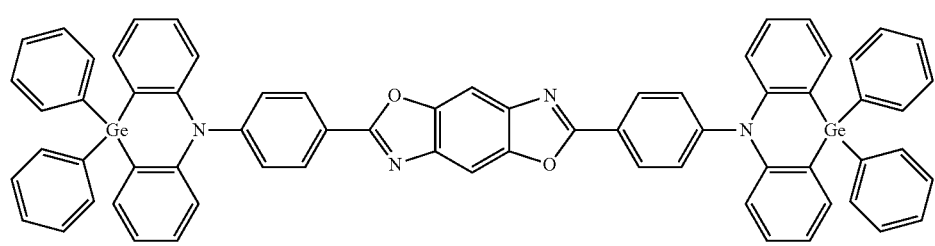
22
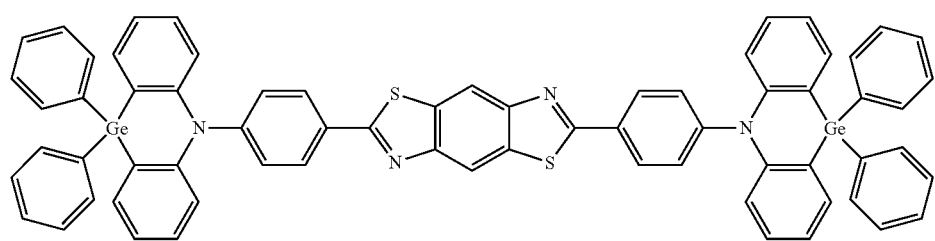

-continued
23
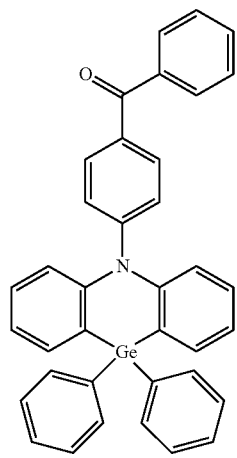
24
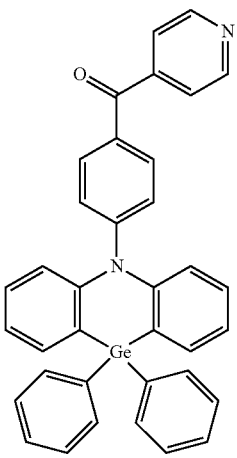
25
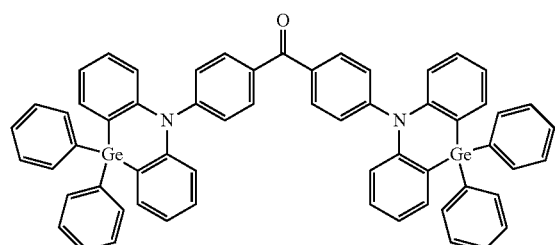
26
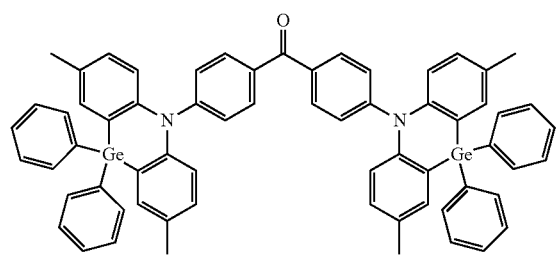
27
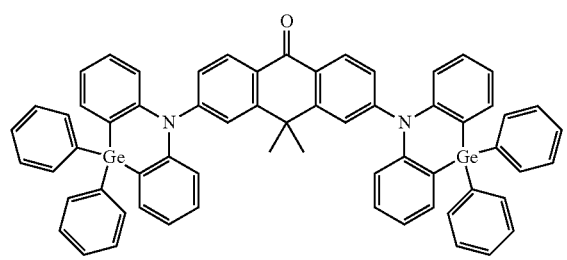
28
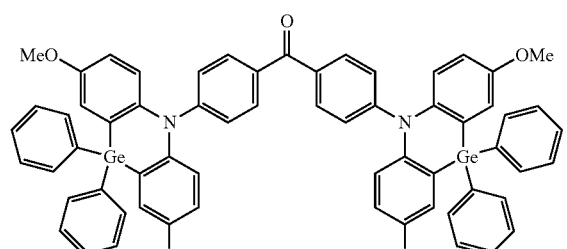
29
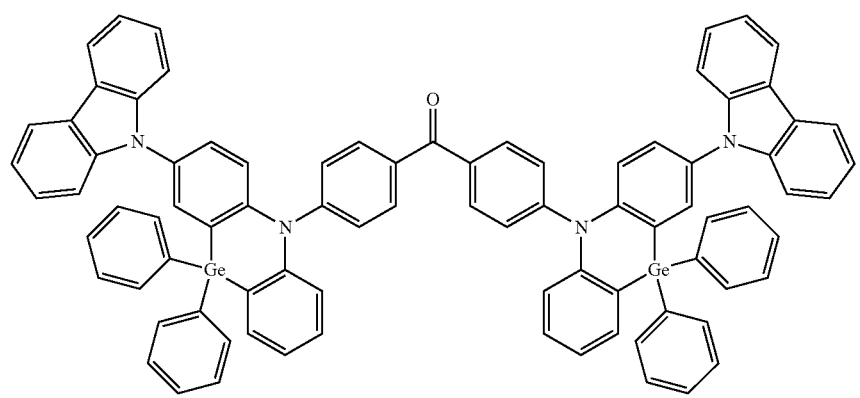

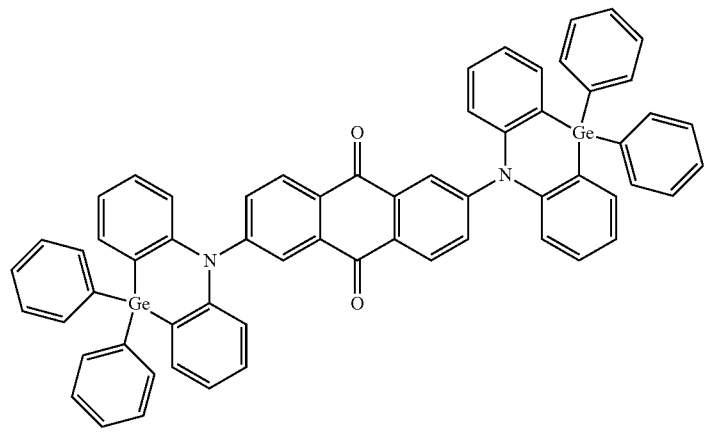
30
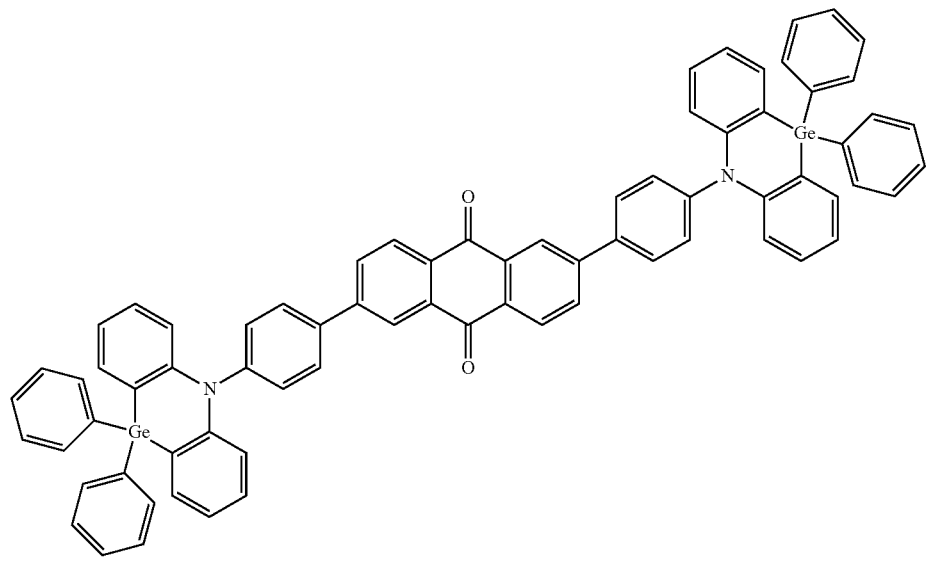
31
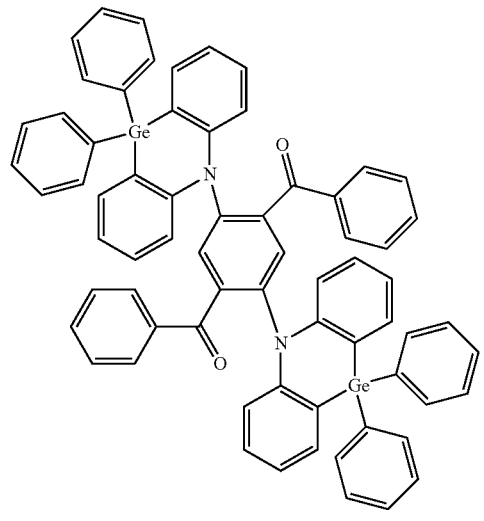
32
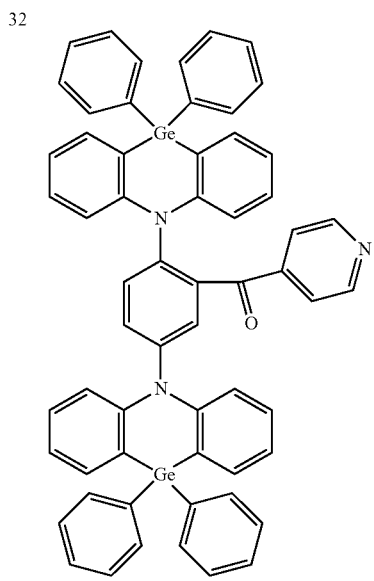
33

-continued
34
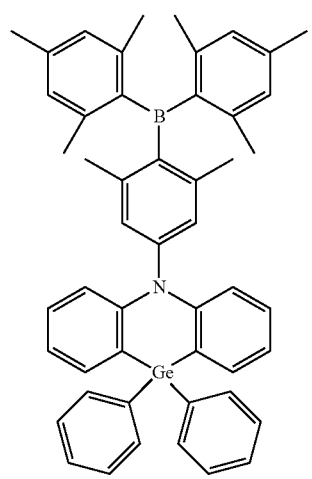
35
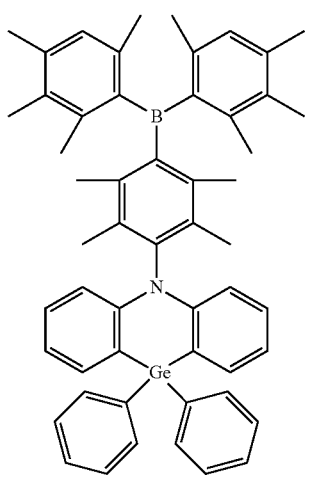
36
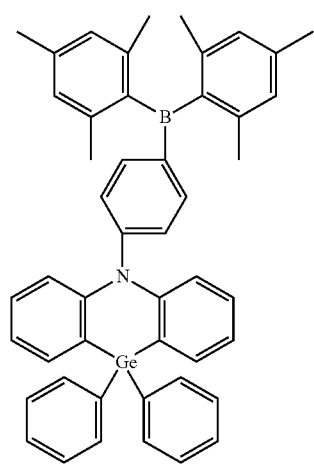
37
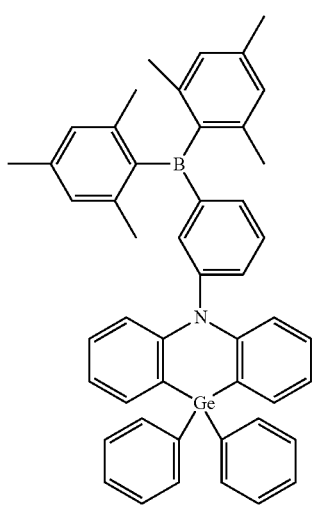
38
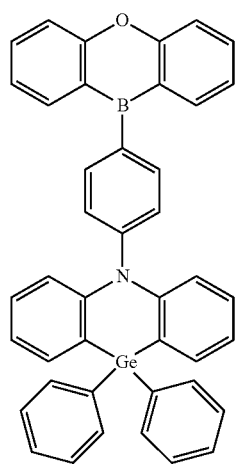
39
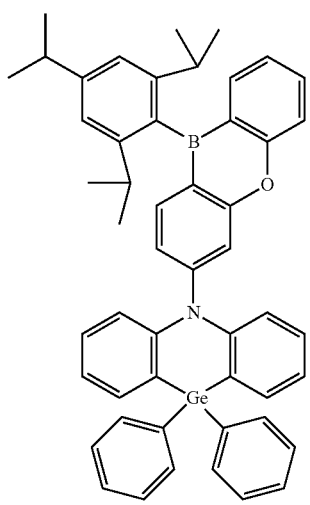

40
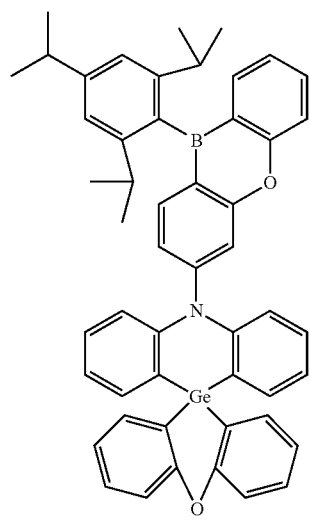
41
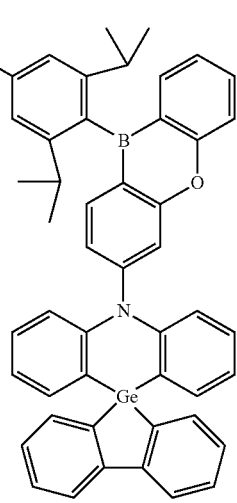
42
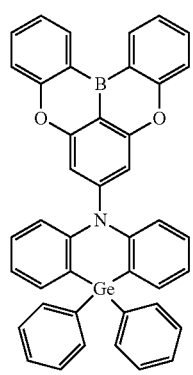
43
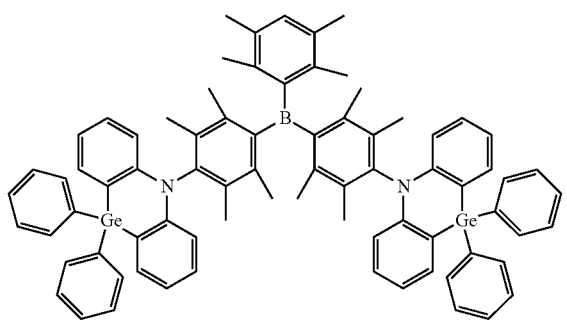
44
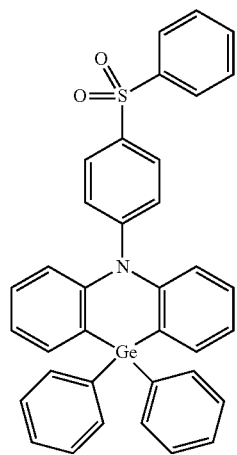
45
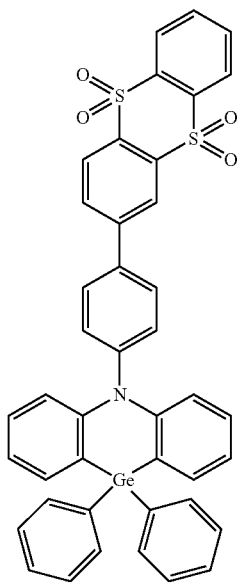

-continued
46
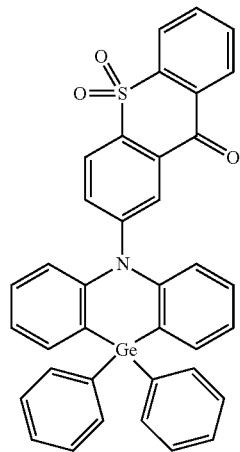
47
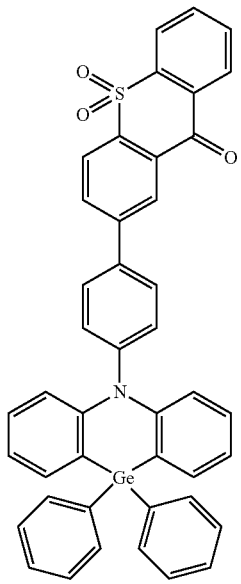
48
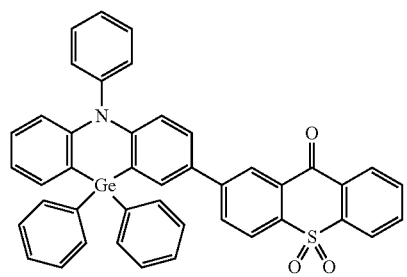
49
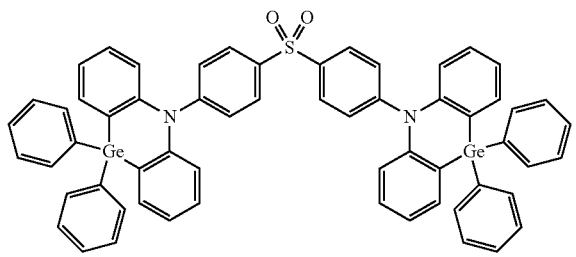
50
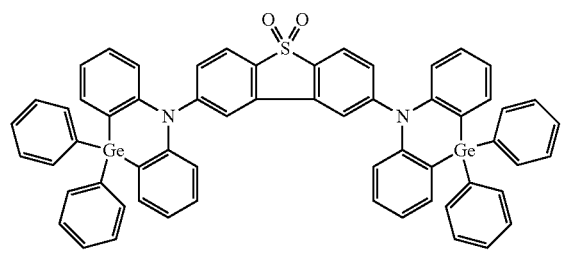
51
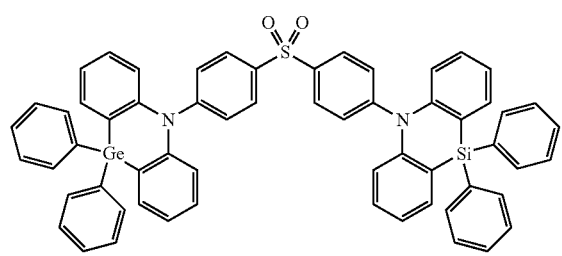
52
53
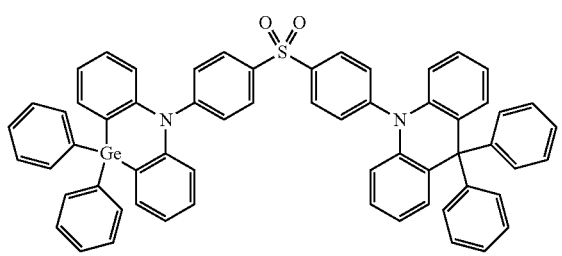

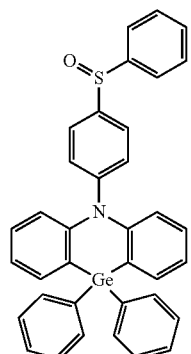
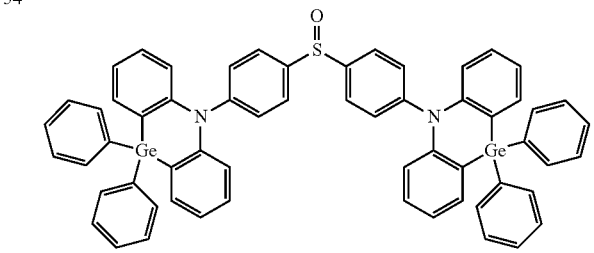
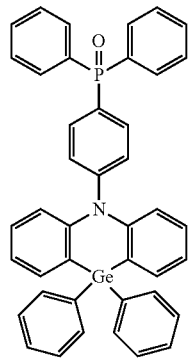
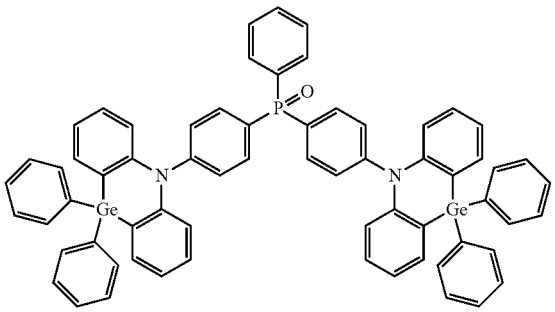
[Compound Group 3]
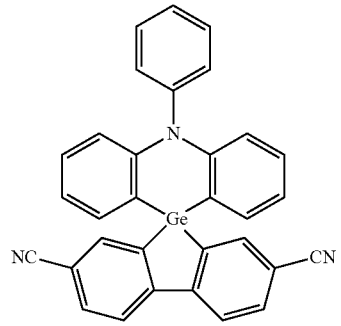
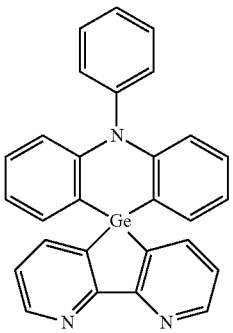
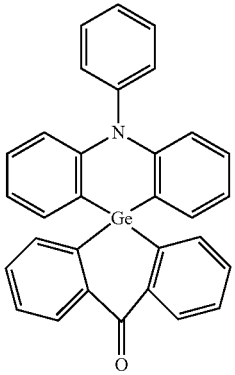
* * * * *